US009755128B2

(12) United States Patent
Banerjee et al.

(10) Patent No.: US 9,755,128 B2
(45) Date of Patent: *Sep. 5, 2017

(54) METHOD OF PRODUCING THERMOELECTRIC MATERIAL

(71) Applicant: Toyota Jidosha Kabushiki Kaisha, Toyota-shi, Aichi-ken (JP)

(72) Inventors: Debasish Banerjee, Ann Arbor, MI (US); Minjuan Zhang, Ann Arbor, MI (US); Takuji Kita, Susono (JP); Junya Murai, Susono (JP)

(73) Assignees: Toyota Motor Engineering & Manufacturing North America, Inc., Erlanger, KY (US); Toyota Jidosha Kabushiki Kaisha, Toyota-shi (JP)

(*) Notice: Subject to any disclaimer, the term of this patent is extended or adjusted under 35 U.S.C. 154(b) by 280 days.

This patent is subject to a terminal disclaimer.

(21) Appl. No.: 14/317,375

(22) Filed: Jun. 27, 2014

(65) Prior Publication Data

US 2014/0306143 A1   Oct. 16, 2014

Related U.S. Application Data

(63) Continuation-in-part of application No. 13/166,860, filed on Jun. 23, 2011, which is a continuation-in-part
(Continued)

(30) Foreign Application Priority Data

Oct. 10, 2008  (JP) .................................. 2008-264247
Jul. 31, 2009   (JP) .................................. 2009-179393

(51) Int. Cl.
*H01L 35/12* (2006.01)
*H01L 35/16* (2006.01)
(Continued)

(52) U.S. Cl.
CPC .............. *H01L 35/16* (2013.01); *H01L 35/22* (2013.01); *H01L 35/26* (2013.01); *H01L 35/34* (2013.01)

(58) Field of Classification Search
CPC ......... H01L 35/16; H01L 35/22; H01L 35/26; C01B 19/007; C01P 2006/32; C01P 2006/40
(Continued)

(56) References Cited

U.S. PATENT DOCUMENTS 5,690,807 A   11/1997  Clark, Jr. et al.
5,922,988 A    7/1999  Nishimoto
(Continued)

FOREIGN PATENT DOCUMENTS

EP   1959508 A1   8/2008
EP   2039448 A1   3/2009
(Continued)

OTHER PUBLICATIONS

Li et al., A model for scattering due to interface roughness in finite quantum wells, Semiconductor Science and Technology 20, Nov. 15, 2005, pp. 1207-1212.
(Continued)

*Primary Examiner* — Thanh-Truc Trinh
(74) *Attorney, Agent, or Firm* — Dinsmore & Shohl LLP

(57) ABSTRACT

A process for manufacturing a nanocomposite thermoelectric material having a plurality of nanoparticle inclusions. The process includes determining a material composition to be investigated for the nanocomposite thermoelectric material, the material composition including a conductive bulk material and a nanoparticle material. In addition, a range of surface roughness values for the insulating nanoparticle material that can be obtained using current state of the art manufacturing techniques is determined. Thereafter, a plu-
(Continued)

rality of Seebeck coefficients, electrical resistivity values, thermal conductivity values and figure of merit values as a function of the range of nanoparticle material surface roughness values is calculated. Based on these calculated values, a nanocomposite thermoelectric material composition or ranges of compositions is/are selected and manufactured.

12 Claims, 25 Drawing Sheets

Related U.S. Application Data of application No. 13/122,575, filed as application No. PCT/IB2009/007244 on Oct. 9, 2009, now Pat. No. 8,628,691.

(51) Int. Cl.
 *H01L 35/22* (2006.01)
 *H01L 35/26* (2006.01)
 *H01L 35/34* (2006.01)
(58) Field of Classification Search
 USPC ............ 136/200–242; 252/71, 500; 264/104; 977/779
 See application file for complete search history.

(56) References Cited

U.S. PATENT DOCUMENTS

| | | | |
|---|---|---|---|
| 6,858,154 B2 | 2/2005 | Suzuki et al. | |
| 7,465,871 B2 | 12/2008 | Chen et al. | |
| 7,734,428 B2 | 6/2010 | Banerjee et al. | |
| 8,044,292 B2 | 10/2011 | Xiao et al. | |
| 8,394,284 B2 | 3/2013 | Murai et al. | |
| 2001/0002275 A1 | 5/2001 | Oldenburg et al. | |
| 2005/0268956 A1* | 12/2005 | Take | B22F 1/025 136/208 |
| 2006/0102224 A1 | 5/2006 | Chen et al. | |
| 2006/0118158 A1 | 6/2006 | Zhang et al. | |
| 2008/0230763 A1 | 9/2008 | Zaidi et al. | |
| 2009/0105988 A1 | 4/2009 | Banerjee et al. | |
| 2009/0314324 A1 | 12/2009 | Murai et al. | |
| 2011/0198541 A1 | 8/2011 | Murai et al. | |

FOREIGN PATENT DOCUMENTS

| | | |
|---|---|---|
| JP | 1032355 A | 2/1998 |
| JP | 11-298052 A | 10/1999 |
| JP | 2000-252526 A | 9/2000 |
| JP | 2000-261047 A | 9/2000 |
| JP | 2002-026404 A | 1/2002 |
| JP | 3559962 B2 | 9/2004 |
| JP | 2007021670 A | 2/2007 |
| JP | 3925932 B2 | 6/2007 |
| JP | 2008006513 A | 1/2008 |
| JP | 2008-147625 A | 6/2008 |
| JP | 2008-523579 A | 7/2008 |
| JP | 2008-305919 A | 12/2008 |
| JP | 2009-147145 A | 7/2009 |
| JP | 2010114419 A | 5/2010 |
| JP | 2011517109 A | 5/2011 |
| WO | 2006137923 A2 | 12/2006 |
| WO | 2007066820 A1 | 6/2007 |
| WO | 2009125317 A2 | 10/2009 |
| WO | 2010/041146 A3 | 12/2010 |

OTHER PUBLICATIONS

C. Stiewe et al., Nanostructured Co1-xNix(Sb1-yTey)3 skutterudites: Theoretical modeling, synthesis and thermoelectric properties, Journal of Applied Physics, Jan. 28, 2005, pp. 004317-1-004317-7, vol. 97.

F.F. Fang et al., Negative Field-Effect Mobility on (100) Si Surfaces, Physical Review Letters, May 2, 1966, pp. 797-799, vol. 16, No. 18.

S.M. Goodnick et al., Surface roughness at the Si(100)-SiO2, Physical Review B, Dec. 15, 1985, pp. 8171-8186, vol. 32, No. 12.

B.K. Ridley et al., Mobility of electrons in bulk GaN and AlxGa1—xN/GaN heterostructures, Physical Review B, Jun. 15, 2000, pp. 16 862-16 869, vol. 61, No. 24.

D Zanato et al., The effect of interface-roughness and dislocation scattering on low temperature mobility of 2D electron gas in GaN/AlGaN, Semiconductor Science and Technology, Jan. 13, 2004, pp. 427-432, vol. 19.

M. Babiker et al, Scattering of electrons by the quantised bulk plasma modes in electronically dense materials, IOPscience, J. Phys. C: Solid State Phys. 19, (1986) pp. 161-172.

B.K. Ridley, Electrons and Phonons in Semiconductor Multilayers, Cambridge Studies in Semiconductor Physics and Microelectronic Engineering 5, Cambridge University Press, (1997) p. 235.

R. Gupta et al, Elastic scattering of phonons and interface polaritons in semiconductor heterostructures, Physical Review B, Oct. 15, 1993, pp. 11 972-11 978, vol. 48, No. 16.

B-L Huang et al, Ab initio and molecular dynamics predictions for electron and phonon transport in bismuth telluride, Physical Review B, (Mar. 12, 2008), pp. 125209-1 to 125209-19.

* cited by examiner

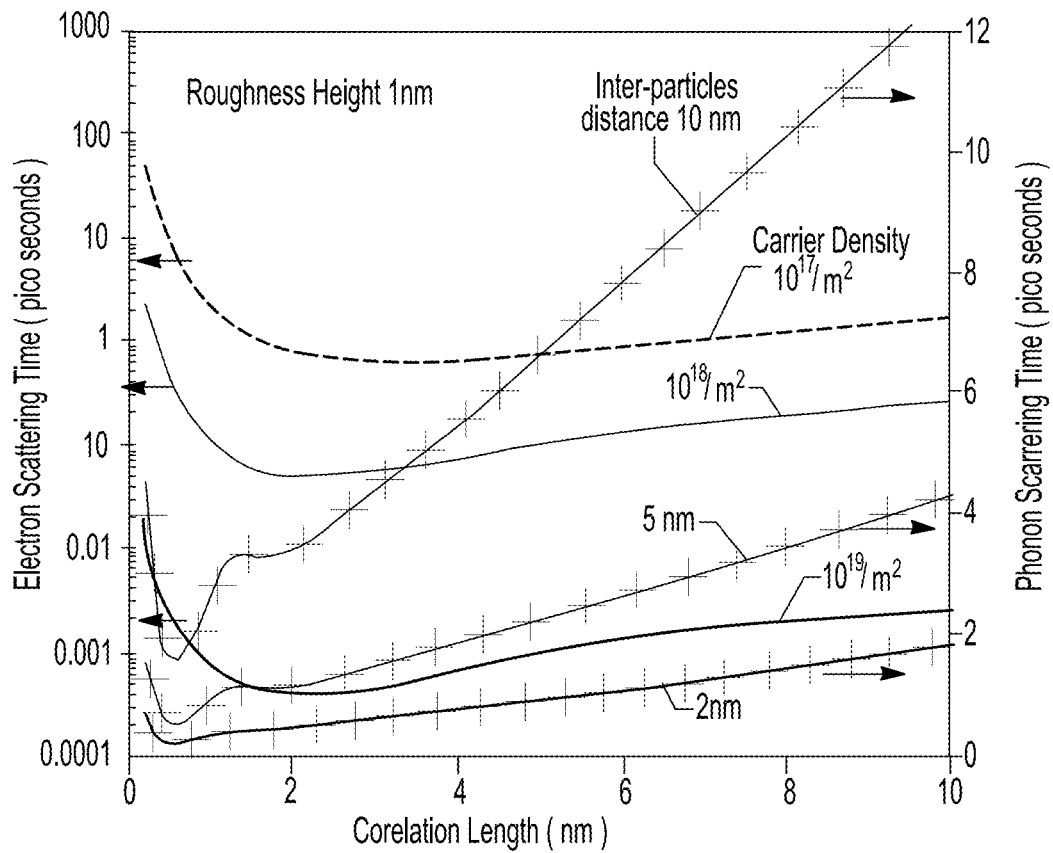
*Fig-6*
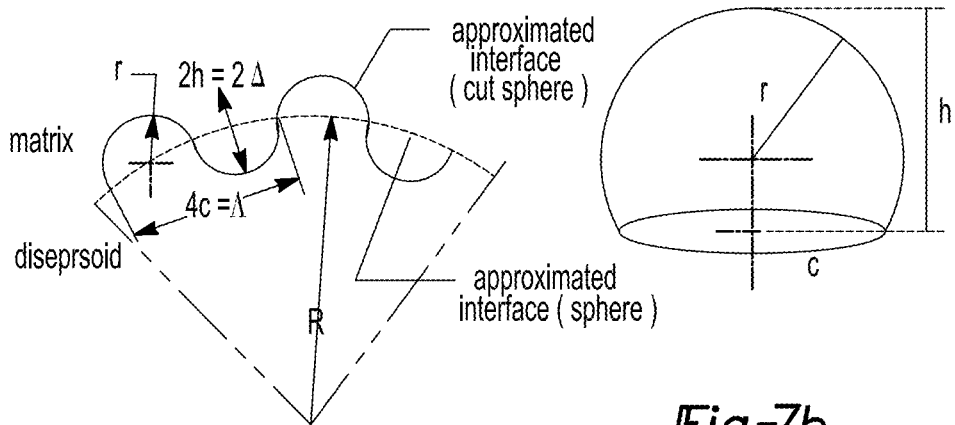
*Fig-7a*  *Fig-7b*

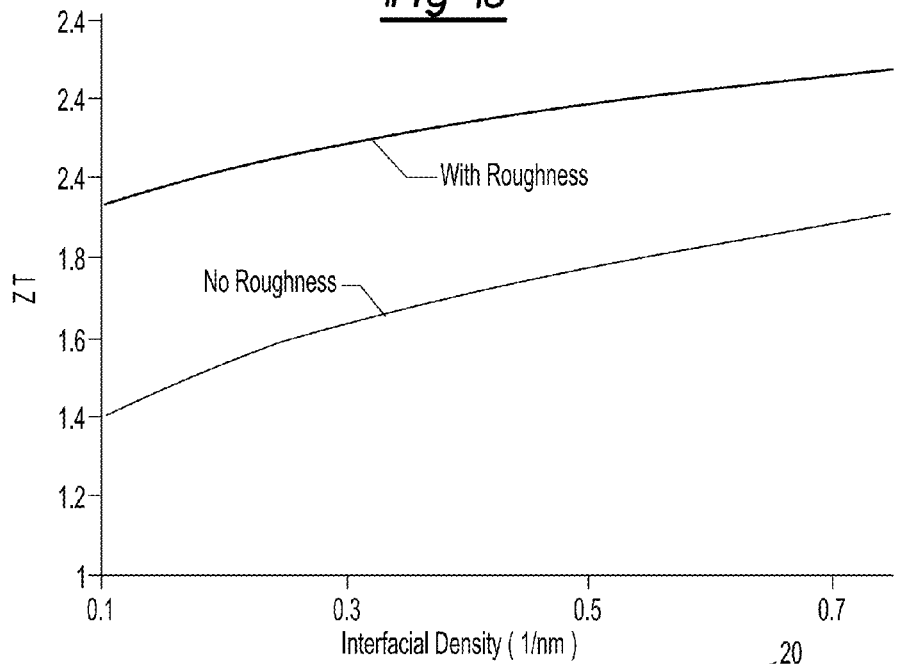
*Fig-10*
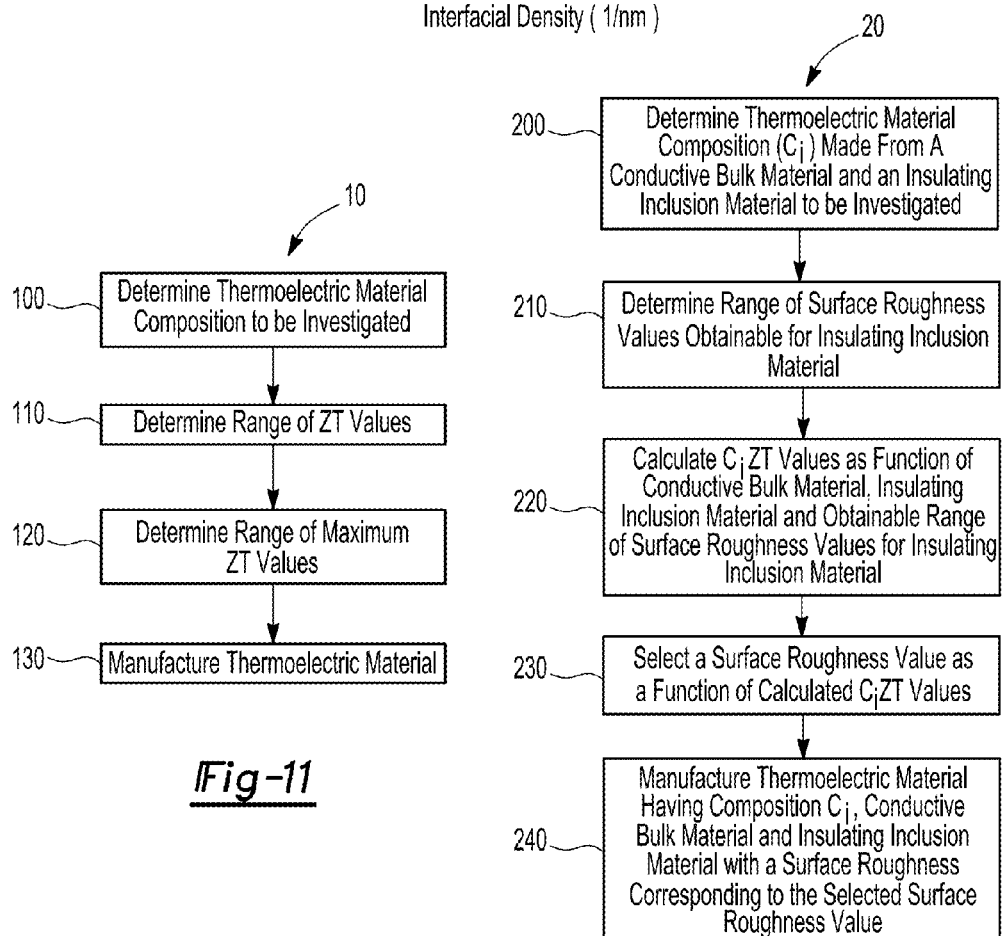
*Fig-11*
*Fig-12*

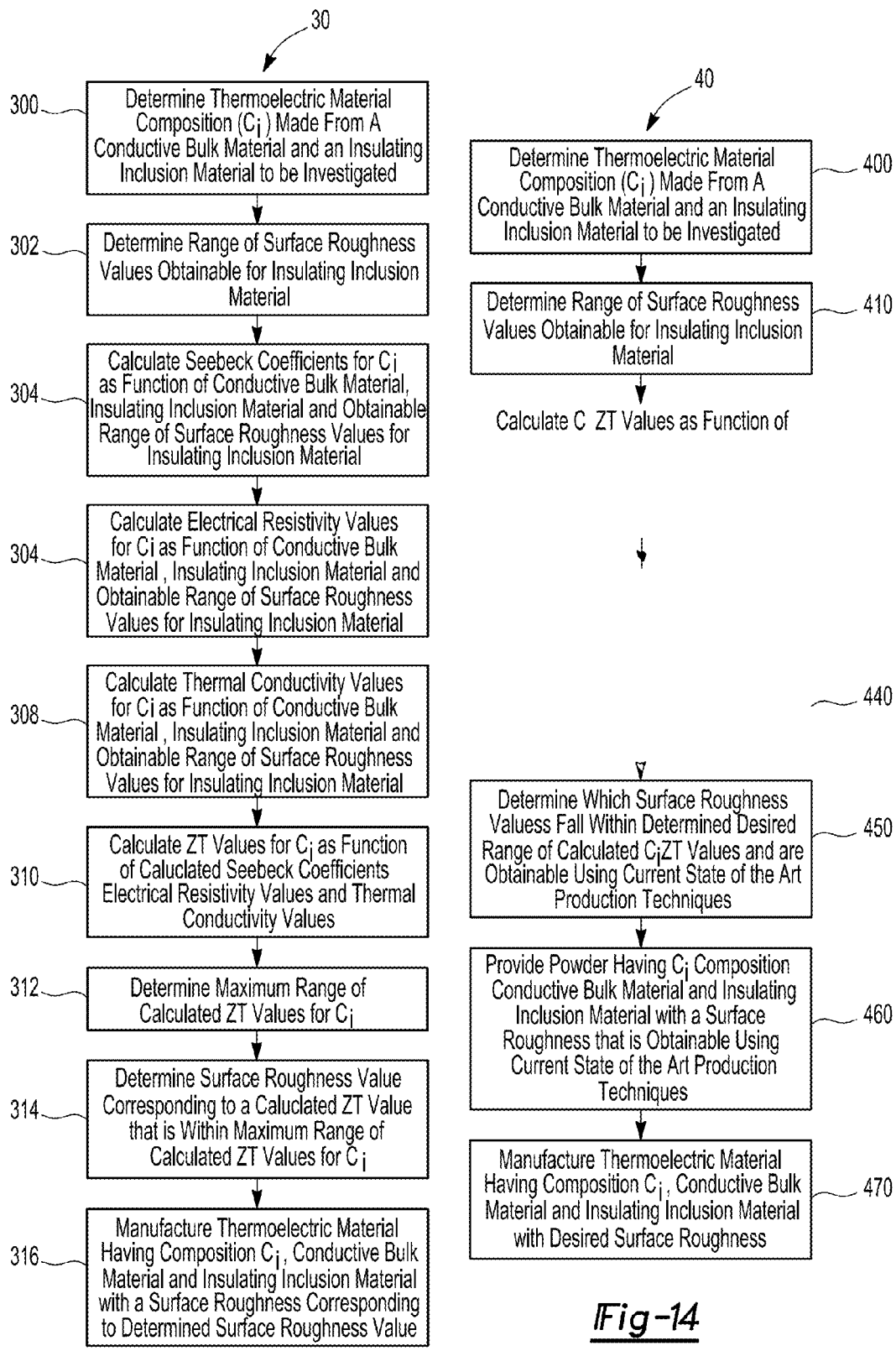

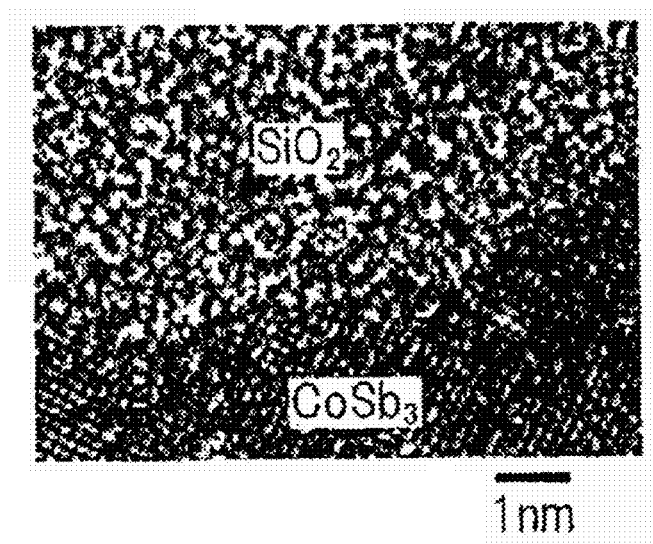
Fig-30
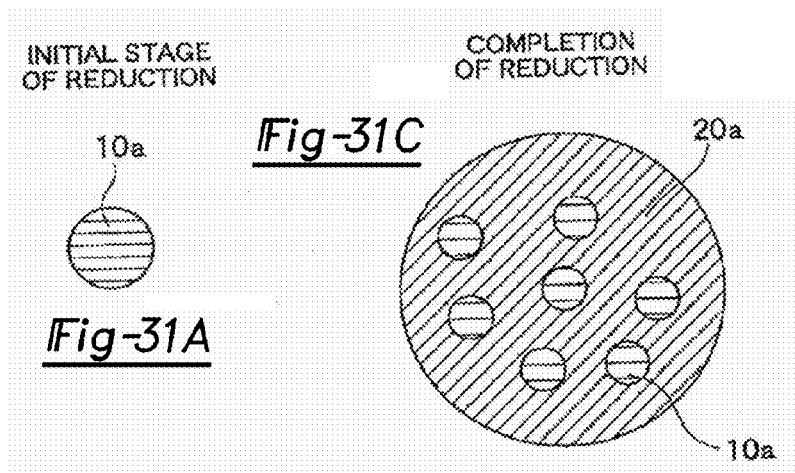
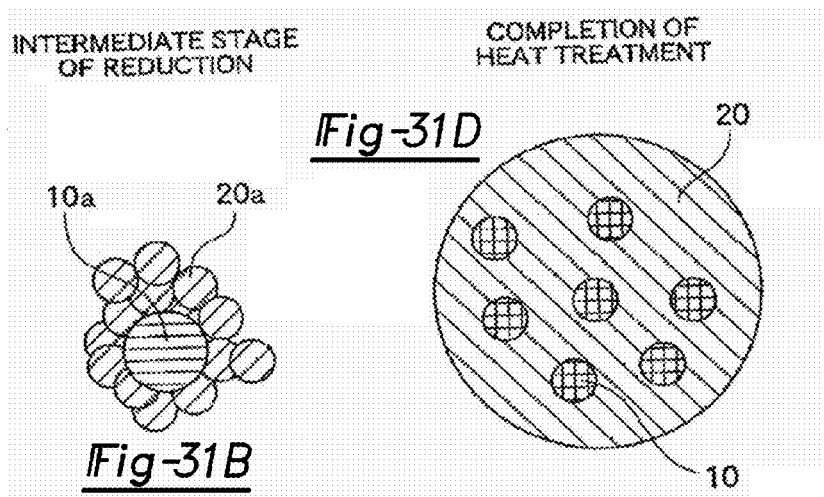

INITIAL STAGE OF REDUCTION

COMPLETION OF REDUCTION

INTERMEDIATE STAGE OF REDUCTION

COMPLETION OF HEAT TREATMENT

INTERFACE ROUGHNESS = 1.0 ± 0.21

INTERFACE ROUGHNESS = 1.5 ±

METHOD OF PRODUCING THERMOELECTRIC MATERIAL

CROSS REFERENCE TO RELATED APPLICATIONS

The present application is a continuation-in-part (CIP) of U.S. patent application Ser. No. 13/166,860 filed on Jun. 23, 2011, which in turn is a CIP of U.S. patent application Ser. No. 13/122,575 filed on Apr. 5, 2011 (now U.S. Pat. No. 8,628,691), which in turn is a U.S. National Phase Application of PCT Application No. PCT/IB2009/007244 filed on Oct. 9, 2009, which in turn claims priority to Japanese Patent Application No. JP 2009-179393 filed on Jul. 31, 2009 and Japanese Application No. 2008-264247 filed on Oct. 10, 2008, all of which are incorporated herein in their entirety by reference.

FIELD OF THE INVENTION

This invention relates to materials having thermoelectric properties and to thermoelectric devices.

BACKGROUND OF THE INVENTION

A thermoelectric device can be used to obtain electrical energy from a thermal gradient (for example, a thermoelectric generator using the Seebeck effect), or to generate a thermal gradient from electrical energy (for example, a thermoelectric refrigerator using the Peltier effect). The discussion below is directed to the Seebeck effect, but the general concepts also apply to applications of the Peltier effect.

A typical thermoelectric device is built up from several unicouples, which are typically pairs of thermally conductive p-type (P) and n-type (N) semiconductors. These unicouples are connected electrically in series and thermally in parallel. Theoretically, the maximum efficiency of the conversion of heat energy to electrical energy is given by:

$$\zeta_{max} = \frac{(T_H - T_C)}{T_H} \frac{\sqrt{1 + ZT_{ave}} - 1}{\sqrt{1 + ZT_{ave}} + T_C/T_H}$$

where $T_{ave}=(T_H+T_C)/2$ is the average temperature of thermal gradient having a hot temperature $(T_H)$ end and a cold temperature $(T_C)$ end, and Z is a figure of merit, defined as $Z=S^2\sigma/\kappa$. The figure of merit Z depends on the macroscopic transport parameters of the materials, namely the Seebeck coefficient (S), electrical conductivity ($\sigma$), and thermal conductivity ($\kappa$). A large figure of merit is provided by a thermoelectric material having a large Seebeck coefficient, high electrical conductivity, and low thermal conductivity.

The Seebeck coefficient is further defined as the ratio of the open-circuit voltage to the temperature difference between the hot and cold junctions of a circuit exhibiting the Seebeck effect, or $S=V/(T_H-T_C)$. Since Z varies with temperature, a useful dimensionless figure of merit can be defined as ZT.

By the end of the 1950s, the best bulk thermoelectric materials were found to be alloys of bismuth telluride and antimony, which gave a room temperature ZT~1. Workers in the thermoelectric field have been attempting to improve the figure of merit over the past 40 years without much success. Increasing ZT is difficult because the three parameters S, $\sigma$, and k are all related to the free carrier concentration and are usually not independent. For example, doping typically increases the semiconductor's electrical conductivity, but decreases its Seebeck coefficient and increases the thermal conductivity. Efforts to reduce the lattice thermal conductivity by alloying also reduce the electrical conductivity by providing an extra scattering mechanism.

Dresselhaus and coworkers at MIT theoretically demonstrated that quantum confinement of electrons and phonons within nanowires of a thermoelectric material can increase the value of ZT. 1-D nanowires in particular could reach ZT≈2-5 if the nanowire diameter lies in the range of 5-10 nanometers. Certain structures have been investigated, for example such as described in Heremans, J. P. et al., "Thermoelectric Power of Bismuth Nanocomposites"; Phys. Rev. Lett.; 2002, 88, 216801; Venkatasubramanian, R. et al., "Thin-film thermoelectric devices with high room temperature figures of merit"; Nature; 2001, 413, 597-602; Harman, T. C. et al., "Thermoelectric quantum dot superlattices with high ZT"; Electron. Mater.; 2000, 29, L1-L4; Rabin, O. et al., "Anomalously high thermoelectric figure of merit in $Bi_{1-x}Sb_x$ nanowires by carrier pocket alignment"; APL; 2001, 79, 81-83; and Dresselhaus, M. S. et al., "Low-dimensional thermoelectric materials"; PSS; 1999, 41, 679-682. However, these approaches do not provide a simple approach to making large-scale, low-cost thermoelectric devices. Conventional semiconductor device fabrication methods are unsuitable for manufacturing bulk samples, and are often expensive.

In automobiles, about 70 percent of energy derived from fuel is lost to waste heat and engine cooling. Only a small proportion of energy provided by fuel combustion is used, and a large amount of thermal energy is thrown away. Recovery of waste thermal energy is a big challenge in automotive industries due to the increasing energy crisis. Thermoelectric conversion of thermal energy to electrical energy could be an effective way to obtain electrical energy from otherwise wasted heat production. However, direct thermal to electric conversion (DTEC) technology currently faces two major challenges: low conversion efficiency and insufficient power density. Hence, improved materials and devices having high thermoelectric conversion efficiency are urgently required.

In response to the need for high thermoelectric conversion efficiency materials, Zhang et al. have investigated thermoelectric materials comprising two or more components, at least one of which is a thermoelectric material (U.S. Pat. No. 7,309,830). However, a given thermoelectric material system can have a wide range of compositions that may, or may not, exhibit high ZT values, and as such, Banerjee et al. have developed a process for determining an optimum range of compositions for a nanocomposite thermoelectric material system (U.S. Pat. No. 7,734,428).

In addition to the above, other factors such as second phase particle surface properties, e.g. surface roughness, may affect the properties of thermoelectric materials. However, as of yet no process has been developed to determine if there is and/or which optimum range of such factors can provide a nanocomposite thermoelectric material with an improved ZT. Therefore, a process to model, calculate and/or determine an optimum range of second phase surface properties in which a nanocomposite thermoelectric material exhibits high ZT values would be desirable.

SUMMARY OF THE INVENTION

A process for manufacturing a nanocomposite thermoelectric material having a plurality of nanoparticle inclusions is provided. The process includes determining a material composition to be investigated for the nanocomposite thermoelectric material, the material composition including a conductive bulk material and an insulating nanoparticle inclusion material. In addition, a range of surface roughness values for the insulating nanoparticle material that can be obtained using current state of the art manufacturing techniques is determined. Thereafter, a plurality of Seebeck coefficients for the material composition as a function of the range of nanoparticle material surface roughness values is calculated, as is a plurality of electrical resistivity values and a plurality of thermal conductivity values.

Once the plurality of Seebeck coefficients, electrical resistivity values, and thermal conductivity values have been calculated, a corresponding range of figure of merit values for the material composition is calculated and a generally maximum range of the figure of merit values for the material composition and as a function of the range of nanoparticle material surface roughness values is determined Thereafter, a thermoelectric material having the determined material composition and nanoparticle material surface roughness corresponding to the generally maximum range of figure of merit values is manufactured.

The range of nanoparticle material surface roughness values can include a range of interfacial densities between 0.04 and 1.0 nanometers$^{-1}$ and a range of interface roughness between 0.05 and 3.0 nanometers. The range of nanoparticle material surface roughness values can also have a range of roughness correlation lengths between 0.1 to 10 nanometers and a range of roughness heights between 0.1 and 8 nanometers.

The nanoparticle material surface roughness corresponding to the surface roughness values can be obtained by etching the insulating nanoparticles and/or by in-situ nanoparticle growth. In some instances, the nanoparticles are obtained by producing a plurality of insulating nanowires and breaking the nanowires into nanoparticles, which are then subjected to an surface roughening process. In the alternative, a plurality of nanowires with a desired surface roughness can be provided before being broken into nanoparticles having at least one surface with a desired nanoparticle material surface roughness value. The nanowires can posses the desired surface roughness via an etching process, the surface roughness having a range of interfacial densities between 0.1 and 1.0 nanometers$^{-1}$, a range of roughness correlation lengths between 0.1 to 10 nanometers, and/or a range of roughness heights between 0.1 and 8 nanometers.

It is appreciated that the insulating nanoparticles can be incorporated within the conductive bulk material using any process, technique, etc. known to those skilled in the art such that a nanocomposite thermoelectric material is provided.

In some instances, the figure of merit values for the material system are calculated using the expression:

$$ZT = S^2 T/kp$$

Wherein ZT is the dimensionless figure of merit, S is the Seebeck coefficient, T is temperature in Kelvin, k is the thermal conductivity and p is the electrical resistivity for a given material composition.

A nanocomposite thermoelectric material is also provided. The nanocomposite thermoelectric material has a conductive matrix phase, an insulating nanoparticle phase and an interface therebetween. The interface has an average interface density within a range of 0.04-1.0 nm$^{-1}$ and an average interface roughness with a range of 0.5-3.0 nm. In some instances, the average interface density is between 0.05-0.2 nm$^{-1}$ and the average interface roughness is between 0.5-2.0 nm. Also, the insulating nanoparticle phase can have an average surface roughness correlation length between 0.1-1.0 nm and an average surface roughness height between 0.1-8.0 nm.

The conductive matrix phase can be a Bi-chalcogenide, $Mg_2X$ where X=Si, Ge or Sn, PbTe, $Bi_2Te_3$, $(Bi,Sb)_2Te_3$, $Bi_2Se_3$, (Co,Ni)Sb3, and combination thereof, and the like. In addition, the insulating nanoparticle phase can be an oxide, e.g. $ZrO_2$, $Yb_2O_3$ or $CeO_2$.

BRIEF DESCRIPTION OF THE FIGURES

FIG. 6 is a graphical representation of electron and phonon scattering time as a function of roughness correlation length and carrier concentration;

FIGS. 7a-7b are schematic illustrations of a model incorporating surface roughness into interfacial density for a nanoparticle according to an embodiment of the present invention;

FIG. 10 is a graphical representation of dimensionless figure of merit (ZT) as a function of interfacial density for a nanocomposite thermoelectric material with and without matrix/nanoparticles interfacial roughness;

FIG. 11 is a flowchart for a process according to an embodiment of the present invention;

FIG. 12 is a flowchart for a process according to an embodiment of the present invention;

FIG. 13 is a flowchart for a process according to an embodiment of the present invention;

FIG. 14 is a flowchart for a process according to an embodiment of the present invention;

FIG. 30 is a TEM image of the nanocomposite thermoelectric conversion material produced in the third example;

FIGS. 31A to 31D are schematic diagrams showing mechanism of liquid phase synthesis in a third production method according to the invention;

DETAILED DESCRIPTION OF THE INVENTION

Figure 1A:
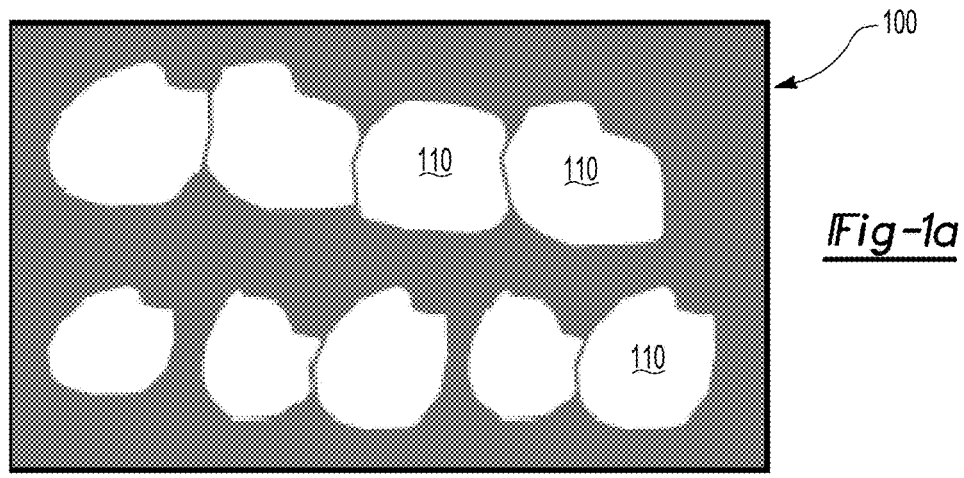
FIGS. 1a-1b are schematic illustrations of a nanocomposite thermoelectric material having a plurality of insulating nanoparticle inclusions with a rough surface.

The present invention discloses a process for determining an optimum range of compositions for a thermoelectric material system, within which the material system may exhibit generally high figure of merit values. As such, the process has utility for improving the efficiency of experimental design and production of thermoelectric materials.

The process for determining an optimum range of compositions for a thermoelectric material system considers a variety of relevant factors, parameters and the like in order to determine which material systems should be considered and/or which range of compositions should be studied in more detail. A thermoelectric material exhibiting a dimensionless high figure of merit (ZT) needs to possess a high Seebeck coefficient (S) for high voltage generation, a low electrical resistivity (p) to minimize Ohmic losses and a low thermal conductivity (k) to minimize heat conduction.

The relationship between ZT, S, p, and k can be expressed as:

$$ZT = S^2 T/kp \qquad \text{Eqn 1}$$

and/or as:

$$ZT = \frac{S^2 T}{\rho(k_{el} + k_{ph})} \qquad \text{Eqn 2}$$

where $k_{el}$ and $k_{ph}$ are the electronic and phonon contribution to the overall thermal conductivity k.

Typically, S, p, and k are interdependent are interdependent with an increase of the Seebeck coefficient resulting in an increase in electrical resistivity, whereas a decrease in the electrical resistivity results in an increase of the thermal conductivity. At least one approach for obtaining high figure of merit values has investigated the insertion of nanoparticles within a thermoelectric material (U.S. Pat. No. 7,309, 830). Materials using this approach can result in phonons being scattered by the nanoparticles, thereby reducing the lattice thermal conductivity while leaving the electrical resistivity and Seebeck coefficient for the thermoelectric host matrix unchanged.

Elemental substitutions, also known as atomic substitutions, in potential thermoelectric materials have imperfections on the order of 1 angstrom (Å). Thus alloying additions can result in the scattering of short-wavelength phonons much more effectively than mid- and long-wavelength phonons. Therefore, mid- and long-wavelength phonons dominate the heat conduction in alloys and thermoelectric materials that have been doped with other elements not originally within the starting material. In the alternative, the inclusion of additions such as nanoparticles in the size range of phonon wavelengths introduces another scattering mechanism that affects mid- and/or long-wavelength phonons, thereby providing an opportunity to reduce the thermal conductivity of such materials below the alloy limit. However, which nanoparticles with respect to their composition, size and size distribution, and which host matrix the nanoparticles should be added to has heretofore been a difficult task to predict. In response to the difficulty in predicting successful thermoelectric material systems, a process to perform just this task has been developed by Banerjee et al. (U.S. Pat. No. 7,734,428).

An embodiment of the process includes determining a material composition to be investigated for the nanocomposite thermoelectric material, the material composition including a conductive bulk material, also known as a matrix, and an insulating nanoparticle material present as inclusions within the matrix. Once the insulating nanoparticle material has been determined, a range of surface roughness values for the insulating nanoparticle material that can be obtained using current state of the art manufacturing techniques is determined. Thereafter, a plurality of Seebeck coefficients, electrical resistivity values, and thermal conductivity values for the material composition and as a function of the range of nanoparticle material surface roughness values can be calculated.

Once the Seebeck coefficients, electrical resistivity values and thermal conductivity values have been calculated, a corresponding range of figure of merit values can also be calculated and the generally maximum range for the figure of merit values can be determined. In this manner the generally maximum range of figure of merit values can be a function of the range of nanoparticle material surface roughness values and the determined material composition having nanoparticles with a desired surface roughness can be manufactured.

In the alternative to the above outlined embodiment, a plurality of material compositions can be investigated in a like manner and a single material composition or a limited range of compositions having a potential and desired ZT can be manufactured.

The nanoparticle material surface roughness can be obtained by etching the nanoparticles, in-situ growth of the nanoparticles, and the like. In the alternative, nanoparticles having a desired surface roughness can be obtained from a plurality of nanowires that have been broken to produce nanoparticles, the nanoparticles then subjected to a surface roughening process. In another alternative, a plurality of nanowires having a desired surface roughness can be broken into pieces to produce the nanoparticles. The surface roughness of the nanoparticles and/or the nanowires can be expressed by interfacial density and can have a range of interfacial density values between 0.1 and 1.0 nanometers$^{-1}$. In addition, or in the alternative, the nanoparticles or the nanowires can have a surface roughness expressed by roughness correlation length and roughness height, the range of roughness correlation lengths being between 0.1 to 10 nanometers and the range of roughness heights being between 0.1 and 8 nanometers.

Figure 1B:
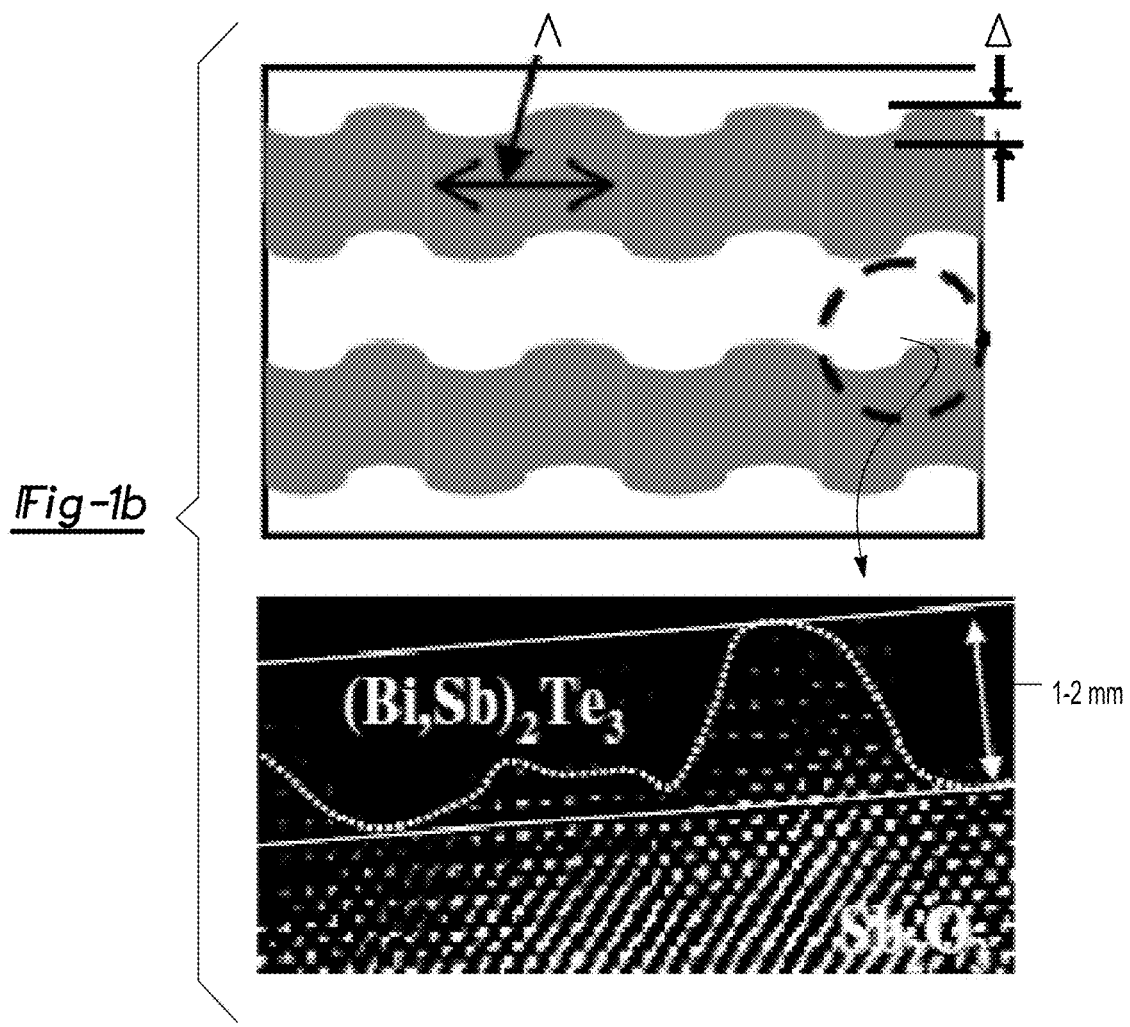

The terms "roughness correlation length" and "roughness height" are demonstrated in FIG. 1 which provides a schematic illustration of a nanocomposite thermoelectric material 100 having nanoparticles 110. As is obvious from FIG. 1A, the nanoparticles 110 have a rough outer surface. In some instances, the structure of the nanoparticles within the thermoelectric material can be modeled as a two-dimensional electron gas having a wave form or shape as shown in FIG. 1B. From this idolized model, the roughness correlation length ($\Lambda$) measures one cycle of the wave structure, for example one maximum height to an adjacent maximum height. In addition, the roughness height ($\Delta$) is measured as the distance between the maximum surface roughness height and the adjacent valley or trough depth. It is of interest to note that actual nanocomposite thermoelectric materials can have nanoparticle inclusions that do have a surface roughness that is similar to the shape of the idealized 2D electron gas model shown in FIG. 1B. In particular, FIG. 1C provides a transmission electron microscope image of an interface between a $Sb_2O_3$ nanoparticle and a $(Bi,Sb)_2Te_3$ matrix for a nanocomposite thermoelectric material. As shown in FIG. 1C, the surface roughness height is on the order of 1 to 2 nanometers.

In order to incorporate surface roughness of nanoparticle inclusions into a modeling and/or manufacturing process, the scattering behavior of electrons, holes, and/or phonons within a material can be useful. Not being bound by theory, a theoretical simulation can be based on the Boltzmann equation with relaxation time approximation. For example, a modified Callaway model with respect to the lattice of a thermoelectric material can be incorporated with scattering of phonons through grain boundaries, defects, nanoparticles, and the like provided by Equation 3 below:

$$\tau_c^{-1} = \tau_B^{-1} + \tau_U^{-1} + \tau_N^{-1} + \tau_A^{-1} + \tau_{NP}^{-1} \qquad \text{Eqn 3}$$

where $\tau$ corresponds to scattering time and the subscripts B, U, N, A and NP correspond to boundary, Umpklamp, normal, alloy, and nanoparticle, respectively, related scattering.

With respect to carriers, that is electrons and holes, Equation 4 can be used where Op, DOp, DAp, NPc and Bc represent optical phonon, deformation potential of optical phonon, deformation potential of acoustic phonon, carrier nanoparticle and carrier boundary related scattering.

$$\tau_\xi^{-1} = \tau_{Op}^{-1} + \tau_{DOp}^{-1} + \tau_{DAp}^{-1} + \tau_{NPc}^{-1} + \tau_{Bc}^{-1} \qquad \text{Eqn 4}$$

In addition to scattering time, the total electrical conductivity can be expressed as a summation of the contributions from both electron and hole bands, while the overall Seebeck coefficient can be obtained through weighting each band's contribution using a normalized electrical conductivity. In order to obtain the electronic thermal conductivity, the electronic thermal conductivity from the Lorentz number (L) can be obtained using Equations 5-7 below. In particular, Equation 5 is an expression of the total electrical conductivity ($\sigma$), Equation 6 is an expression of the overall Seebeck coefficient, and Equation 7 is an expression for the electronic thermal conductivity. It is appreciated that the bipolar thermal conductivity contribution to the electronic thermal conductivity must also be considered and that this type of conduction occurs when carriers moving between different bands carry heat via the Peltier effect and as such can still transport heat even if the net electric current is zero.

$$\sigma = \sum_i^{e,h} \sigma_i \qquad \text{Eqn 5}$$

$$S = \sum_i^{e,h} \frac{S_i \sigma_i}{\sigma} \qquad \text{Eqn 6}$$

$$k_e = \left(\frac{k_B}{e}\right)^2 \left(\sum_i^{e,h} L_i + L_b\right) \sigma T \qquad \text{Eqn 7}$$

Estimates of the effect of interface roughness between a matrix and a nanoparticle inclusion on mobility within the material can be imprecise since the roughness itself can be difficult to model. Not being bound by theory, an embodiment of the present invention assumes that fluctuations at the interface are randomly correlated spatially and can be described using a Gaussian distribution. In addition, and regarding the interaction between an electron and the interface, the variation in the potential that the electron experiences is assumed to be based on a first-order Taylor expansion of the confining potential as shown in Equation 8.

$$\Delta V(\vec{r}) = \frac{e^2 N_s}{2\varepsilon_s} \Delta V(\vec{r}) \qquad \text{Eqn 8}$$

Taking Equation 8 as the perturbation and assuming a correlation of the form:

$$\langle \Delta(\vec{r})\Delta(\vec{r}'-\vec{r})\rangle = \Delta^2 e^{-r^2/\Lambda^2}, \qquad \text{Eqn 9}$$

the scattering rate of electrons due to interfacial surface roughness can be represented by:

$$\frac{1}{\tau_{ir}(E)} = \left(\frac{e^2 N_s \Delta \Lambda}{2\varepsilon_s}\right)^2 \frac{m^*}{\hbar^3} J_{in}(k) \qquad \text{Eqn 10}$$

where E is the electron energy and:

$$J(k) = \int_0^{2k} \frac{e^{-\frac{q^2\Lambda^2}{4}}}{2k^3(q+q_s)^2 \sqrt{1-\left(\frac{q}{2k}\right)^2}} q^4 dq \qquad \text{Eqn 11}$$

and $$q_s = \frac{e^2 m^*}{2\pi\varepsilon_s \hbar^2} F(q) \qquad \text{Eqn 12}$$

and $$F(q) = \int_0^\infty dz \int_0^\infty dz' [f(z)]^2 [f(z')]^2 e^{-q|z-z'|} \qquad \text{Eqn 13}$$

where f(z) is the Fang-Howard vibrational wave function, $\epsilon_s$ is a static dielectric constant, and m* is the electron effective mass. In addition, $N_s$ is the surface carrier concentration for the case of a 2D electron gas and the electron wave vector $k=2\pi/\lambda_e$. As such, the total scattering time for an electron can be represented as:

$$\tau_g^{-1} = \tau_{Op}^{-1} + \tau_{DOp}^{-1} + \tau_{DAp}^{-1} + \tau_{NP}^{-1} + \tau_B^{-1} + \tau_{ir}^{-1} \qquad \text{Eqn 14}$$

where ir represents interface roughness.

The rate of momentum relaxation of phonons due to a Gaussian interfacial roughness can be represented by:

$$\frac{1}{\tau_{ir}} = (\delta\omega_{AB})^2 \frac{\omega_o}{2u_l^2} \Lambda^2 \alpha^2 Z_p \qquad \text{Eqn 15}$$

where $\delta\omega_{AB}$ is the difference in mode frequency for the two materials forming the interface and $\alpha$ is the probability for a phonon to be in the region of interfacial surface roughness. In addition, $\omega_o$ is the average phonon frequency and $u_l$ to is the sound velocity.

The factor $\alpha$ for confined phonons can be represented by:

$$\alpha = \left[1 - \frac{q_z^2 - k^2}{q_z^2 + k^2} \frac{\sin(2q_z\Delta)}{2q_z\Delta}\right]\frac{\Delta}{L} \qquad \text{Eqn 16}$$

Where:

$$q_z = n\pi/L \qquad \text{Eqn 17}$$

and $Z_p$ can be represented by:

$$Z_p = \int_0^{2\pi} (1-\cos\theta) e^{[-q^2\Lambda^2 \sin^2\theta/2]} d\theta \qquad \text{Eqn 18}$$

The phonon wave vector related to phonon frequency can also be represented by $$\omega^2 = \omega_o^2 - u_l^2(q^2 - q_z^2) \qquad \text{Eqn 19}$$

such that the case of total scattering for phonons is:

$$\tau_c^{-1} = \tau_B^{-1} + \tau_U^{-1} + \tau_N^{-1} + \tau_A^{-1} + \tau_{NP}^{-1} + \tau_{ir}^{-1} \qquad \text{Eqn 20}$$

Figure 2:
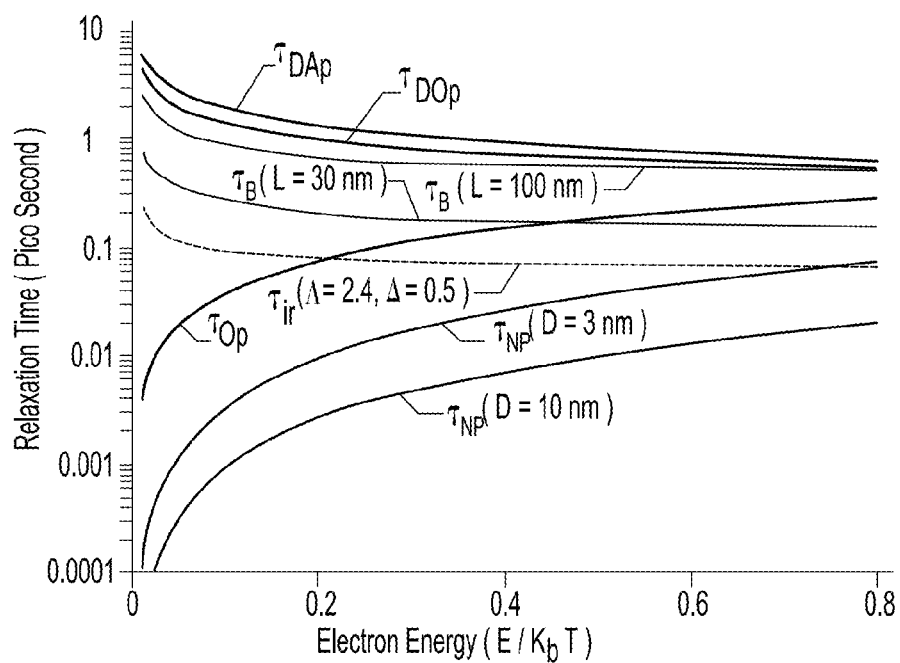
FIG. 2 is a graphical representation of calculated relaxation times for various electron scattering mechanisms in a nanocomposite thermoelectric material sample.

Using these expressions, the effect of surface roughness scattering for electrons and holes can be determined by comparing calculated relaxation times for various scattering processes as shown in FIG. 2 with a smaller or lower relaxation time the result of a stronger scattering effect. As shown in the figure, the most effective scattering mechanism is due to scattering afforded by nanoparticles ($\tau_{NP}$), however such an effect is reduced with increasing nanoparticle size as illustrated by comparing the curve for nanoparticles with a diameter of 3 nanometers ($\tau_{NP}$(D=3 nm)) to the curve for nanoparticles with a diameter of 10 nanometers ($\tau_{NP}$(D=10 nm)). In addition, interfacial surface roughness scattering ($\tau_{ir}$) can be comparable to optical phonon and nanoparticle scattering at high electron energies with increasing electron energy resulting in an increase in the effect of interfacial surface roughness scattering. The grain boundary and deformation potentials also increase with higher energy electrons. As such, calculations as represented by FIG. 2 illustrate that interfacial surface roughness can have an effect on thermoelectric properties, particularly for mid to high energy electrons/holes.

Figure 3:
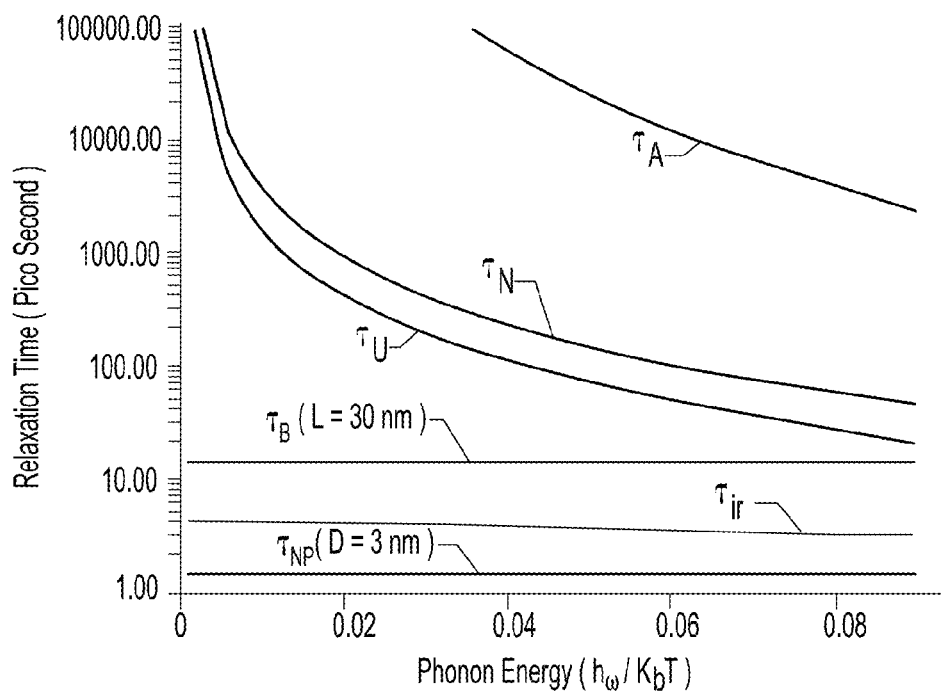
FIG. 3 is a graphical representation of calculated relaxation times for various phonon scattering mechanisms in a nanocomposite thermoelectric material sample.

Regarding phonon scattering, $\delta\omega_{AB}$ in the case of $Bi_2Te_3$—$SiO_2$ nanocomposite has been calculated to be of the order of $10^{12}$ seconds$^{-1}$. The calculated relaxation times as a function of phonon energies are illustrated in FIG. 3 with dominant scattering afforded by nanoparticles, interfacial surface roughness, and grain boundaries. It is appreciated that the strongest effect among these scattering mechanisms is determined by the size of second phase nanoparticle inclusions, the grain size, roughness parameters, all of which are complicated to estimate theoretically.

For the calculations illustrated in FIGS. 2 and 3, nanoparticles having a diameter of 3 nanometers (D=3 nm) and 10 nanometers (D=10 nm) with a 1 nanometer size distribution were assumed. In addition, a grain of 30 nanometers (L=30 nm) was used in the calculations. Regarding interfacial roughness parameters, a correlation length ($\Lambda$) of 2.4 nanometers and a roughness height ($\Delta$) of 0.5 nanometers were also assumed. Although estimation of the exact effect of grain size, roughness parameters, and second phase inclusions is difficult to model, FIG. 3 does illustrate that the natural crystal related relaxation times such as normal, Umpklamp, and alloys scattering are overpowered by artificial scattering mechanisms which may or may not be altered.

Figure 4:
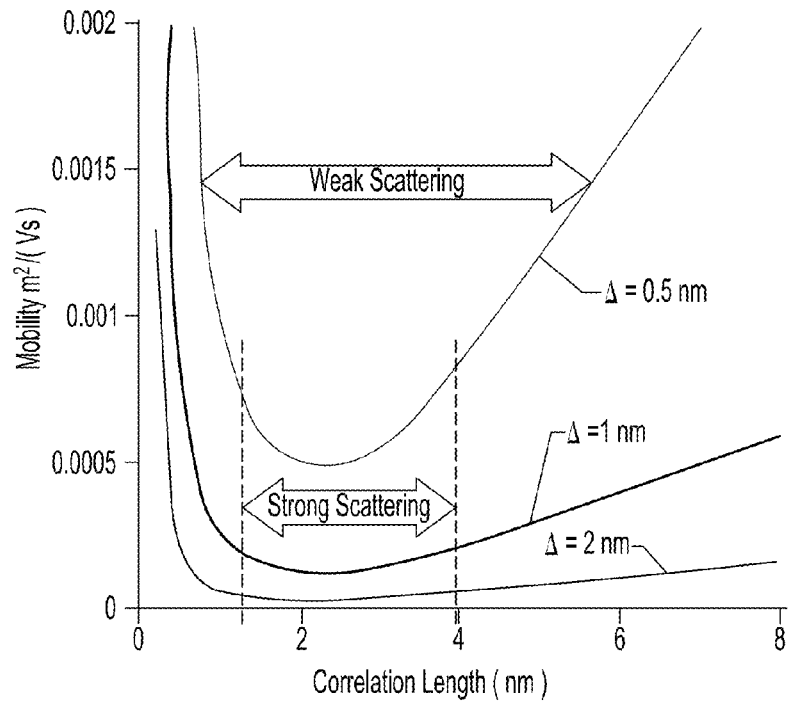
FIG. 4 is a graphical representation of carrier mobility as a function of roughness correlation length ($\Lambda$) and roughness height ($\Delta$)

Regarding the effect of roughness parameters alone on scattering, FIG. 4 illustrates the effect of correlation length and roughness height on hole mobility using an equation similar to $\mu_{ir}=(e/m^*)\tau_{ir}$. The roughness height was varied from 0.5 to 2 nanometers while the correlation length was varied from 0 to 8 nanometers. As illustrated in FIG. 4, a correlation length between 1 to 4 nanometers afforded the strongest effect on scattering with 2.4 nanometers having the maximum effect. In addition, and as expected, increasing roughness height showed an increasing effect on scattering.

Figure 5:
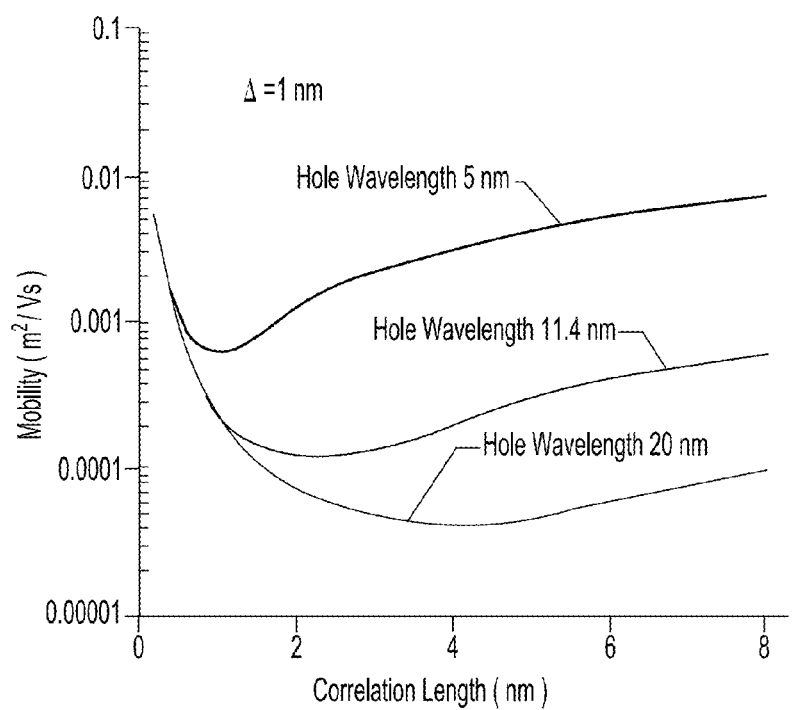
FIG. 5 is a graphical representation of calculated carrier mobility as a function of roughness correlation length and carrier energy represented by carrier wavelength.

Referring now to FIG. 5, hole mobility as a function of correlation length and carrier energy is provided and illustrates that high energy holes (smaller wavelength) are less affected by roughness scattering. Nevertheless, a region of strong scattering effect within a range of correlation lengths is observed.

As is known to those skilled in the art, a desired nanocomposite thermoelectric material is expected to provide improved or increased ZT due to strong phonon scattering and weak electron scattering afforded by the plurality of interfaces such as grain boundaries and matrix/nanoparticle interfaces. As such, and in an effort to compare electron scattering and phonon scattering within a nanocomposite thermoelectric material, calculations represented by FIG. 6 were performed with scattering or relaxation time in picoseconds for electrons shown on the left vertical axis and for phonons shown on the right vertical axis as a function of roughness correlation length. A roughness height of 1 nanometer was assumed.

As shown in FIG. 6, electron scattering increased with high carrier density while for phonon scattering, an increase in correlation length and interparticle distance result in weakening thereof. Also observed from FIG. 6 is a minimum in electron and phonon scattering time, thus illustrating an intermediate range for roughness parameters that can provide optimum scattering effects and thus optimum ZT. As such, it is appreciated that to take advantage of surface roughness, roughness parameters and electron carrier density must be optimized to generate weak electron scattering and strong phonon scattering.

Referring now to FIG. 7, a schematic illustration of a model for surface roughness of an interfacial area between a nanoparticle and a matrix is provided. It is assumed that a rough surface between the nanoparticle and the matrix increases the surface area therebetween and thereby increases scattering of phonons. The model also assumes a nanoparticle having radius R with a plurality of small sphere-shaped surfaces populating the surface. In fact, the small spheres are assumed to completely cover the nanoparticle surface, although strictly speaking this is not true due to a packing ratio of small spheres on the surface of the nanoparticle being less than 100%. The radius of the small spheres is defined as r, the distance from one sphere maximum height to an adjacent sphere maximum height is defined as $4c=\Lambda$, and the distance between the top of a small sphere and the bottom of a valley adjacent thereto is defined as $2h=2\Delta$. The volume (V) and surface area (S) can be expressed as:

$$V = \frac{\pi}{6}h(3c^2 + h^2) \quad \text{Eqn 21}$$

$$S = \pi(c^2 + h^2) \quad \text{Eqn 22}$$

where $$c = \sqrt{h(2r - h)} \quad \text{Eqn 23}$$

It is appreciated that since the correlation length equals 4c ($\Lambda=4c$) the equation for r can be derived as:

$$r = \frac{1}{4}\left(\frac{\Lambda^2}{4\Delta} + \Delta\right) \quad \text{Eqn 24}$$

Including the effect of nanoparticle standard deviation, the interfacial surface area can be calculated as:

$$Aiv = \frac{3UFT_a}{T_v} \quad \text{Eqn 25}$$

where:

$$T_a = \int_0^\infty r^2 \frac{r^{A-1}e^{-r/B}}{B^A \Gamma(A)} dr \quad \text{Eqn 26}$$

$$T_v = \int_0^\infty r^3 \frac{r^{A-1}e^{-r/B}}{B^A \Gamma(A)} dr \quad \text{Eqn 27}$$

$$F = \frac{2r}{2r - \Delta/2} \quad \text{Eqn 28}$$

Figure 8:
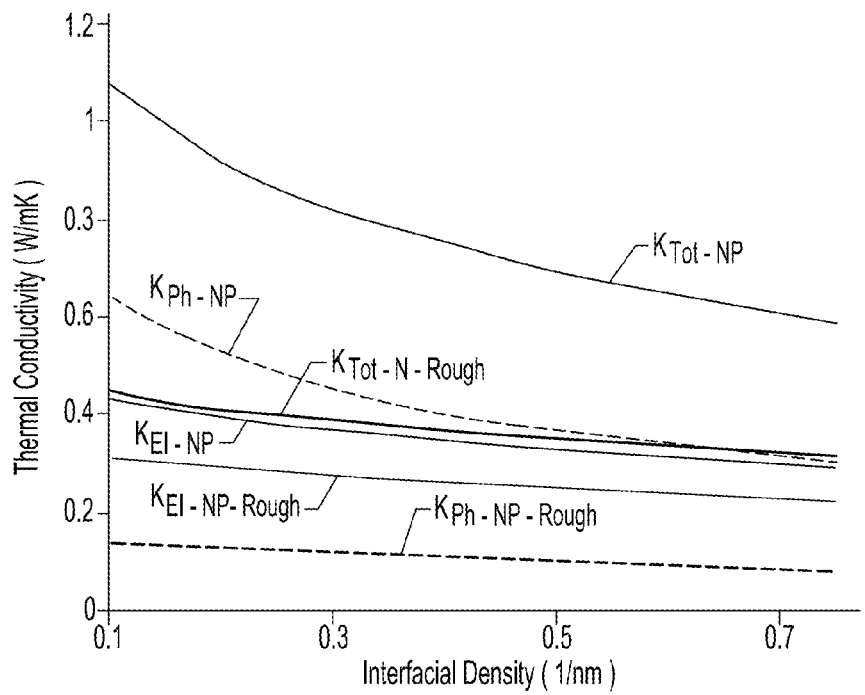
FIG. 8 is a graphical representation of phonon, electron, and total thermal conductivity as a function of interfacial density for a nanocomposite thermoelectric material having a smooth matrix/nanoparticle interface and a nanocomposite thermoelectric material having a rough matrix/nanoparticle interface.

Based on the above derivation of volume and surface area, the effect of interfacial density (S/V) on thermoelectric properties was calculated. For example, FIG. 8 provides a graphical representation of the effect of interfacial density on electron, phonon, and total thermal conductivity for a $Bi_2Te_3$—$SiO_2$ nanocomposite thermoelectric material in which an average diameter of 3 nanometers, a roughness correlation length of 2.4 nanometers, a roughness height of 0.5 nanometers, a grain size of 30 nanometers, and a grain boundary barrier height of 60 milli-electron volts were assumed. As shown in the figure, the nanocomposite material having a rough matrix/nanoparticle interface has a significantly reduced thermal conductivity compared to the material not having a rough matrix/nanoparticles interface.

Figure 9:
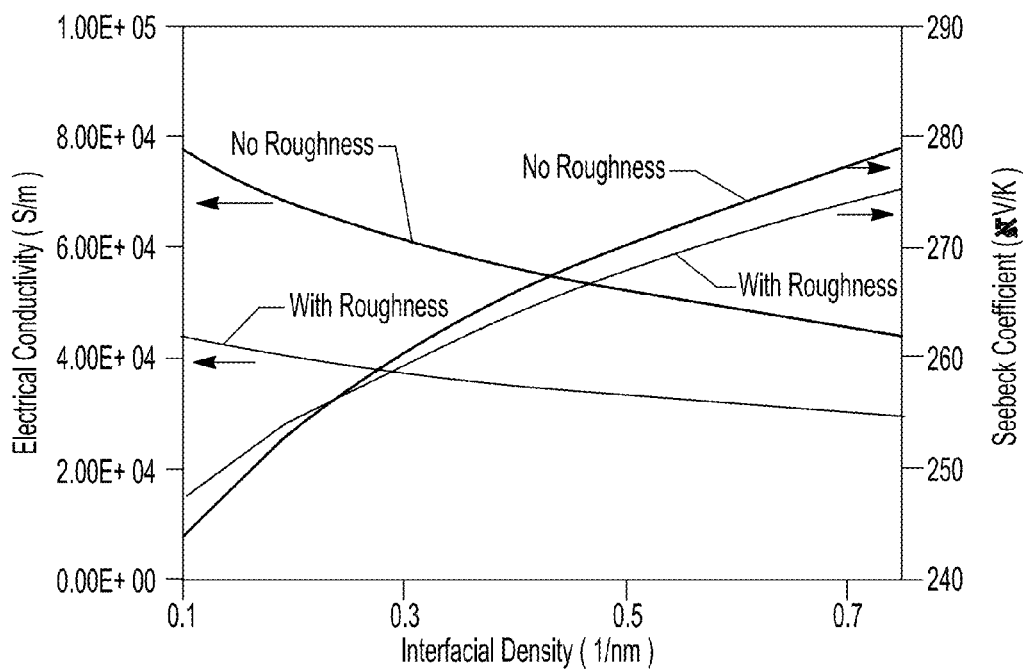
FIG. 9 is a graphical representation of electronic conductivity and Seebeck coefficient as a function of interfacial density for a nanocomposite thermoelectric material with and without matrix/nanoparticles interfacial roughness.

It is evident that the effect of interfacial roughness can be significant in reducing thermal conductivity of a nanocomposite material. Regarding electrical conductivity and Seebeck coefficient for such a material, FIG. 9 provides a graphical representation for the effect of interfacial density on these material properties. An average phonon energy of 0.008 electron volts was assumed, which is appreciated to be relatively close to literature values suggested for $Bi_2Te_3$. As shown in FIG. 9, the effect of interfacial surface roughness is quite pronounced for the electrical conductivity, for example reducing the electrical conductivity by 50% at low interfacial density values while averaging around 30 to 40 percent at higher interfacial density values. Regarding the Seebeck coefficient, such a large difference was not observed.

Despite the reduction in electrical conductivity and Seebeck coefficient for a rough interface, the overall ZT for the nanocomposite thermoelectric material was observed to increase for a rough interface as illustrated in FIG. 10. It is appreciated that the increase in ZT was observed to be the greatest at low values of interfacial density. In addition, it is important to note that a specific roughness correlation length and roughness height were assumed for the results shown in FIG. 10, and that additional calculations that optimize the surface roughness parameters to provide a maximum ZT can be calculated and are within the scope of the present invention.

Turning now to FIG. 11, a process for manufacturing a thermoelectric material is shown generally at reference numeral 10. The process 10 includes determining a thermoelectric material composition to be investigated at step 100, followed by determining a range of ZT values for the thermoelectric material composition at step 110. Given the range of determined ZT values determined at step 110, step 120 determines a range of maximum ZT values and a thermoelectric material is manufactured at step 130.

FIG. 12 illustrates a flowchart for a process according to another embodiment of the invention at reference numeral 20. The process 20 includes determining a thermoelectric material composition ($C_i$) to be investigated at step 200, the composition Ci having a conductive bulk material and an insulating inclusion material such an insulating particle material, an insulating nanoparticle material, etc. The range of surface or interface roughness values that are obtainable for the insulating inclusion material using current state of the art manufacturing techniques is determined at step 210. In some instances, step 210 can include determining a range of surface or interface density values that are obtainable using current state of the art manufacturing techniques. At step 220, ZT values are calculated for $C_i$ as a function of the conductive bulk material, the insulating inclusion material and the obtainable range of surface roughness values for the insulating inclusion material determined in step 210. Thereafter, a surface roughness value is selected as a function of the calculated ZT values for $C_i$ at step 230.

Finally, a thermoelectric material is manufactured at step 240, the thermoelectric material having the composition $C_i$ from step 200, the conductive bulk material and the insulating inclusion material with a surface roughness and/or surface/interface density corresponding or equivalent to the selected surface roughness and/or surface/interface density value from step 230. For the purposes of the present invention, the term corresponding or equivalent to is defined as being within 10%, i.e. the surface/interface roughness or surface/interface density of the manufactured thermoelectric material is within +/−10% of the selected surface/interface roughness or surface/interface density, respectively.

Another flowchart illustrating a process according to another embodiment of the present invention is shown generally at reference numeral 30 in FIG. 13. The process 30 includes determining a thermoelectric material composition ($C_i$) made from a conductive bulk material and an insulating inclusion material to be investigated at step 300 followed by determining a range of surface roughness values that are obtainable for the insulating inclusion material at step 302.

The process 30 also includes calculating Seebeck coefficients for the $C_i$ composition as a function of the conductive bulk material, insulating inclusion material and obtainable surface roughness values for the insulating inclusion material at step 304. At step 306, the process 30 includes calculating electrical resistivity values for $C_i$ as a function of the conductive bulk material, insulating inclusion material and obtainable surface roughness values for the insulating inclusion material. At step 308, the calculation of thermal conductivity values for $C_i$ as a function of the conductive bulk material, insulating inclusion material and obtainable surface roughness values for the insulating inclusion material is performed. Next, the calculation of ZT values for $C_i$ as a function of the calculated Seebeck coefficients, electrical resistivity values, and thermal conductivity values is performed at step 310.

Once the ZT values have been calculated, a maximum range of the calculated ZT values for $C_i$ is determined at step 312 and step 314 includes determining a surface roughness value that is within the maximum determined range of ZT values from step 312. At step 316, a thermoelectric material having the composition $C_i$, conductive bulk material and insulating inclusion material with a surface roughness corresponding to the determined surface roughness value of step 314 is manufactured. It is appreciated that in order to manufacture the thermoelectric material at step 316, material(s) corresponding to the composition $C_i$ is provided and processed to produce the material.

Referring to FIG. 14, another process according to an embodiment of the present invention is shown generally at reference numeral 40. The process 40 includes determining a thermoelectric material composition $C_i$ made from a conductive bulk material and an insulating inclusion material to be investigated at step 400 followed by determining a range of surface roughness values for the insulating inclusion material at step 410.

At step 420, ZT values for $C_i$ are calculated as a function of the conductive bulk material, insulating inclusion material and determined surface roughness values for the insulating inclusion material obtained at step 410. It is appreciated that the ZT values can be calculated as a function of Seebeck coefficients, electrical resistivity values, and thermal conductivity values for $C_i$ that are also a function of the function of the conductive bulk material, insulating inclusion material and determined surface roughness values for the insulating inclusion material obtained at step 410.

A desired range of the calculated ZT values for $C_i$ is determined at step 430, e.g. a desired maximum range of the calculated ZT values can be determined. Based on the determined desired range of the calculated ZT values at step 430, a range of surface roughness values for the insulating inclusion material that falls within ZT values range is determined at step 440. Then, a range of surface roughness values that are obtainable using current state of the art production techniques and fall within the determined desired range of calculated ZT values for $C_i$ are determined at step 450.

A powder that has the $C_i$ composition, conductive bulk material, insulating inclusion material and a surface roughness corresponding to or falling within the range of surface roughness values determined at step 450 is provided at step 460. It is appreciated that powder may or may not be in the form of nanoparticles such a nano-spheres, nano-rods, nano-discs, nano-ellipsoids, and the like.

Figure 15:
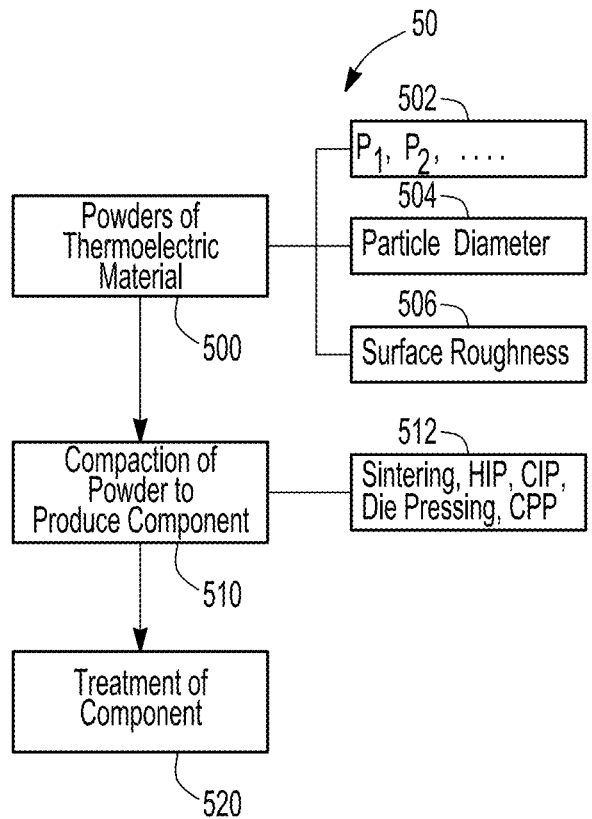
FIG. 15 is a flowchart for a process according to an embodiment of the present invention.

The powder provided at step 460 is processed to produce a component. For example, a process for processing the powders is shown in FIG. 15 at reference numeral 50. The process 50 includes taking or obtaining the powders of the thermoelectric material at step 500, the powders having desired chemical and/or physical properties/characteristics. For example, the powders can include a mixture of first component particles $P_1$, second component particles $P_2$, etc. as shown at 502. It is appreciated that one of component particles, e.g. $P_1$, can be particles of the conductive bulk material and that another of the component particles, e.g. $P_2$, can be particles of the insulating inclusion material. In addition, the powders and/or components, $P_1$, $P_2$, etc., can have a desired particle diameter as shown at step 504 and/or a desired surface roughness as shown at step 506.

It is also appreciated that the particle diameter of the first component particles $P_1$ can be the same or different than the particle diameter of the second component particles $P_2$. Finally, it is appreciated that the terms "particle diameter" and "matrix grain size" refer to an average particle diameter and average matrix grain size, respectively, as is known to those skilled in the art. The variation in particle diameters and matrix grain sizes can have a half width at half maximum height (HWHM) to modal diameter ratio between 0.4-0.6 for a differential distribution as is known to those skilled in the art. In other instances, the HWHM/modal diameter ratio is between 0.3-0.4 or, in the alternative, between 0.2-0.3. In the alternative, the HWHM/modal diameter ratio is between 0.6-0.7 or, in the alternative, between 0.7-0.8.

The process 50 further includes compaction of powders to produce a thermoelectric component at step 510. The step 510 can be a compaction by any means or method known to those skilled in the art, illustratively including sintering, hot isostatic pressing (HIP), cold isostatic pressing (CIP), die pressing, continuous particle or powder processing (CPP), etc. as shown at 512. In some instances, the component is further treated at step 520 in order to obtain a desired matrix grain size and/or desired insulating inclusion particle surface roughness. For example and for illustrative purposes only, the treatment at step 520 can include a thermal treatment, a mechanical treatment, and/or a thermal-mechanical treatment. Other treatments such as exposure to electromagnetic radiation, nuclear radiation, and the like can be included.

Figure 16:
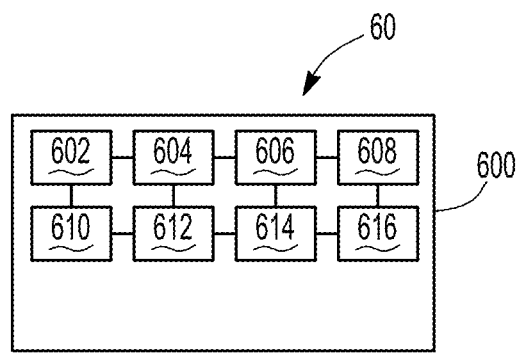
FIG. 16 is a schematic illustration of a computer with a processor according to an embodiment of the present invention.

Regarding the calculation of the various Seebeck coefficients, electrical resistivity values, thermal conductivity values, ZT values, and the like, FIG. 16 provides a schematic illustration of a computer at reference numeral 60. The computer 60 can include a CPU 600 with a plurality of components 602, 604, 606, . . . 616. For example and for illustrative purposes only, the CPU 600 can include a processor 602, memory 604, database 606, and the like. It is appreciated that the various components 602-616 are in communication with each other and with the CPU 600 as is known to those skilled in the art.

The various calculations can include algorithms with respect to Equations 1-16, and assumptions and electric, physical, etc. constants known to those skilled in the art. For example, the temperature T referenced in Equation 1 can be assumed to be room temperature. In the alternative, the calculations can assume a plurality of temperatures, e.g. temperatures ranging from 0° C. to 100° C. at increments of 1° C., increments of 5° C., increments of 10° C., and the like. Also, the memory 604 and/or database 606 can have one or more look-up tables that afford for the processor to retrieve data from in order to perform calculations via one or more desired algorithms stored on memory 604 and/or database 606.

In order to illustrate a sample calculation, but not limit the scope of the instant disclosure in any way, an example of a ZT calculation is provided below.

The figure of merit (ZT) for a given grain size and grain barrier height combination "j", is given by:

$$ZT = S^2 \cdot T \cdot C / (K_e + K_l) \quad \text{Eqn 29}$$

where S is the Seebeck coefficient for the given grain size and grain boundary barrier height, C is the electrical conductivity, $K_e$ is the electron contribution to the overall thermal conductivity and $K_l$ is the phonon contribution to the overall thermal conductivity—all for the given grain size and grain boundary barrier height. It is appreciated that the index "j" for the given grain size and grain boundary energy barrier height is not shown for convenience, unless needed for clarity. Stated differently, each of the expressions discussed are for the given grain size and grain boundary energy barrier height "j".

In order to properly define S, C, $K_{ph}$ and $K_e$, a series of constants known to those skilled in the art are required and provided below. It should be appreciated that the values for the constants listed below are presented without units, as used in computer code for the calculation of ZT as a function of grain size and grain boundary energy height. However, it should also be appreciated that the units for the constants provided below would be known to one skilled in the art and be in accordance with units that afford calculation of the Seebeck coefficient in microvolts per meter (μV/m), electrical conductivity in siemens per meter (S/m) and thermal conductivity in watts per meter kelvin (W/mK).

General constants used in an example calculation include:

$\pi = 3.14$ $k_B = 1.38 \times 10^{-23}$ = Boltzmann constant $h_c = 1.054 \times 10^{-34}$ = Planck's constant $e_v = 1.6 \times 10^{-19}$ = 1 electron volt $e = 1.6 \times 10^{-19}$ = electron charge $m_e = 9.1 \times 10^{-31}$ = electron effective mass $\epsilon_o = 8.85 \times 10^{-12}$ = permittivity of air $e_f = 69.8 \cdot \epsilon_o \cdot 4\pi$ = high frequency dielectric constant  Eqn 30

$e_o = 400 \cdot \epsilon_o \cdot 4\pi$ = static dielectric constant  Eqn 31

Also, density of states constants and expressions related to effective mass include:

$N_v = 12$ = number of valleys in the electron bandstructure $E_g = 0.13 \cdot e_v - 1.08 \times 10^{-4} \cdot T \cdot e_v$ = electron bandgap  Eqn 32

$\beta_L = E_g/(k_B T)$ = bandgap in $k_B T$  Eqn 33

$\beta = k_B T/E_g$ = inverse of bandgap in $k_B T$  Eqn 34

$e_g = E_g/e_v$ = bandgap in electron volt  Eqn 35

$m_{h1} = 0.0308 \cdot m_e$ = hole effective mass  Eqn 36

$m_{h2} = 0.441 \cdot m_e$ = hole effective mass  Eqn 37

$m_{h3} = 0.0862 \cdot m_e$ = hole effective mass  Eqn 38

$m_{e1} = 0.0213 \cdot m_e$ = electron effective mass  Eqn 39

$m_{e2} = 0.319 \cdot m_e$ = electron effective mass  Eqn 40

$m_{e3} = 0.0813 \cdot m_e$ = electron effective mass  Eqn 41

$md_e = N_v^{2/3} \cdot (m_{e1} \cdot m_{e2} \cdot m_{e3})^{1/3}$ = density of state electron effective mass  Eqn 42

$md_{e1} = (m_{e1} \cdot m_{e2} \cdot m_{e3})^{1/3}$ = density of state electron effective mass  Eqn 43

$md_h = N_v^{2/3} \cdot (m_{e1} \cdot m_{e2} \cdot m_{e3})^{1/3}$ = density of state hole effective mass  Eqn 44

$md_{h1} = (m_{e1} \cdot m_{e2} \cdot m_{e3})^{1/3}$ = density of state hole effective mass  Eqn 45

$Mc_e = 3/(1/m_{e1} + 1/m_{e2} + 1/m_{e3})$ = Total effective mass of electron  Eqn 46

$Mc_h = 3/(1/m_{h1} + 1/m_{h2} + 1/m_{h3})$ = Total effective mass of hole  Eqn 47

Fermi energy expressions include:

$$zF = 1.68000000000002000000 \times 10^{-9} \cdot T^3 - 2.32525000000003000000 \times 10^{-6} \cdot T^2 + 1.18722500000002000000 \times 10^{-3} \cdot T - 2.36675820000002000000 \times 10^{-1} \quad \text{Eqn 48}$$

$E_f = zF \cdot e_v$ = Fermi energy in $e_v$ \hfill Eqn 49

$x_f = E_f/(k_B \cdot T)$ = Fermi energy in $k_B \cdot T$ \hfill Eqn 50

$F_e = (E_f - E_g/2)/(k_B \cdot T)$ = energy of electron \hfill Eqn 51

$F_h = -(E_g/2 + E_f)/(k_B \cdot T)$ = energy of hole \hfill Eqn 52 with Fermi functions:

$$f_e = 1/(1 + \exp(z - F_e)) \quad \text{Eqn 53}$$

$$d1_e = \frac{df_e}{dz} = \frac{d(1/(1 + \exp(z - F_e)))}{dz} \quad \text{Eqn 54}$$

$$f_h = \frac{1}{(1 + \exp(z - F_h))} \quad \text{Eqn 55}$$

$$d1_h = \frac{df_h}{dz} = \frac{d(1/(1 + \exp(z - F_h)))}{dz} \quad \text{Eqn 56}$$

and conductivity effective mass expressions:

$$L1_e = \int_{-F_e}^{\infty} (z + \beta z^2)^{1.5} \frac{d(1/(1+\exp(z-F_e)))}{dz} dz \quad \text{Eqn 57}$$

$$L2_e = \int_{-F_e}^{\infty} \frac{(z+\beta z^2)^{1.5} \cdot \frac{d(1/(1+\exp(z-F_e)))}{dz}}{(1+2\beta z)} dz \quad \text{Eqn 58}$$

$$L1_h = \int_{-F_h}^{\infty} (z + \beta z^2)^{1.5} \cdot \frac{d(1/(1+\exp(z-F_h)))}{dz} dz \quad \text{Eqn 59}$$

$$L2_h = \int_{-F_h}^{\infty} \frac{(z+\beta z^2)^{1.5} \cdot \frac{d(1/(1+\exp(z-F_h)))}{dz}}{(1+2\beta z)} dz \quad \text{Eqn 60}$$

$mc_e = Mc_e \cdot L1_e/L2_e$ = conductivity effective mass of electron \hfill Eqn 61

$mc_h = Mc_h \cdot L1_h/L2_h$ = conductivity effective mass of hole \hfill Eqn 62

Regarding scattering terms, the polar optical phonon scattering of electrons ($\tau_{poe}$) and holes ($\tau_{poh}$) can be determined from the following constants and expressions:

$\tau_o = 8.85 \times 10^{-12}$ = permittivity of air $e_1 = 69.8$ = high frequency dielectric constant $e_0 = 400$ = static dielectric constant $K_0 = 0.1 e_v$ = optical phono energy $N_0 = 1/(\exp(K_0/(k_B \cdot T)) - 1)$ = phonon Plank function \hfill Eqn 63

$cop_e = (4\pi \cdot \epsilon_o \cdot h_c^2/(3e^2 \cdot (1/e_1 - 1/e_0) \cdot N_0)) \cdot (2/(md_e \cdot K_0 \cdot (1 + K_0/E_g)))^{0.5}$ \hfill Eqn 64

$cpo_h = (4\pi \cdot \epsilon_o \cdot h_c^2/(3e^2 \cdot (1/e_1 - 1/e_0) \cdot N_0)) \cdot (2/(md_h \cdot K_0 \cdot (1 + K_0/E_g)))^{0.5}$ \hfill Eqn 65

$b_e = (1 + 2\beta z)/(z + \beta z^2)$ \hfill Eqn 66

$\tau_{z3} = 1/b_e$ \hfill Eqn 67 with:

$\tau_{poe} = cpo_e \cdot \tau_{z3}$ = lifetime for optical phonon-electron scattering \hfill Eqn 68 and:

$\tau_{poh} = cpo_h \cdot \tau_{z3}$ = lifetime for optical phonon-hole scattering \hfill Eqn 69

Deformation potential scattering of electrons ($\tau_{dae}$) and holes ($\tau_{dah}$) by acoustic phonons can be determined using the following constants and expressions:

$K_a = 1.1$ = fitting constant $C_f = 7.1 \times 10^{10}$ = combination electric constant $E_{ac} = 3.5 e_v$ = deformation potential for acoustic phonon \hfill Eqn 70

$B_a = 8\beta z(1 + \beta z) \cdot K_a/(3(1 + 2\beta z^2))$ \hfill Eqn 71

$A_a = \beta z(1 - K_a)/(1 + 2\beta z)$ \hfill Eqn 72

$Cda_e = 2\pi h_c^4 \cdot C_f/(E_{ac}^2 \cdot (2 \cdot md_e \cdot k_B \cdot T)^{1.5})$ \hfill Eqn 73

$Cda_h = 2\pi h_c^4 \cdot C_f/(E_{ac}^2 \cdot (2 \cdot md_h \cdot k_B \cdot T)^{1.5})$ \hfill Eqn 74

$\tau_{z1} = 1/(((z+\beta z^2)^{0.5}) \cdot (1+2\beta z) \cdot ((1-A_a)^2 - B_a))$ \hfill Eqn 75 with:

$\tau_{dae} = Cda_e \cdot \tau_{z1}$ = lifetime for acoustic phonon-electron scattering \hfill Eqn 76 and:

$\tau_{dah} = Cda_h \cdot \tau_{z1}$ = lifetime for acoustic phonon-hole scattering \hfill Eqn 77

Deformation potential scattering of electrons ($\tau_{doe}$) and holes ($\tau_{doh}$) by optical phonons can be determined using the following constants and expressions:

$r_{ho} = 7.86 \times 10^3$ = density $a = 10.45 \times 10^{-10}$ = lattice constant $K_o = 1.1$ = fitting constant $E_{oc} = 60 e_v$ = deformation potential for optical phonon \hfill Eqn 78

$B_o = 8\beta z(1 + \beta z) \cdot K_o/(3(1 + 2\beta z)^2)$ \hfill Eqn 79

$A_o = \beta z(1 - K_o)/(1 + 2\beta z)$ \hfill Eqn 80

$Cdo_e = 2h_c^2 \cdot a^2 \cdot K_0^2 \cdot r_{ho}/(\pi E_{oc}^2 \cdot (2 \cdot md_e \cdot k_B \cdot T)^{1.5})$ \hfill Eqn 81

$Cdo_h = 2h_c^2 \cdot a^2 \cdot K_0^2 \cdot r_{ho}/(\pi E_{oc}^2 \cdot (2 \cdot md_h \cdot k_B \cdot T)^{1.5})$ \hfill Eqn 82

$\tau_{z2} = 1/(((z+\beta z^2)^{0.5}) \cdot (1+2\beta z) \cdot ((1-A_0)^2 - B_o))$ \hfill Eqn 83 with:

$\tau_{doe} = Cdo_e \cdot \tau_{z2}$ = lifetime for deformation potential-electron scattering \hfill Eqn 84 and:

$\tau_{doh} = Cdo_h \cdot \tau_{z2}$ = lifetime for deformation potential-hole scattering \hfill Eqn 85

In the event that the thermoelectric material includes nanoparticles, the scattering of elections ($\tau_{ie}$) and holes ($\tau_{ih}$) by the nanoparticles can be determined using the following constants and expressions:

$\lambda_e$=Real Portion of: $((((2e^2 \cdot (2 \cdot md_e)^{1.5}/(e_0 \pi \cdot h_c^3)) \cdot (k_B T)^{0.5} \cdot (F_e + F_e^2 \beta)^{0.5} \cdot (1 + 2F_e \beta))^{-0.5})/10^{-9})$  Eqn 86

$\lambda_h$=Real Portion of: $((((2e^2 \cdot (2 \cdot md_h)^{1.5}/(e_0 \pi \cdot h_c^3)) \cdot (k_B T)^{0.5} \cdot (F_h + F_h^2 \beta)^{0.5} \cdot (1 + 2F_h \beta))^{-0.5})/10^{-9})$  Eqn 87

WF=300=work function of an inclusion, e.g. a ceramic inclusion

EE=4.76=electron affinity of host material $Vb_e = WF - EE + F_e \cdot (k_B T)/e_v$  Eqn 88

$Vb_h = WF - EE + F_h \cdot (k_B T)/e_v$  Eqn 89

$W_e = Vb_e \cdot R/\exp(-R/\lambda_e)$  Eqn 90

$W_h = Vb_h \cdot R/\exp(-R/\lambda_h)$  Eqn 91

W=10=fitting constant

U=0.3=volume % of nanoparticles

R=1.5=radius of nanoparticles in nm $Vr_e = W_e \cdot (1/l) \cdot \exp(-1/\lambda_e) \cdot e_v : V_e = Vr_e/e_v$  Eqn 92

$Vr_h = W_h \cdot (1/1) \cdot \exp(-1/\lambda_h) \cdot e_v : V_h = Vr_h/e_v$  Eqn 93

$a_e = \int\int_{R,0}^{\infty,W} \left(1 \cdot \sin\left(\frac{1t}{R}\right) v_{re}\right) d1 dt$  Eqn 94

$\alpha_e = (1/R^4) \cdot a_e$  Eqn 95

$a_h = \int\int_{R,0}^{\infty,W} \left(1 \cdot \sin\left(\frac{1t}{R}\right) v_{rh}\right) d1 dt$  Eqn 96

$\alpha_h = (1/R^4) \cdot a_h$  Eqn 97 with:

$\tau_{ie} = (k_B T)^{1.5} \cdot (z^{1.5} \cdot (1 + \beta z)^{1.5} \cdot 4R \cdot (2md_{e1})^{0.5})/((1+2\beta z) \cdot U \cdot 3\lambda_e)$=lifetime for nanoparticles-electron scattering  Eqn 98 and:

$\tau_{ih} = (k_B T)^{1.5} \cdot (z^{1.5} \cdot (1 + \beta z)^{1.5} \cdot 4R \cdot (2md_{h1})^{0.5})/((1+2\beta z) \cdot U \cdot 3\lambda_h)$=lifetime for nanoparticles-electron scattering  Eqn 99

Grain boundaries can naturally be a source of scattering, and the scattering of electrons ($\tau_{be2}$) and holes ($\tau_{bh2}$) can be determined using the following constants and expressions:

$e_b$=0.3 (values range from 0.003-0.3 with 0.3 corresponding to a very strong electrical conductivity)=Barrier height $d_1$=30=grain boundary constant $E_b = -e_b \cdot e_v$=grain boundary barrier energy height='$E_b$' in FIG. 3  Eqn 100

$DL = d_l 10^{-9}$=grain size='$L$' in FIG. 3  Eqn 101

$Gw = 5 \times 10^{-9}$=grain boundary width='$W$'=FIG. 3

$E = k_B T_z$  Eqn 102

$GN = 4(E/E_b) \cdot (1 - E/E_b)$  Eqn 103

$GD_e = ((2md_e \cdot E_b \cdot Gw^2/h_c^2) \cdot (1 - E/E_b))^{0.5}$  Eqn 104

$Z_e = (\exp(GD_e) - \exp(-GD_e))/2$  Eqn 105

$Z_{e1} = GD_e$  Eqn 106 with:

$\tau_{be2} = DL \cdot (md_e/(2 \cdot E))^{0.5} \cdot (1 + GN/(Z_{e1})^2)$=lifetime for grain boundary-electron scattering  Eqn 107 and:

$GN = 4 \cdot (E/E_b) \cdot (1 - E/E_b)$  Eqn 108

$GD_h = ((2 \cdot md_h \cdot E_b \cdot Gw^2/h_c^2) \cdot (1 - E/E_b))^{0.5}$  Eqn 109

$Z_h = (\exp(GD_h) - \exp(-GD_h))/2$  Eqn 110

$Z_{h1} = GD_h$  Eqn 111 with:

$\tau_{bh2} = DL \cdot (md_h/(2E))^{0.5} \cdot (1 + GN/(Z_{h1})^2)$=lifetime for grain boundary-hole scattering  Eqn 112

Though not required, interfacial surface roughness scattering of an inclusion particle can be considered with such scattering of electrons ($\tau_{ifre}$) and holes ($T_{ifrh}$) determined by the following constants and expressions:

d=1=roughness height in nm $c_1$=2.4=correlation length in nm $\lambda = c_1 \times 10^{-9}$  Eqn 113

$\delta = d \times 10^{-9}$  Eqn 114

$\epsilon_0 = 8.85 \times 10^{-12}$

For holes:

$h_{WL} = 11.4 \times 10^{-9}$=hole constant $Ns_h = 10^{18}$=carrier concentration $k_h = 2\pi/h_{WL}$=counting constant for phonon energy  Eqn 115

$K_h = 2k_h$  Eqn 116

$\epsilon_s$=400=high frequency dielectric constant $b_h = (6 \cdot 2md_h \cdot e^2 \cdot Ns_h/(h_c^2 \cdot \epsilon_s \cdot \epsilon_o))^{0.333}$  Eqn 117

$fz_h = (0.5 \cdot b_h^3 \cdot z^2)^{0.5} \cdot \exp(-0.5 b_h z)$  Eqn 118

$fzq_h = (0.5 \cdot b_h^3 \cdot z_q^2)^{0.5} \cdot \exp(-0.5 b_h z_q)$  Eqn 119

$Fq_h = \int\int_{0,0}^{10^9, 10^9} ((fz_h^2 \cdot \exp(-z \cdot q) \cdot fzq_h^2 \cdot \exp(z_q q) dz \cdot dz_q)$  Eqn 120

$qs_h = (e^2 \cdot md_h/(h_c^2 \cdot 2\pi \cdot \epsilon_s \cdot \epsilon_o)) \cdot Fq_h$  Eqn 121

-continued $$J_h = \int_0^{K_h} \frac{(-q^2\lambda^4/4) \cdot q^4}{2k_h^3(q+qs_h)^2 \sqrt{\left(1-\left(\frac{q}{2k_h}\right)\right)^2}} dq \quad \text{Eqn 122}$$

$W_{ifrh} = ((e^2 \cdot Ns_h \cdot \delta \cdot \lambda/(2\epsilon_s \cdot \epsilon_o))^2 \cdot md_h \cdot J_h/h_c^3)$  Eqn 123

$\tau_{ifrh} = 1/wifr_h$ = lifetime for roughness-hole scattering  Eqn 124 and for electrons:

$e_{WL} = 11.4 \times 10^{-9}$ = electron constant $Ns_e = 10^{18}$ = carrier concentration $k_e = 2\pi/e_{WL}$  Eqn 125

$K_e = 2k_e$  Eqn 126

$\epsilon_s = 400$ = high frequency dielectric constant $b_e = (6 \cdot 2md_e \cdot e^2 \cdot Ns_e/(h_c^2 \cdot \epsilon_s \cdot \epsilon_o))^{0.333}$  Eqn 127

$fz_e = (0.5 \cdot b_e^3 \cdot z^2)^{0.5} \cdot \exp(-0.5 b_e z)$  Eqn 128

$fzq_e = (0.5 \cdot b_e^3 \cdot z_q^2)^{0.5} \cdot \exp(-0.5 b_e z_q)$  Eqn 129

$$Fq_e = \int\int_{0,0}^{10^9,10^9} ((fz_e^2 \cdot \exp(-z \cdot q) \cdot fzq_e^2 \cdot \exp(z_q q)) dz \cdot dz_q \quad \text{Eqn 130}$$

$qs_e = (e^2 \cdot md_e/(h_c^2 \cdot 2\pi \cdot \epsilon_s \cdot \epsilon_o)) \cdot Fq_e$  Eqn 131

$$J_e = \int_0^{K_e} \frac{\exp(-q^2\lambda^4/4) \cdot q^4}{2k_e^3(q+qs_e)^2 \sqrt{\left(1-\left(\frac{q}{2k_e}\right)\right)^2}} dq \quad \text{Eqn 132}$$

$W_{ifre} = ((e^{2 \cdot Ns}_e \cdot \delta \cdot \lambda/(2\epsilon_s \cdot \epsilon_o))^2 \cdot md_e \cdot J_e/h_c^3)$  Eqn 133

$\tau_{ifre} = 1/w_{ifre}$ = lifetime for roughness-electron scattering  Eqn 134

Thus the total scattering for electrons ($\tau_{ze}$) and holes ($\tau_{zh}$) can be obtained from:

$\tau_{ze} = 1/(1/\tau_{doe} + 1/\tau_{dae} + 1/\tau_{poe} + 1/\tau_{be2} + 1/\Gamma_{ie} + 1/\tau_{ifre})$ = total lifetime for electron scattering  Eqn 135

$\tau_{zh} = 1/(1/\tau_{doh} + 1/\tau_{dah} + 1/\tau_{poh} + 1/\tau_{bh2} + 1/\Gamma_{ie} + 1/\tau_{ifrh})$ = total lifetime for hole scattering  Eqn 136

Once the scattering terms have been determined, electrical conductivity ($C_e$, $C_h$), Seebeck coefficient ($S_e$, $S_h$) can be determined for the given grain size and grain boundary energy barrier height using the following expressions. In particular, $C_e$ and $C_h$ can be determined from:

$c_e = (e^2/(3\pi^2 \cdot h_c^3 \cdot m_{ce})) \cdot (2 \cdot m_{de} k_B T)^{1.5}$  Eqn 137

$$C_e = c_e \cdot \int_{-F_e}^{\infty} \frac{(z+\beta z^2)^{1.5} \cdot \tau_{ze} \cdot \frac{d(1/(1+\exp(z-F_e))}{dz}}{(1+2\beta z^2)} dz \quad \text{Eqn 138}$$

$c_h = (e^2/(3\pi^2 \cdot h_c^3 \cdot m_{ch})) \cdot (2 \cdot m_{dh} k_B T)^{1.5}$  Eqn 139

$$C_h = c_h \cdot \int_{-F_h}^{\infty} \frac{(z+\beta z^2)^{1.5} \cdot \tau_{zh} \cdot \frac{d(1/(1+\exp(z-F_h))}{dz}}{(1+2\beta z)} dz \quad \text{Eqn 140}$$

and the total electrical conductivity (C) is simply:

$C = (C_e + C_h)$  Eqn 141

Also, $S_e$ and $S_h$ can be determined by:

$$S_e = -(k_B/e) \cdot \frac{\int_{F_e}^{\infty} \frac{(z+\beta z^2)^{1.5} \cdot \tau_{ze} \cdot \frac{d\left(\frac{1}{1+\exp(z-F_e)}\right)}{dz} \cdot (z-F_e)}{(1+2\beta z)} dz}{\int_{-F_e}^{\infty} \frac{(z+\beta z^2)^{1.5} \cdot \tau_{ze} \cdot \frac{d\left(\frac{1}{1+\exp(z-F_e)}\right)}{dz}}{(1+2\beta z)} dz} \quad \text{Eqn 142}$$

$$S_h = -(k_B/e) \cdot \frac{\int_{F_h}^{\infty} \frac{(z+\beta z^2)^{1.5} \cdot \tau_{zh} \cdot \frac{d(1/(1+\exp(z-F_h))}{dz} \cdot (F_h-z)}{(1+2\beta z)} dz}{\int_{-F_h}^{\infty} \frac{(z+\beta z^2)^{1.5} \cdot \tau_{zh} \cdot \frac{d(1/(1+\exp(z-F_h))}{dz}}{(1+2\beta z)} dz} \quad \text{Eqn 143}$$

and the total Seebeck coefficient (S) is simply:

$S = (S_e \cdot C_e + S_h \cdot C_h)/C$  Eqn 144

It is appreciated that the power factor (P) is given by:

$P = S^2 \cdot C$  Eqn 145

Also, it should be appreciated that the preceding constants and expressions afford for the calculation of electrical conductivity and Seebeck coefficient as a function of grain size, grain boundary width and/or grain boundary barrier height. Naturally, certain constants would be assumed and varied as needed. For example, the temperature (T) for the calculations used to produce FIGS. 3 and 7 was 300° C., however, the temperature could be varied to determine the effect of temperature on C and S. Also, the size/radius, volume percent, fitting constants, etc., of any inclusions, nanoparticles, etc., can be varied to determine their effect on calculated results.

Regarding thermal conductivity of the material, it is appreciate that additional expressions and scattering terms are needed. For example, Lorentz numbers for electrons ($L_e$) and holes ($L_h$) are useful and can be obtained from the following expressions:

$$L_e = $$ Eqn 146

$$\left( \left( \frac{\frac{C_e}{C} \int_{-F_e}^{\infty} \frac{(z+\beta z^2)^{1.5} \cdot \tau_{ze} \cdot z^2 \cdot \frac{d\left(\frac{1}{1+\exp(z-F_e)}\right)}{dz}}{(1+2\beta z)} dz}{\int_{-F_e}^{\infty} \frac{(z+\beta z^2)^{1.5} \cdot \tau_{ze} \cdot \frac{d\left(\frac{1}{1+\exp(z-F_e)}\right)}{dz}}{(1+2\beta z)} dz} \right) - \left( \frac{\int_{-R_e}^{\infty} \frac{(z+\beta z^2)^{1.5} \cdot \tau_{ze} \cdot z \cdot \frac{d(1/(1+\exp(z-F_e)))}{dz}}{(1+2\beta z)} dz}{\int_{-F_e}^{\infty} \frac{(z+\beta z^2)^{1.5} \cdot \tau_{ze} \cdot \frac{d(1/(1+\exp(z-F_e)))}{dz}}{(1+2\beta z)} dz} \right)^2 \right)$$

and $$L_h = $$ Eqn 147

$$\left( \left( \frac{\frac{C_h}{C} \int_{-F_h}^{\infty} \frac{(z+\beta z^2)^{1.5} \cdot \tau_{zh} \cdot z^2 \cdot \frac{d\left(\frac{1}{1+\exp(z-F_e)}\right)}{dz}}{(1+2\beta z)} dz}{\int_{-F_e}^{\infty} \frac{(z+\beta z^2)^{1.5} \cdot \tau_{zh} \cdot \frac{d\left(\frac{1}{1+\exp(z-F_e)}\right)}{dz}}{(1+2\beta z)} dz} \right) - \left( \frac{\int_{-F_h}^{\infty} \frac{(z+\beta z^2)^{1.5} \cdot \tau_{zh} \cdot z \cdot \frac{d(1/(1+\exp(z-F_e)))}{dz}}{(1+2\beta z)} dz}{\int_{-F_h}^{\infty} \frac{d(1/(1+\exp(z-F_e)))}{(1+2\beta z)} dz} \right)^2 \right)$$

and $L_b = (e/k_B)^2 \cdot C_e \cdot C_h \cdot (S_e - S_h)^2 / C^2 =$ bipolar Lorentz number  Eqn 148 which afford for the electronic thermal conductivity ($K_e$) to be calculated from:

$K_e = T \cdot C \cdot (k_B^2/e^2) \cdot (L_e + L_h + L_b)$  Eqn 149

As such, the electronic thermal conductivity as a function of grain size can be calculated and plotted as shown in FIG. 5.

Regarding lattice thermal conductivity, the following constants and expressions are useful:

$K_0 = 0.1 e_v =$ phonon energy  Eqn 150

$L_{EO} = 1 \times 10^{-3} =$ grain size parameter of sample $B_u = 10.9 \times 10^{-18} =$ Umpklamp scattering constant $n = 5.2 =$ fitting parameter $B_n = 42 \times 10^{-24} =$ normal scattering constant $A = 1.9 \times 10^{-42} =$ alloy scattering constant $E_d = 25 e_v$  Eqn 151

$v = 3000 =$ sound velocity $\theta_d = 164.9 =$ Debye temperature $Q = \theta_d / T$  Eqn 152

$U = 0.3 =$ volume % of particles $r = 1.5 =$ radius of particles in nm $A_1 = r^2 / 1^2$  Eqn 153

$B_1 = 1^2 / r$  Eqn 154

$m = -0.925 =$ mass constant $k = 0.3 =$ spring constant $q = 80 =$ fitting parament $r_1 = (\alpha^2/4) \cdot m^2 + 3 \cdot (\alpha^8) \cdot (k^2) \cdot (\sin(\alpha \cdot q\_/2))^4 / ((\alpha \cdot q\_/2)^4)$  Eqn 155

$r_2 = 3.14 \cdot (\cos(4r \cdot q) - 1 + (4r \cdot q) \cdot \sin(4r \cdot q) + 32(r \cdot q)^4 - 8(r \cdot q)^2)/(16(r \cdot q)^6)$  Eqn 156

$\sigma\_{ray} = (r \cdot q)^4 \cdot r_1 \cdot r_2$  Eqn 157

$\alpha = 1/\sqrt{2} =$ trigonometric ratio $q\_ = 0.1 =$ wave vector parameter $X = (\sqrt{1+m} \cdot \sqrt{1+k}) - 1$  Eqn 158

$\sigma\_{ng} = 2 \cdot (1 - \sin(2 \cdot r \cdot q \cdot X)/(r \cdot q \cdot X) + \sin(r \cdot q \cdot X) \cdot \sin(r \cdot q \cdot X) / ((r \cdot q \cdot X)^2))$  Eqn 159

$\sigma\_{total} = 1/((1/\sigma\_{ray}) + (1/\sigma\_{ng}))$  Eqn 160

$$\eta_1 = \frac{U(3 \times 10^{27})}{4\pi \int_0^\infty \frac{\Gamma^3 \Gamma^{(A1-1)} \exp\left(\frac{-1}{B_1}\right)}{B_1^{A1} \Gamma(A_1)} dr}$$  Eqn 161 which afford for grain boundary scattering ($t\_B$), Umpklamp scattering ($t\_U$), normal scattering ($t\_N$), alloy scattering ($t\_A$) and nanoparticle scattering ($t\_D$) to be determined from the following expressions:

$t\_B = v/L_{EO}$ = total lifetime for phonon and boundary scattering  Eqn 162

$t\_U = B_u \cdot s^2 \cdot k_B^2 \cdot T^3 \cdot \exp(-\theta_d/(n \cdot T))/h_c^2$ = total lifetime for phonon- and UmKlapp scattering  Eqn 163

$t\_N = B_n \cdot s^2 \cdot k_B^2 \cdot T^5/h_c^2$ = total lifetime for phonon- and Normal scattering  Eqn 164

$t\_A = A \cdot s^4 \cdot k_B^4 \cdot T^4/h_c^4$ = total lifetime for phonon- and alloy scattering  Eqn 165

$$t\_D = v\eta_1(1/(\pi(A_1 \cdot B_1)^2)) \cdot (1 \times 10^{-18}) \cdot \int_0^\infty \pi^2 r^4 \sigma\_{total} \cdot r^{(A1-1)} \cdot \exp\frac{(-r/B_1)}{B_1^{A1}\Gamma(A_1)} dr =$$

total lifetime for phonon- and nanoparticle scattering  Eqn 166

For grain boundary scattering:

$D_L = 30 \times 10^{-9}$ = grain size $FT_1 = 0.8$ = fitting parameter $FT_2 = 10^{15}$ = fitting parameter $\epsilon = 0.1$ = fitting parameter $t_{ref} = (D_L/v) \cdot FT_1$ = total lifetime for phonon- and reflection type scattering  Eqn 167

$t_{diff} = (D_L/v) \cdot (k_B \cdot \theta_d/K_0) \cdot 1/\eta$ = total lifetime for phonon- and diffraction type scattering  Eqn 168

$t_{ray} = (v/D_L)^3 \cdot (\theta_d \cdot h_c/(T \cdot K_0))^4 \cdot FT_2$ = total lifetime for phonon- and Rayleigh type scattering  Eqn 169 and $t\_{Bn} = 1/t_{ref} + 1/t_{diff} + 1/t_{ray}$  Eqn 170

If surface roughness scattering is to be considered, the following constants and expressions can be included in a calculation:

n=1

$W_L = 3 \cdot 10^{-9}$ = grain boundary width $k = 2\pi/W_L$  Eqn 171

$dw_{AB} = 9.69 \times 10^{12}$ = used/calculated for BiTe/SiO$_2$ $h_{cw} = 0.0024 \cdot e_v$ $u_1 = 1730$ = constant for BiTe $\lambda = c_1 \cdot 10^{-9}$  Eqn 172

$\delta = d \cdot 10^{-9}$  Eqn 173

$W_{w1} = 2 = 1^{st}$ grain boundary thickness value/parameter $L_1 = w_{w1} \cdot 10^{-9}$  Eqn 174

$q_{z1} = n \cdot \pi/L_1$  Eqn 175

$w_{w2} = 5 = 2^{nd}$ grain boundary thickness value/parameter $L_2 = W_{w2} \cdot 10^{-9}$  Eqn 176

$q_{z2} = n \cdot \pi/L_2$  Eqn 177

$w_{w3} = 10 = 3^{rd}$ grain boundary thickness value/parameter $L_3 = W_{w3} \cdot 10^{-9}$  Eqn 178

$q_{z3} = n \cdot \pi/L_3$  Eqn 179

$Z_p = \int_0^{6.28}((1-\cos(\theta))(\cos(\theta))^2 \exp(-k^2\lambda^2(\sin(\theta/2))^2)d\theta$  Eqn 180

And interface roughness scattering:

$\alpha_1 = (1-(q_{z1}^2-k^2)/(q_{z1}^2+k^2) \cdot \sin(2q_{z1}\delta)/(2q_{z1}\delta))^*(\delta/L_1)$  Eqn 181

$\tau_{ifr\_1} = (dw_{AB})^2 \cdot (h_{cw}/h_c) \cdot \lambda^2 \cdot \alpha_1^2 \cdot Z_p/(2u_1^2)$ = lifetime for roughness and phonon scattering  Eqn 182

$t\_c = t\_U + t\_N + t\_A + t\_D + t\_{Bn} + \tau_{ifr\_1}$ = total lifetime of phonon scattering  Eqn 183

$t_c = 1/t\_c$  Eqn 184

$t_N = 1/t\_N$  Eqn 185 and the Lorentz numbers can be calculated from:

$$L_1 = \int_0^Q (t_c \cdot s^4 \cdot \frac{\exp(s)}{(\exp(s)-1)^2}ds$$  Eqn 186

$$L_2 = \int_0^Q (t_c \cdot s^4 \cdot \frac{\exp(s)}{t_N(\exp(s)-1)^2}ds$$  Eqn 187

$$L_3 = \int_0^Q (1-t_c/t_N) \cdot s^4 \cdot \frac{\exp(s)}{t_N(\exp(s)-1)^2}ds$$  Eqn 188 which affords for the lattice contribution to the thermal conductivity to be determined from the following expression:

$K_1 = (k_B^4 \cdot T^3/(2\pi^2 \cdot v \cdot h_c^3)) \cdot (L_1 + L_2^2/L3)$  Eqn 189

As such, the lattice thermal conductivity ($K_1$) can be calculated as a function of grain size and plotted as shown in FIG. 5. Furthermore, the total thermal conductivity ($K_e + K_1$) can be determined/calculated and plotted as shown in FIG. 6.

Finally, the figure of merit as a function of grain size can be determined as a function of grain size and plotted as shown in FIG. 9. Furthermore, and as shown in FIG. 9, ZT for various values of grain boundary barrier height and/or inclusion of a nanocomposite particle can be calculated and plotted.

$$ZT = S^2 \cdot T \cdot C/(K_1 + K_e) = \frac{S^2 T}{\rho(k_{el} + k_{ph})}$$  Eqn 190

Naturally, the calculation of ZT would be repeated for various values of matrix grain size, grain boundary barrier height, grain boundary width, nanoparticle, nanoparticle amount and/or nanoparticle size that were desired to be examined. Also, such calculations would be performed by a computer such as the one illustratively shown in FIG. 18.

It is appreciated that the process of calculating the thermal conductivity and electrical resistivity for a given nanocomposite material system as a function of material compositions affords for the calculation of figure of merit values as a function of the compositions. In this manner, researchers can estimate which matrix/host-nanoparticle/interface roughness systems are more likely to exhibit relatively high ZT values and/or which compositions, range of compositions or range of interfacial roughness within a particular system may provide the highest ZT values. This range of compositions and/or interfacial roughness with the associated high ZT values can also be compared with other material properties such as mechanical property data, chemical property data and the like, in order to choose an optimum nanocomposite thermoelectric material composition and/or nanoparticle surface roughness for a given application. As such, the process provides a valuable tool to guide experimental design of thermoelectric materials.

The plurality of material compositions to be investigated can include a first component with a volume fraction of a second component ranging from 0.0 to 1.0. In some instances, the material compositions to be investigated can include the first component with a volume fraction of the second component ranging from 0.0 to 0.7. The plurality of thermal conductivity values are calculated as a function of the scattering cross section of the second component nanoparticles and/or matrix/nanoparticles interface roughness for the plurality of material compositions being investigated. In addition, the scattering cross section can be a function of the interfacial surface area of the second component nanoparticles for the plurality of material compositions being investigated. The function of the plurality of material compositions being investigated can include the size of the second component nanoparticles, the size distribution of the second component nanoparticles and an interfacial property of the second component nanoparticles. In some instances, an interfacial interaction property between the second component nanoparticles and the first component can be used.

It is appreciated that the thermoelectric device can be designed and developed using the process disclosed herein, the thermoelectric device having a first electrical contact, a second electrical contact, and a thermoelectric bulk material located within an electrical path between the first electrical contact and the second electrical contact. The thermoelectric bulk material can include a first powdered component having a particulate form, the first powdered component being electrically conducting, and a second powdered component having a particulate form, the second powdered component having an electrical conductivity substantially less than the first powdered component. The first and second powdered components can retain the particulate form in the bulk thermoelectric material and the thermoelectric bulk material can be a composite that has nanostructures of the first powdered component. The first component can be a metal or a semiconductor. The second component can be an electrical insulator in the form of a ceramic. It is appreciated that the process can also be used for semiconductor-metal and semiconductor-semiconductor thermoelectric material systems.

For example, the process disclosed herein was used to design and produce a novel thermoelectric material with an improved ZT as discussed below. In particular, the process guided utilization of phonon scattering via inclusion of nanoparticles into a thermoelectric matrix to reduce phonon thermal conductivity, and also hybridization of the matrix with surface roughness modification to alter heat flow, and therein the power factor.

Figure 17:
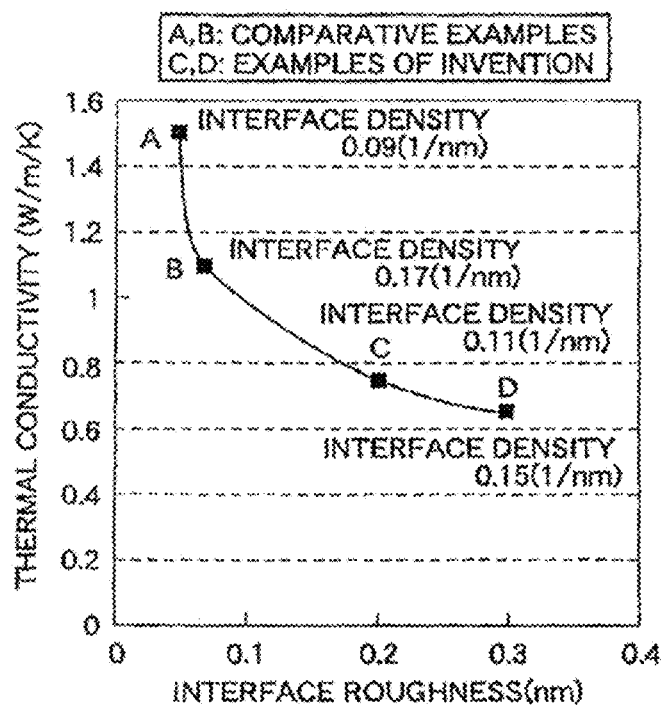
FIG. 17 is a graph showing a relation between interface roughness and a thermal conductivity ($\kappa$) in each of nanocomposite thermoelectric conversion materials in an embodiment of the invention and comparative examples.
Figure 18:
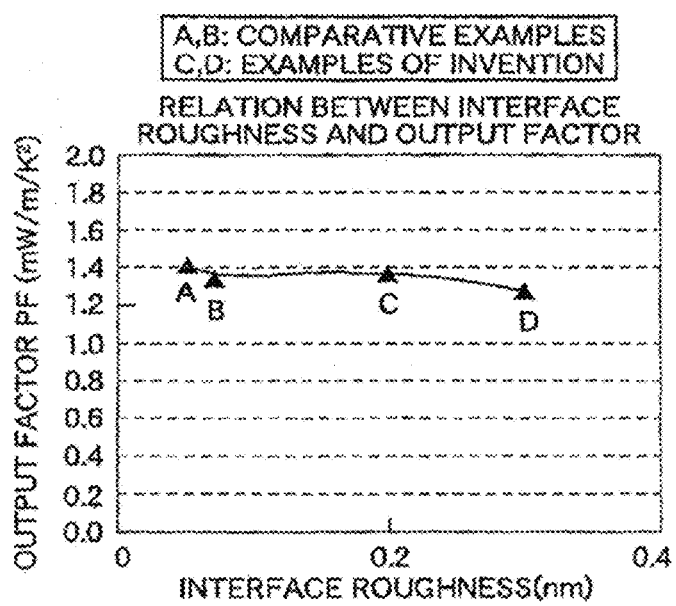
FIG. 18 is a graph showing a relation between the interface roughness and an output factor (Pf) in each of the nanocomposite thermoelectric conversion materials in the embodiment of the invention and the comparative examples.
Figure 19:
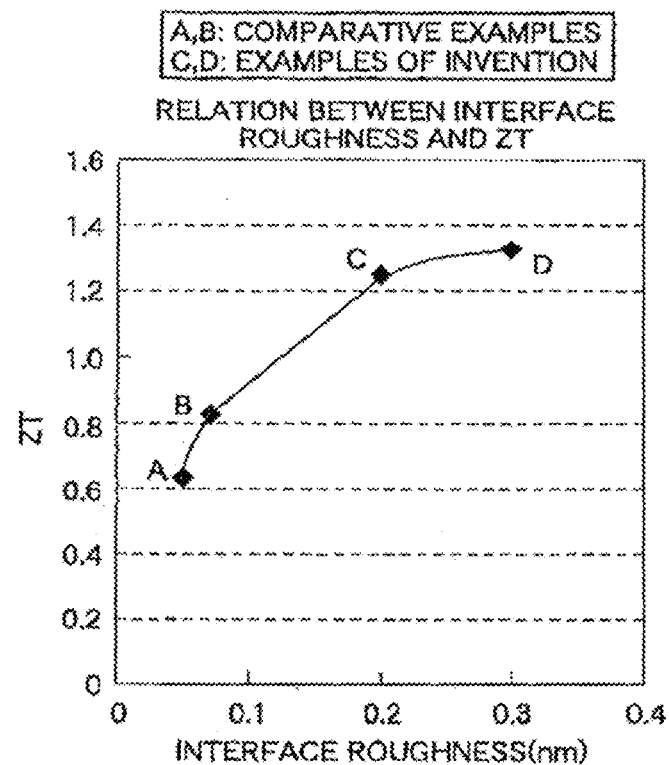
FIG. 19 is a graph showing a relation between the interface roughness and ZT (nondimensional performance index) in each of the nanocomposite thermoelectric conversion materials in the embodiment of the invention and the comparative examples.

As shown in FIG. 17, in each nanocomposite thermoelectric conversion material according to an embodiment of the invention (labels 'C' and 'D'), roughness of an interface between a matrix of the thermoelectric conversion material and nanoparticles of a dispersed material is equal to or larger than 0.1 nm. The nanocomposite thermoelectric conversion material in the embodiment of the invention has a thermal conductivity lower than the thermal conductivity of a nanocomposite thermoelectric conversion material in which the interface roughness is smaller than 0.1 nm in each comparative example (labels 'A' and 'B'). For example, the thermal conductivity of the nanocomposite thermoelectric conversion material in the embodiment of the invention is lower than 1 W/m/K. As shown in FIG. 18, in the thermoelectric conversion material in which the nanoparticles of the dispersed material are dispersed in the matrix, an output factor Pf is not influenced by the interface roughness. For example, the output factor Pf is substantially constant in a range of 1.3 to 1.4 mW/m/K$^2$. As shown in FIG. 19, it is evident that each nanocomposite thermoelectric conversion material in the embodiment of the invention has a nondimensional performance index ZT larger than the nondimensional performance index ZT of the nanocomposite thermoelectric conversion material in which the interface roughness is small in each comparative example. For example, the nondimensional performance index ZT of the nanocomposite thermoelectric conversion material in the embodiment of the invention is equal to or larger than 1.3.

Figure 20:
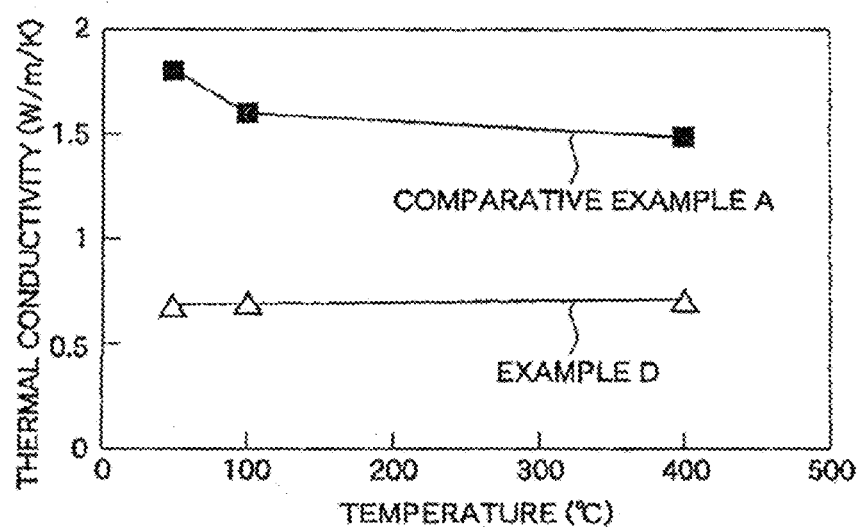
FIG. 20 is a graph showing a change in the thermal conductivity (κ) according to temperature, in each of nanocomposite thermoelectric conversion materials in the embodiment of the invention and the comparative example.
Figure 21:
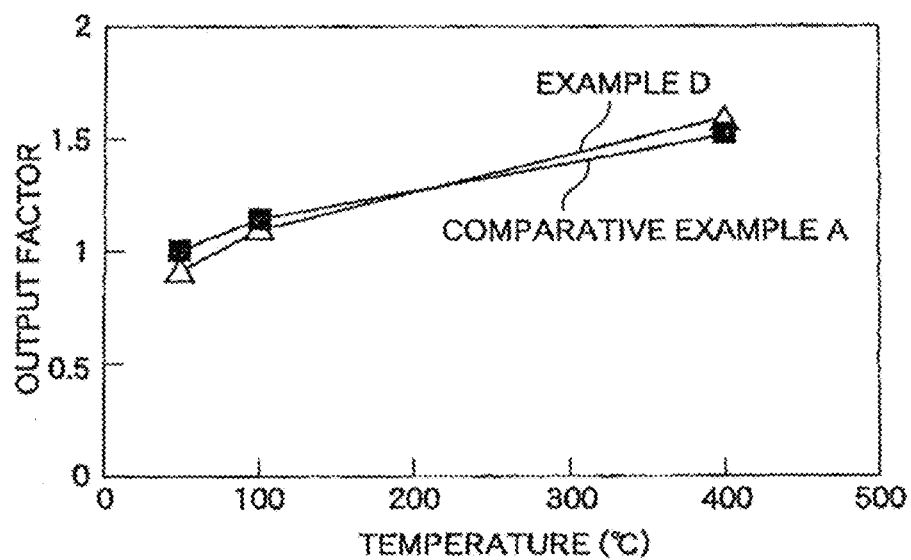
FIG. 21 is a graph showing a change in an output factor (P according to temperature, in each of nanocomposite thermoelectric conversion materials in the embodiment of the invention and the comparative example.
Figure 22:
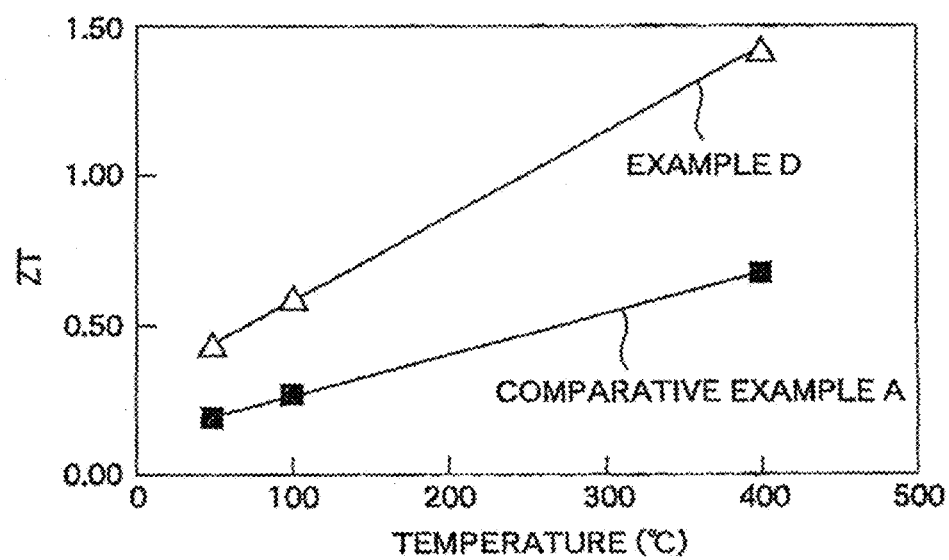
FIG. 22 is a graph showing a change in ZT (the nondimensional performance index) according to temperature, in each of nanocomposite thermoelectric conversion materials in the embodiment of the invention and the comparative example.

As shown in FIG. 20, in the nanocomposite thermoelectric conversion material in the embodiment of the invention, temperature dependence of the thermal conductivity is low, as compared to the nanocomposite thermoelectric conversion material in which the interface roughness is small in the comparative example. For example, the thermal conductivity of the nanocomposite thermoelectric conversion material in the embodiment is substantially constant in a temperature range of room temperature to 400° C. As shown in FIG. 21, in the nanocomposite thermoelectric conversion material in the embodiment of the invention, the output factor gradually increases as the temperature increases, as in the nanocomposite thermoelectric conversion material in which the interface roughness is small in the comparative example. As shown in FIG. 22, in the nanocomposite thermoelectric conversion material in the embodiment of the invention, the nondimensional performance index ZT increases as the temperature increases, as in the nanocomposite thermoelectric conversion material in which the interface roughness is small in the comparative example. It is evident that the nondimensional performance index ZT of the nanocomposite thermoelectric conversion material in the embodiment is larger than the nondimensional performance index ZT of the nanocomposite thermoelectric conversion material in the comparative example.

Figure 23:
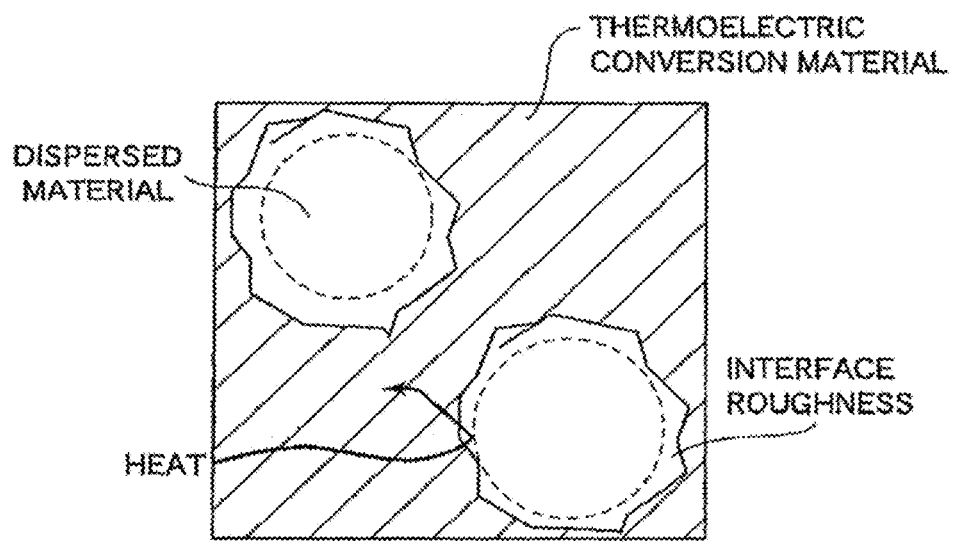
FIG. 23 is a schematic conceptual diagram showing the nanocomposite thermoelectric conversion material in the embodiment of the invention.
Figure 24:
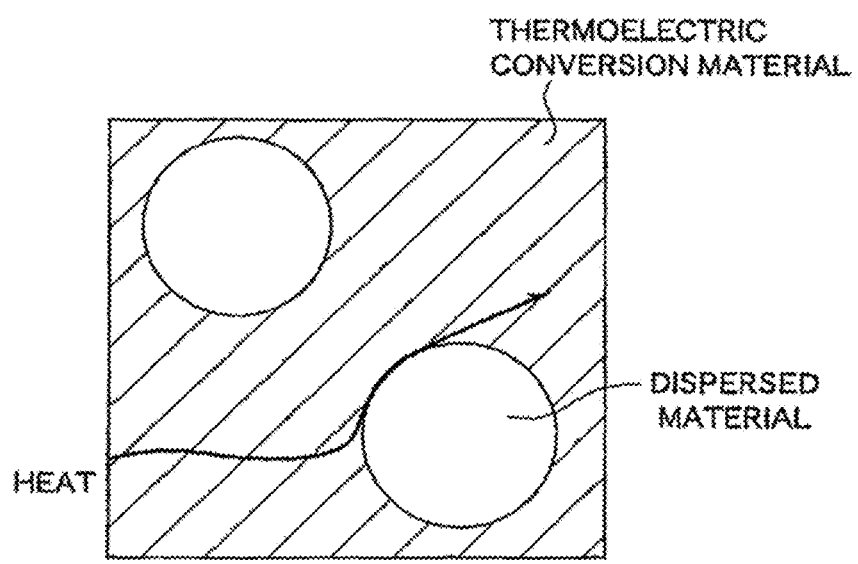
FIG. 24 is a schematic conceptual diagram showing the nanocomposite thermoelectric conversion material in the comparative example.

FIGS. 23 and 24 are conceptual schematic diagrams showing the difference between the effect of the large interface roughness in an embodiment of the present invention (FIG. 23) and the effect of the small interface roughness in a comparative example (FIG. 24). Not being bound by theory, it is considered as follows. In the nanocomposite thermoelectric conversion material in the embodiment of the invention, heat is scattered by protruding portions of surfaces of the nanoparticles that have the large interface roughness, and this interferes with heat conduction, as shown in FIG. 23 by the arrow labeled 'HEAT'. In contrast, FIG. 24 illustrates that in the nanocomposite thermoelectric conversion material in the comparative example, heat transfers without being scattered by the surfaces of the nanoparticles with the small interface roughness to the same extent as illustrated in FIG. 23, and thus, heat conduction is good, as shown in the figure. Stated differently, it is considered that because heat is scattered by the surfaces of the nanoparticles having large interfacial roughness, the thermal conductivity is low in the nanocomposite thermoelectric conversion material in which the roughness of the interface between the matrix of the thermoelectric conversion material and the dispersed material is equal to or larger than 0.1 nm.

Figure 25:
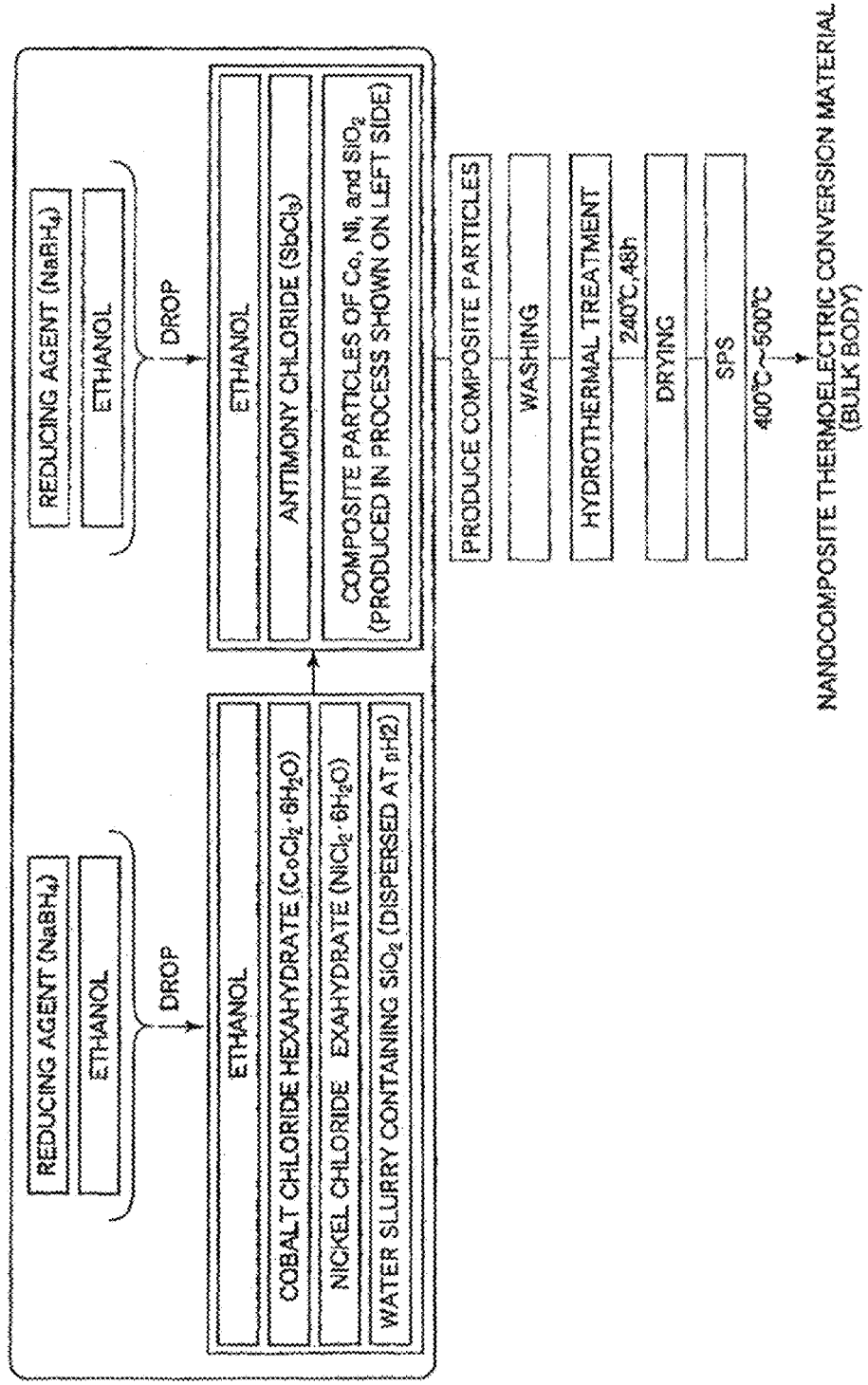
FIG. 25 shows a flowchart of a first production method in the embodiment of the invention.

Turning now to FIG. 25, a first production method according to an embodiment of the invention is illustrated. In particular, the first production method takes a reducing agent ($NaBH_4$) (mixed with ethanol) and drops it into ethanol to which cobalt chloride hexahydrate ($CoCl_2.6H_2O$), nickel chloride hexahydrate ($NiCl_2.6H_2O$), and water slurry containing the dispersed material ($SiO_2$) have been added. Cobalt chloride hexahydrate ($CoCl_2.6H_2O$) is a salt of a first source material of the thermoelectric conversion material. It is appreciated that nickel chloride hexahydrate ($NiCl_2.6H_2O$) makes the thermoelectric conversion material n-type. As a result, first composite particles are produced. In the first composite particles, the dispersed material ($SiO_2$), on the surface of which water exists, is dispersed in the first source material (containing Co and Ni due to reduction) (the first step).

Next, the reducing agent ($NaBH_4$) (mixed with ethanol) is dropped into ethanol to which the first composite particles and salt ($SbCl_3$) of a second source material of the thermoelectric conversion material have been added. As a result, the thermoelectric conversion material, in which the dispersed material is dispersed in a compound of the first source material and the second source material, is produced (the second step). By performing the first step and the second step, it is possible to produce, by liquid phase synthesis, the nanocomposite thermoelectric conversion material in which the dispersed material is dispersed in the matrix of the thermoelectric conversion material, and the roughness of the interface between the matrix and the nanoparticles of the dispersed material is equal to or larger than 0.1 nm. In the second step, it is considered that when the produced first composite particles and the salt ($SbCl_3$) of the second source material of the thermoelectric conversion material are added to ethanol, the particles of the first source material are dissolved by $SbCl_3$ that is strong acid, and the reduced compound of the first source material and the second source material is produced using the reducing agent.

Figure 26:
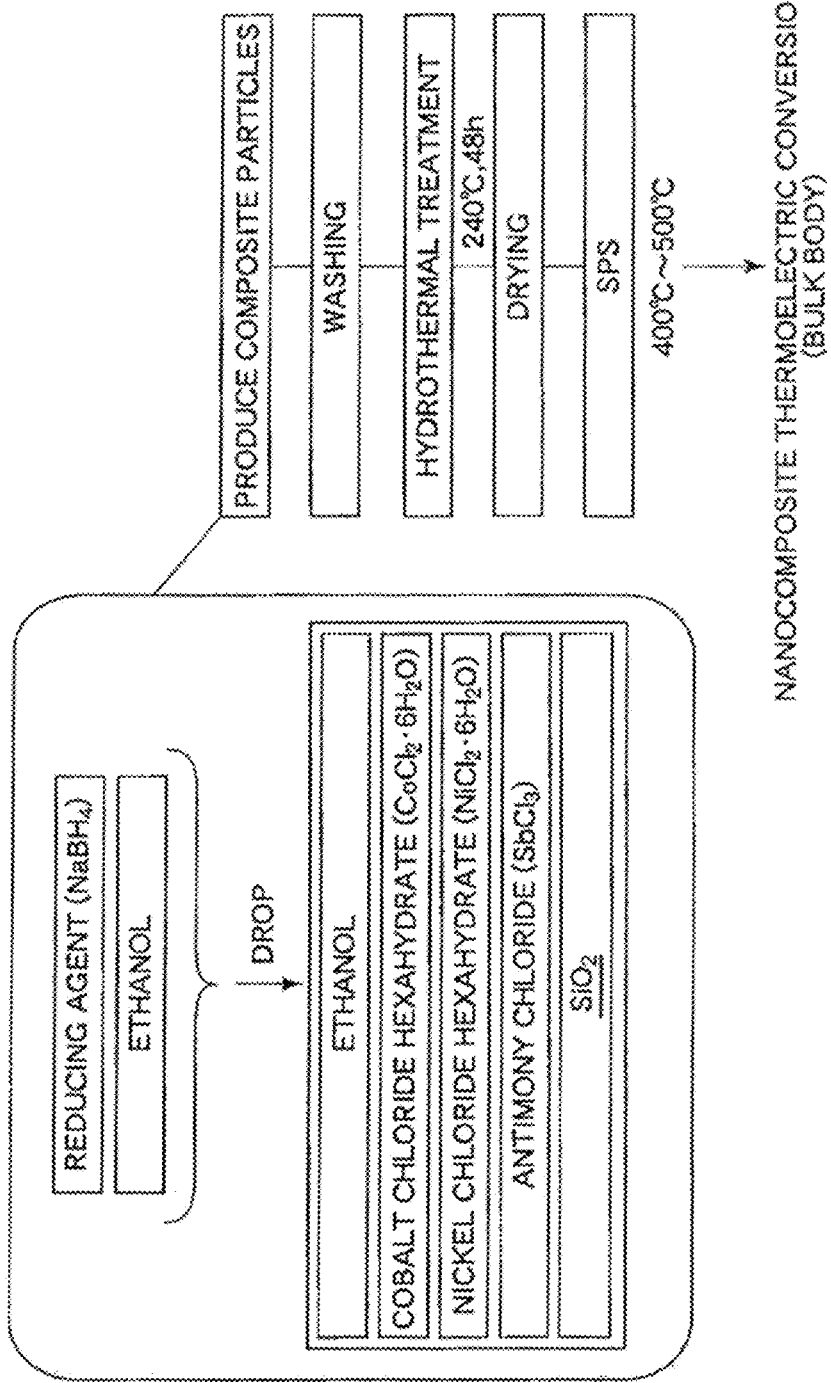
FIG. 26 shows a flowchart of a comparative example of the first production method according to the invention.

In the above-described embodiment, the water slurry containing the dispersed material needs to be used as the dispersed material, and the first composite particles, in which the dispersed material ($SiO_2$) on the surface of which water exists is dispersed in the first source material, needs to be produced by dropping the reducing agent. If the reducing agent is not dropped, and accordingly the first composite particles, in which the dispersed material ($SiO_2$) is dispersed in the first source material, is not produced, when the reducing agent is dropped into the solvent containing water, the salt of the first source material, and the salt of the second source material in the second step, antimony oxychloride is produced from $SbCl_3$. As a result, the desired thermoelectric conversion material is not produced. Also, in the above-described embodiment, if the water slurry containing the dispersed material is not used as the dispersed material, and the reducing agent is dropped into the solvent containing the salt of the first source material and the salt of the second source material in only one step as shown in FIG. 26, the nanocomposite thermoelectric conversion material with almost no surface roughness is produced.

Figure 27:
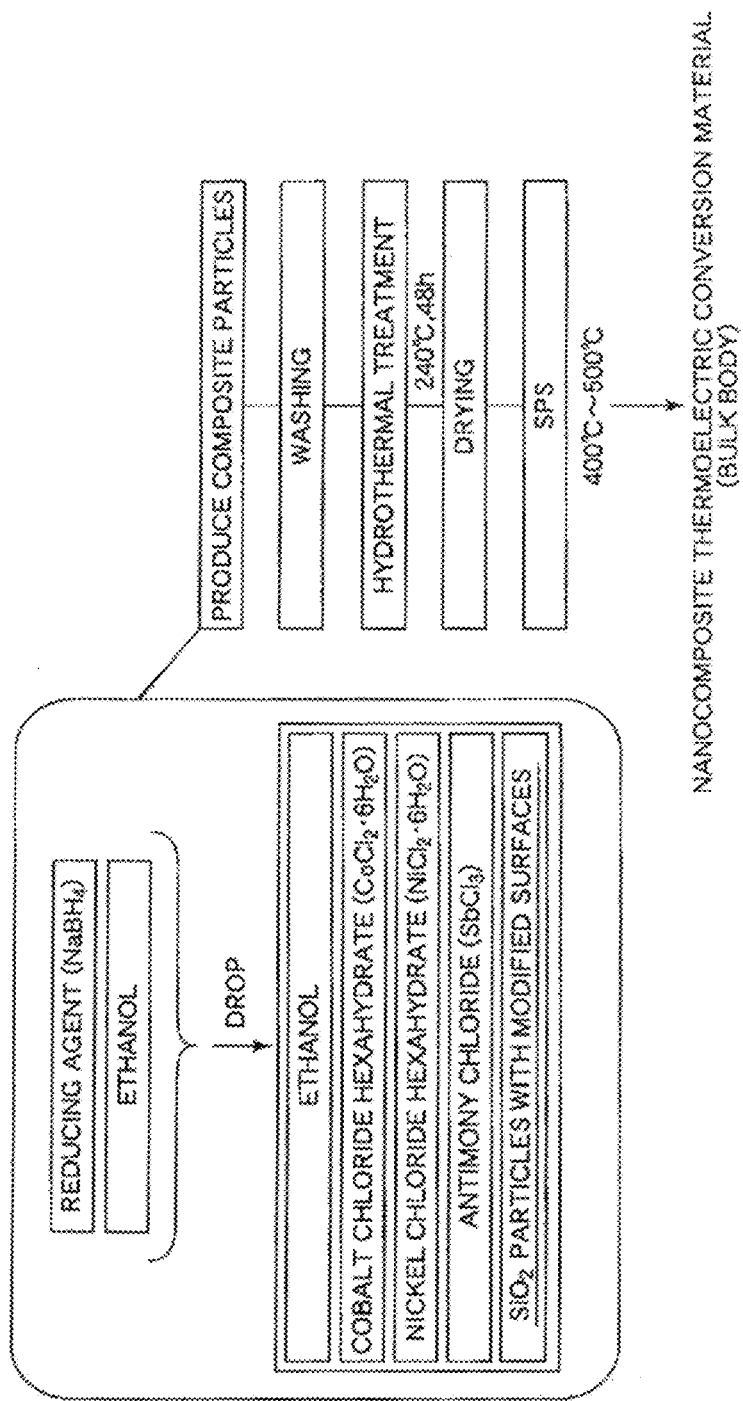
FIG. 27 shows a flowchart of a second production method in the embodiment of the invention.
Figure 28:
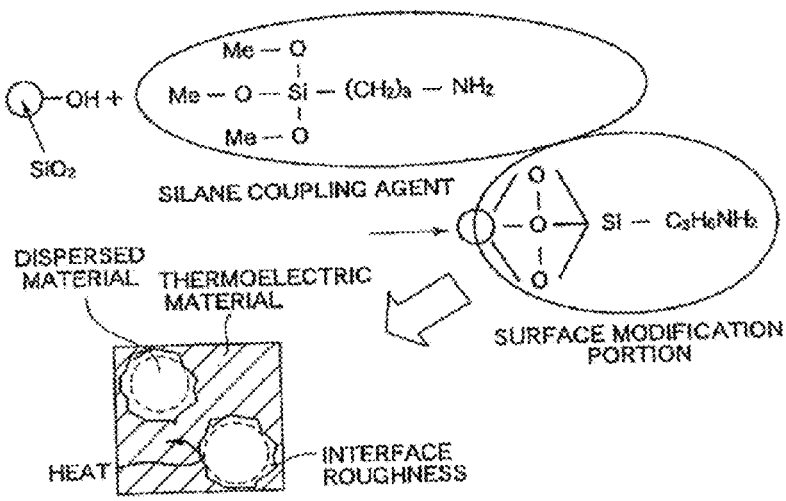
FIG. 28 is a schematic conceptual diagram showing a main portion of the second production method according to the invention.

In a second production method in the embodiment of the invention shown in FIG. 27, a functional group of the surface of the $SiO_2$ particle, which is an example of the dispersed material, for example, an OH group is bonded to a terminal group of a silane coupling agent that is an example of an organic molecular modification agent (for example, α-aminopropyltrimethoxysilane), and three oxygen-binding sites are formed between the surface of the $SiO_2$ particle and the Si element of the silane coupling agent, as shown in FIG. 28. It is considered that when the nanocomposite thermoelectric conversion material is produced using the dispersed material to which the organic molecular surface modification portion is bonded, the organic molecular surface modification portion remains and the interface is made rough. In the second production method, it is preferable that the surplus amount of the organic molecular modification agent (silane coupling agent) used to modify the surface of the dispersed material ($SiO_2$) should not be removed by filtering, and should be used to increase the effect of the surface modification.

As described above, the nanocomposite thermoelectric conversion material according to the invention is the thermoelectric conversion material in which the nanoparticles of the dispersed material are dispersed in the matrix of the thermoelectric conversion material. The roughness of the interface between the matrix of the thermoelectric conversion material and the nanoparticles of the dispersed material is equal to or larger than 0.1 nm, preferably 0.1 nm to 0.6 nm. The density of the interface between the matrix of the thermoelectric conversion material and the nanoparticles of the dispersed material (i.e., a ratio of a contact area between the matrix and the nanoparticles to unit volume) is preferably 0.02 to 3 (1/nm), more preferably 0.06 to 1.8 (1/nm), and furthermore preferably 0.1 to 1.8 (1/nm).

The thermoelectric conversion material in the nanocomposite thermoelectric conversion material is not limited to a specific material. For example, the thermoelectric conversion material may be a material containing at least two elements selected from a group consisting of Bi, Sb, Ag, Pb, Ge, Cu, Sn, As, Se, Te, Fe, Mn, Co, and Si, for example, a BiTe-based material, or a $CoSb_3$ compound which contains Co and Sb, and whose crystal contains an element other than Co and Sb, for example, a transition metal. Examples of the transition metal include Cr, Mn, Fe, Ru, Ni, Pt, and Cu. The thermoelectric conversion material that contains Ni among the transition metals, particularly, the thermoelectric conversion material whose chemical composition is $Co_{1-x}Ni_xSb_y$ ($0.03<X<0.09$, $2.7<Y<3.4$ in the chemical formula) is an n-type thermoelectric conversion material. The thermoelectric conversion material whose composition includes Fe, Sn, or Ge, for example, the thermoelectric conversion material whose chemical composition is $CoSb_pSn_q$ or $CoSb_pGe_q$ ($2.7<p<3.4$, $0<q<0.4$, $p>3$ in the formula) is a p-type thermoelectric conversion material.

The dispersed material according to the invention is not limited to a specific dispersed material. For example, as the insulating dispersed material, nanoparticles of $B_4C$, $Si_3N_4$, SiC, $Al_2O_3$, $ZrO_2$, and $SiO_2$, particularly, nanoparticles of $Al_2O_3$, $ZrO_2$, and $SiO_2$ may be used. The average diameter of the nanoparticles used as the dispersed material is preferably approximately 1 to 100 nm, more preferably approximately 5 to 50 nm, and furthermore preferably approximately 5 to 25 nm.

The nanocomposite thermoelectric conversion material according to the invention is produced according to one of four production methods. The first production method includes the first step and the second step. In the first production method, the nanocomposite thermoelectric conversion material according to the invention is produced by liquid phase synthesis. In the first step, the first composite particles, in which the dispersed material on the surface of which water exists is dispersed in the first source material of the thermoelectric conversion material, are produced by dropping the reducing agent into the solvent to which the salt of the first source material, and the water slurry containing the dispersed material have been added. In the second step, the thermoelectric conversion material, in which the dispersed material is dispersed in the compound of the first source material and the second source material of the thermoelectric conversion material, is produced by dropping the reducing agent into the solvent to which the first composite particles and the salt of the second source material have been added.

According to the first production method, water molecules adsorbed onto the surface of the dispersed material react with the salt of the thermoelectric conversion material in a small region. Thus, although not empirically clarified, it is considered that extremely small reaction products (that are presumed to be the oxide of the thermoelectric conversion material) are irregularly formed in the interface between the dispersed material and the matrix of the thermoelectric conversion material, and as a result, it is possible to make the surface roughness of the interface equal to or larger than 0.1 nm.

As the salt of the first source material of the thermoelectric conversion material, it is possible to employ, for example, the salt of at least one element selected from a group consisting of Bi, Sb, Ag, Pb, Ge, Cu, Sn, As, Se, Te, Fe, Mn, Co, and Si, for example, the salt of Co and Ni, Sn or Ge, halides, chlorides, fluorides, and bromides of the above-described elements, preferably chlorides, sulfates, and nitrates of the above-described elements. As the salt of the second source material of the thermoelectric conversion material, it is possible to employ, for example, the salt of the element other than the first source material, among the above-described elements, for example, the salt of Sb, halides, chlorides, fluorides, and bromides of the above-described elements, preferably chlorides, sulfates, and nitrates of the above-described elements.

Also, the solvent is not limited to a specific solvent. That is, any solvent may be employed, as long as the salt of the first source material and the salt of the second source material are uniformly dispersed in the solvent, and particularly, the salt of the first source material and the salt of the second source material are dissolved in the solvent. For example, the solvent may be methanol, ethanol, isopropanol, dimethylacetamide, N-methylpyrrolidone, preferably alcohol such as methanol and ethanol.

The reducing agent is not limited to a specific reducing agent, as long as the reducing agent reduces the salt of the first source material and the salt of the second source material. As the reducing agent, it is possible to employ, for example, tertiary phosphine, secondary phosphine, primary phosphine, hydrazine, hydroxyphenyl compounds, hydrogen, hydrides, borane, aldehyde, reducing halides, and polyfunctional reductants. Particularly, the reducing agent may be alkali borohydride, for example, at least one material among sodium borohydride, potassium borohydride, and lithium borohydride.

In the above-described first production method, the ratio among ingredients of the thermoelectric conversion material is the molar ratio among the metal salts, which is equivalent to the composition of the above-described two or more metals. In the first step, preferably 5 to 500 parts by volume of the solvent, and more preferably 10 to 250 parts by volume of the solvent are used per one part by mass of the salt of the first source material. Preferably 10 to 1000 parts by volume of the solvent, and more preferably 20 to 500 parts by volume of the solvent are used per one part by mass of the reducing agent. Preferably, 0.1 to 1 part by mass of the reducing agent, and more preferably 0.2 to 1 part by mass of the reducing agent is used per one part by mass of the salt of the first source material. Also, in the second step, preferably, 5 to 500 parts by volume of the solvent, and more preferably 10 to 250 parts by volume of the solvent are used per one part by mass of the salt of the second source material. Preferably 10 to 1000 parts by volume of the solvent, and more preferably 20 to 500 parts by volume of the solvent are used per one part by mass of the reducing agent. Preferably 0.1 to 1 part by mass of the reducing agent, and more preferably 0.2 to 1 part by mass of the reducing agent is used per one part by mass of the salt of the second source material.

The second production method includes the first step and the second step. In the second production method, the nanocomposite thermoelectric conversion material according to the invention is produced by liquid phase synthesis. In the first step, the surface of the dispersed material is modified by organic molecules. In the second step, the thermoelectric conversion material, in which the dispersed material is dispersed in the compound of the first source material and the second source material of the thermoelectric conversion material, is produced by dropping the reducing agent into the solvent to which the salt of the first source material, the salt of the second source material, and the dispersed material have been added.

According to the second production method, because the functional groups are distributed in the surface of the dispersed material, the surface of the dispersed material is selectively modified by the organic molecules of the modification agent. As a result, some regions of the surface of the dispersed material are modified by the organic molecules, and the other regions of the surface of the dispersed material are not modified by the organic molecules. Thus, protruding portions and recessed portions are formed in the surfaces of the dispersed material. The dispersed material, whose surface is modified, is dispersed in the matrix of the thermoelectric material. Therefore, it is possible to make the roughness of the interface equal to or larger than 0.1 nm.

In the first step in which the surface of the dispersed material is modified by organic molecules, the surface of the dispersed material is treated with the organic surface modification agent, for example, a small amount of an organosilicon compound whose molecule has a functional group that is chemically bonded to the surface of the dispersed material. For example, a silane coupling agent, preferably, an amino silane coupling agent, an epoxy silane coupling agent, an isocyanate silane coupling, a vinyl silane coupling agent, a methacryl silane coupling agent, a mercapto silane coupling agent, or a ureido silane coupling agent is used. For example, the ratio of the silane coupling agent to the dispersed material is preferably equal to or higher than 0.1 mass % and lower than 20 mass %, more preferably 0.2 to 10 mass %, and furthermore preferably 0.2 to 5 mass %.

As the salts of the above-described source materials, it is possible to employ, for example, the salts of at least two elements selected from a group consisting of Bi, Sb, Ag, Pb, Ge, Cu, Sn, As, Se, Te, Fe, Mn, Co, and Si, for example, the salt of Co and Ni, Sn or Ge and the salt of Sb, halides, chlorides, fluorides, and bromides of the above-described elements, preferably chlorides, sulfates, and nitrates of the above-described elements. As the above-described solvent, it is possible to employ the same solvents as the solvents that may be employed in the first production method. As the reducing agent, it is possible to employ the same reducing agents as the reducing agents that may be employed in the first production method.

In the second production method, the ratio among ingredients of the thermoelectric conversion material is the molar ratio among the metal salts, which is equivalent to the composition of the above-described two or more metals. Preferably 5 to 500 parts by volume of the solvent, and more preferably 10 to 250 parts by volume of the solvent are used per one part by mass of the sum of the salts of the first and second source materials. Preferably 10 to 500 parts by volume of the solvent, and more preferably 20 to 500 parts by volume of the solvent are used per one part by mass of the reducing agent. Preferably 0.1 to 1 part by mass of the reducing agent, and more preferably 0.2 to 1 part by mass of the reducing agent is used per one part by mass of the sum of the salts of the first and the second source materials.

A third production method includes a first step, a second step, a third step, and a fourth step. In the third production method, the nanocomposite thermoelectric conversion material according to the invention is produced by liquid phase synthesis. In the first step, a source material solution is prepared by dissolving, in the solvent, the salt of the first source material that is to form the matrix of the thermoelectric conversion material, and the salt of the second source material that has a redox potential higher than a redox potential of the first source material of the matrix, and that is to form the dispersed material. In the second step, the hydroxide of the second source material that is to form the dispersed material is precipitated by dropping the reducing agent into the source material solution. In the third step, slurry is produced by precipitating the first source material of the matrix of the thermoelectric conversion material, around the hydroxide, by further dropping the reducing agent into the source material solution in which the hydroxide has been precipitated. In the fourth step, the slurry is heat-treated so that the matrix is formed by forming the first source material into an alloy, and the dispersed material that is an oxide is produced by oxidizing the hydroxide.

FIGS. 31A to 31D schematically show the mechanism of the liquid phase synthesis in the third production method according to the invention. To facilitate understanding, an example, in which the nanocomposite thermoelectric conversion material is produced, and $CeO_2$ nanoparticles, which are the particles of the dispersed material, are dispersed in the $(Co,Ni)Sb_3$ matrix of the thermoelectric conversion material, will be described. In the third production method, the source material solution is prepared by dissolving, in the solvent, the salt of the first source material (Co, Ni, Sb) that is to form the matrix of the thermoelectric conversion material, and the salt of the second source material (Ce) that has a redox potential higher than the redox potential of the first source material (Co, Ni, Sb), and that is to form the dispersed material (the first step).

Next, the hydroxide $(Ce(OH)_3)$ of the second source material (Ce), which is to form the dispersed material, is precipitated by dropping the reducing agent into the source material solution (the second step). FIG. 31A shows an initial stage of the reduction. That is, because Ce has the redox potential higher than the redox potentials of Co, Ni, and Sb, a hydroxide $10a$ of Ce is precipitated in the source material solution before Co, Ni, and Sb are precipitated.

It is determined that the second source material has the redox potential higher than the redox potential of the first source material based on the following reaction. Cerium is the constituent element of the dispersed material. For example, the chloride $CeCl_3$, which is the salt of the second source material, is reduced to the hydride $Ce(OH)_3$. The chloride $CeCl_3$ is not reduced to the metal Ce. The redox potential of Ce in the reduction reaction, in which $CeCl_3$ is reduced to $Ce(OH)_3$, is higher than the redox potentials of Co, Ni, and Sb in the reaction in which the salts, for example, the chlorides of Co, Ni, and Sb are reduced to the metals. Co, Ni, and Sb are constituent elements of the matrix.

Next, the slurry is produced by precipitating a first source material $20a$ (Co, Ni, Sb) of the matrix of the thermoelectric conversion material, around the hydroxide $10a$ by further dropping the reducing agent (the third step). FIG. 31B shows an intermediate stage of the reduction. Nanoparticles $20a$ of the first source material (Co, Ni, Sb) are precipitated while nanoparticles $10a$ of the hydroxide $(Ce(OH)_3)$ serve as cores (precipitation sites). FIG. 31C shows completion of the reduction. At this stage, the slurry is produced. In the slurry, the nanoparticles of the hydroxide $10a$ $(Ce(OH)_3)$ of the second source material are dispersed in an aggregate in which the particles of the first source material $20a$ have been precipitated.

Next, the slurry is heat-treated. Thus, a matrix 20 with a predetermined composition $(Co,Ni)Sb_3$ is formed by forming the first source material $20a$ (Co, Ni, Sb) into an alloy, and a dispersed material 10 that is the oxide $(CeO_2)$ is produced by oxidizing the hydroxide $10a$ $(Ce(OH)_3)$, as shown in FIG. 31D (the fourth step).

By performing the above-described processes, it is possible to produce the nanocomposite thermoelectric conversion material in which the $CeO_2$ (ceria) nanoparticles, which are nanoparticles of the dispersed material, are dispersed in the matrix $(Co,Ni)Sb_3$ of the thermoelectric conversion material.

The solvents and the reducing agents that may be employed in the third production method are the same as the solvents and the reducing agents that may be employed in the first and second production methods.

Figure 33A:
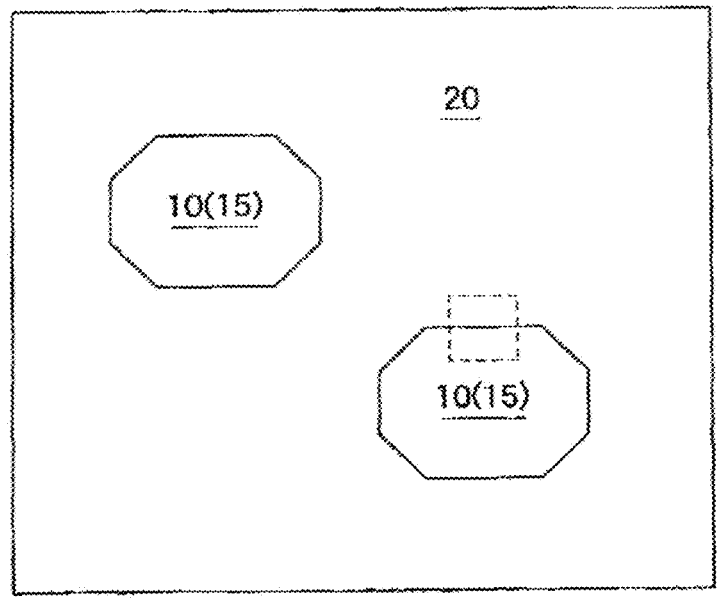
FIGS. 33A and 33B are schematic diagrams showing that roughness of an interface between a matrix (crystalline material)/a dispersed material (crystalline material) is made large in the nanocomposite thermoelectric conversion material according to the embodiment of the invention.
Figure 33B:
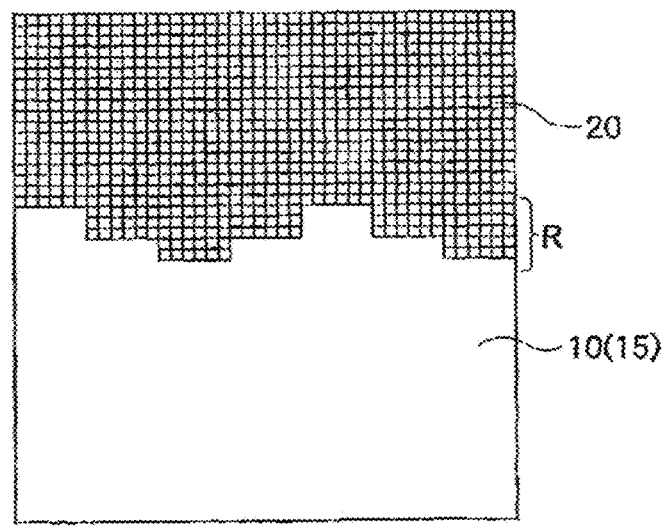

The nanocomposite thermoelectric conversion material produced according to the third production method has the following features. Both of the matrix (for example, (Co, NOSb$_3$ that is a cubical crystal) and the dispersed material (for example, $CeO_2$ that is a cubical crystal) are crystalline materials. Therefore, lattice strain is caused in the interface between the matrix and the dispersed material due to a difference in the crystal orientations of the matrix and the dispersed material. As shown in FIGS. 33A and 33B, interface roughness R is caused in the interface between the matrix and the dispersed material, to reduce the lattice strain. The interface roughness reaches approximately 1.2 nm. When the nanocomposite thermoelectric conversion material is produced according to each of the first and second production methods, the interface roughness is approximately 0.6 nm at the maximum. When the nanocomposite thermoelectric conversion material is produced according to the third production method, the interface roughness is made even larger. In the nanocomposite thermoelectric conversion material produced according to each of the first and second production methods, the thermoelectric conversion material of the matrix is an alloy, and a crystalline material. However, the dispersed material is an amorphous material. However, according to the third production method, it is possible to obtain the structure in which both of the matrix and the dispersed material are crystalline materials. In the structure, the interface roughness is made large due to the lattice strain in the interface. Thus, the structure is advantageous over the structure which is obtained according to each of the first and second production methods, and in which the matrix is the crystalline material, and the dispersed material is the amorphous material.

The combination of the composition of the matrix and the composition of the dispersed material in the third production method is not limited to the compositions in the above-described example. It is possible to employ any combination of the compositions as long as the third production method can be applied to the combination. For example, the combinations described below may be employed. However, the third production method is not limited to the combinations described below.

Examples of the Combination of the Matrix Composition and the Dispersed Material Composition in the Third Production Method For example, it is possible to employ all the combinations of one of the matrix compositions M and one of the dispersed material compositions P. The matrix compositions M include (Co,Ni)Sb$_3$-based compositions, Bi$_2$Te$_3$-based compositions (including BiSbTeSe-based compositions), CoSb$_3$-based compositions, SiGe-based compositions, PbTe-based compositions, and Zn$_4$Sb$_3$-based compositions. The dispersed material compositions P include CeO$_2$, ZrO$_2$, TiO$_2$, Fe$_2$O$_3$, V$_2$O$_3$, MnO$_2$, and CaO.

A fourth production method includes a first step, a second step, a third step, and a fourth step. In the fourth production method, the nanocomposite thermoelectric conversion material according to the invention is produced by liquid phase synthesis. In the first step, the source material solution is prepared by dissolving, in the solvent, salts of a plurality of elements that constitute the thermoelectric conversion material so that only the amount of the salt of the element that has the highest redox potential among the plurality of elements is an excessive amount with respect to a predetermined composition of the thermoelectric conversion material. In the second step, the element with the highest redox potential is precipitated by dropping the reducing agent into the source material solution. In the third step, the slurry is produced by precipitating the rest of the elements, which has not been precipitated, around the precipitated element with the highest redox potential, by further dropping the reducing agent in the source material solution in which the element with the highest redox potential has been precipitated. In the fourth step, the slurry is heat-treated so that the matrix with the predetermined composition is formed by forming the elements, which have been precipitated, into an alloy, and the surplus of the element with the highest redox potential remains as the dispersed material.

FIGS. 32A to 32D schematically show the mechanism of the liquid phase synthesis in the fourth production method according to the invention. To facilitate understanding, an example, in which the nanocomposite thermoelectric conversion material is produced, and metal nanoparticles of Te among the constituent elements of the matrix are dispersed as the nanoparticles of the dispersed material in the matrix (Bi,Sb)$_2$Te$_3$ of the thermoelectric conversion material, will be described.

According to the fourth production method, the source material solution is prepared by dissolving, in the solvent, the salts of the plurality of elements (Bi, Sb, Te) that constitute the thermoelectric conversion material so that only the amount of the salt of the element (Te) that has the highest redox potential among the plurality of elements is an excessive amount with respect to a predetermined composition (Bi,Sb)$_2$Te$_3$ of the thermoelectric conversion material (the first step).

Figure 32A:
FIGS. 32A to 32D are schematic diagrams showing the mechanism of the liquid phase synthesis in a fourth production method according to the invention.

Next, the element (Te) with the highest redox potential is precipitated by dropping the reducing agent into the source material solution (the second step). FIG. 32A shows the initial stage of the reduction. That is, because Te has the highest redox among Bi, Sb, and Te that are the three constituent elements of the matrix, Te is precipitated as nanoparticles 15a in the source material solution before Bi and Sb are precipitated. It is determined that Te has the highest redox potential based on the reaction in which the salts, for example, the chlorides of the constituent elements Bi, Sb, Te of the thermoelectric conversion material are reduced to respective metals. In this reaction, the redox potential of Te is highest among the three constituent elements.

Figure 32C:
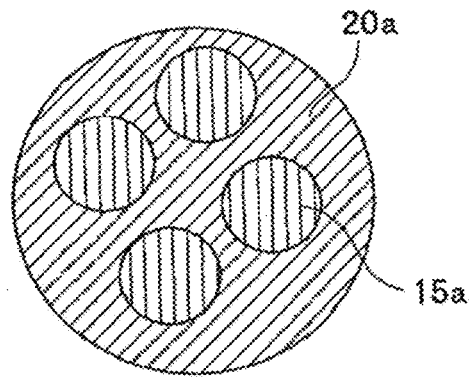
Figure 32B:
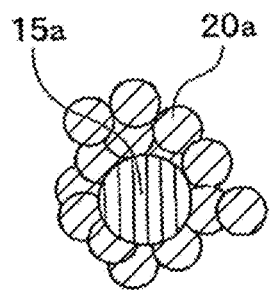

Next, the slurry is produced by precipitating the elements 20a (Bi, Sb) among the plurality of elements (Bi, Sb, Te), which are not precipitated in the second step, around the precipitated element 15a (Te) that has the highest redox potential, by further dropping the reducing agent into the source material solution in which the element 15a (Te) with the highest redox potential has been precipitated (the third step). FIG. 32B shows the intermediate stage of the reduction. The nanoparticles 20a of the metals Bi and Sb are precipitated while the nanoparticles 15a of the metal Te serve as cores (precipitation sites). FIG. 32C shows completion of the reduction. At this stage, the slurry is produced. In the slurry, the nanoparticles 15a of the element (Te) with the highest redox potential are dispersed in an aggregate in which the particles 20a of Bi and Sb have been precipitated.

Figure 32D:
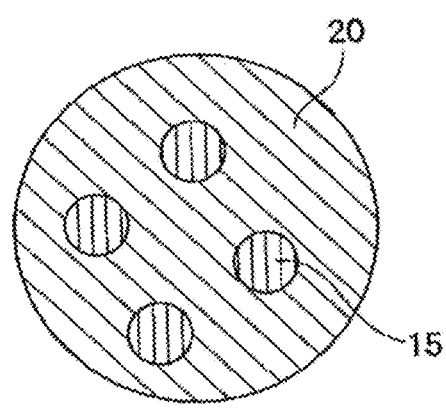

Next, the slurry is heat-treated so that the matrix 20 with a predetermined composition (Bi, Sb)$_2$Te$_3$ is formed by forming the elements 20a (Bi, Sb, Te) precipitated in the second and third steps into an alloy, and the surplus of the element (Te) with the highest redox potential remains as the dispersed material 15, as shown in FIG. 32D (the fourth step). That is, a portion of the dispersed material 15a (i.e., the dispersed material before heat treatment is performed) is used to form the matrix with the predetermined composition (Bi,Sb)$_2$Te$_3$. Only the surplus of the dispersed material 15a with respect to the predetermined composition (Bi,Sb)$_2$Te$_3$ remains as the final dispersed material 15. That is, during the alloy-forming process, the size of the dispersed material 15 is made smaller than the size of the dispersed material before heat treatment is performed. This further increases the phonon scattering ability of the dispersed material 15.

By performing the above-described processes, it is possible to produce the nanocomposite thermoelectric conversion material in which the Te nanoparticles, which are particles of the dispersed material, are dispersed in the matrix (Bi,Sb)$_2$Te$_3$ of the thermoelectric conversion material.

The solvents and the reducing agents that may be employed in the fourth production method are the same as the solvents and the reducing agents that may be employed in the first and second production methods.

The nanocomposite thermoelectric conversion material that is produced according to the fourth production method has the following features. As in the nanocomposite thermoelectric conversion material produced according to the third production method, both of the matrix (for example, (Bi,Sb)$_2$Te$_3$ that is a rhombohedral crystal) and the dispersed material (for example, Te that is a hexagonal crystal) are crystalline materials. Therefore, lattice strain is caused in the interface between the matrix and the dispersed material due to the difference in the crystal orientations of the matrix and the dispersed material. As shown in FIGS. 33A and 33B, the interface roughness R is caused in the interface between the matrix and the dispersed material, to reduce the lattice strain. The interface roughness reaches approximately 1.7 nm. When the nanocomposite thermoelectric conversion material is produced according to each of the first and second production methods, the interface roughness is approximately 0.6 nm at the maximum. When the nanocomposite thermoelectric conversion material is produced according to the fourth production method, the interface roughness is made even larger. In the nanocomposite thermoelectric conversion material produced according to each of the first and second production methods, the thermoelectric conversion material of the matrix is the alloy, and the crystalline material. However, the dispersed material is the amorphous material. According to the fourth production method, it is possible to obtain the structure in which both of the matrix and the dispersed material are crystalline materials. In the structure, the interface roughness is made large due to the lattice strain in the interface. Thus, the structure is advantageous over the structure which is obtained according to each of the first and second production methods, and in which the matrix is the crystalline material, and the dispersed material is the amorphous material.

The combination of the composition of the matrix and the composition of the dispersed material in the fourth production method is not limited to the composition in the above-described example. It is possible to employ any combination of the compositions as long as the fourth production method can be applied to the combination. For example, the combinations described below may be employed. However, the fourth production method is not limited to the combinations described below.

Examples of the Combination of the Matrix Composition and the Dispersed Material Composition in the Fourth Production Method For example, it is possible to employ the combinations of $(Bi,Sb)_2Te_3$-based compositions and Te, the combinations of $Bi_2Te_3$-based compositions (including BiSbTeSe-based compositions) and Te or Se, the combinations of $CoSb_3$-based compositions and Sb or $Sb_2O_3$, the combinations of $CoSb_3$-based compositions (containing Te) and Te, the combinations of SiGe-based compositions and Ge or Ge oxides, the combinations of PbTe-based compositions and Te, the combinations of BiSnTe-based compositions and Sn or Sn oxides, and the combinations of $Zn_4Sb_3$-based compositions and Sb or Sb oxides.

According to one of the first to fourth production methods, it is possible to produce the slurry containing the composite nanoparticles of the thermoelectric conversion material and the dispersed material, and the solvent, for example, ethanol. Therefore, for example, the composite nanoparticles are generally filtered and washed using the solvent, for example, ethanol, or a mixed solvent produced by mixing a large amount of water with a small amount of the solvent (for example, the volume ratio between water and the solvent is 100:25 to 75). Then, an alloy is produced by hydrothermally-treating the composite nanoparticles in a hermetically-sealed pressurized container, for example, an autoclave device, at 200 to 400° C. for 24 to 100 hours. Then, drying is generally performed in a non-oxidizing atmosphere, for example, an inactive atmosphere. Thus, the powdered nanocomposite thermoelectric conversion material is produced.

When a bulk body needs to be produced, the powdered nanocomposite thermoelectric conversion material is subjected to Spark Plasma Sintering (SPS) at 400 to 600° C. Thus, the bulk body of the nanocomposite thermoelectric conversion material is produced. The SPS is performed using a spark plasma sintering device that includes punches (an upper punch and a lower punch), electrodes (an upper electrode and a lower electrode), a die, and a pressurizing device. When sintering is performed, only a sintering chamber of the sintering device may be isolated from the outside air so that sintering is performed in an inactive atmosphere, or the entire system may be surrounded by a housing so that sintering is performed in an inactive atmosphere.

According to the above-described method, it is possible to produce the powder or the bulk body of the nanocomposite thermoelectric conversion material according to the invention. In the nanocomposite thermoelectric conversion material according to the invention, the nanoparticles of the dispersed material are dispersed in the matrix of the thermoelectric conversion material as described above. The roughness of the interface between the matrix of the thermoelectric conversion material and the nanoparticles of the dispersed material is equal to or larger than 0.1 nm, preferably 0.1 to 0.6 nm. The density of the interface between the matrix of the thermoelectric conversion material and the nanoparticles of the dispersed material (i.e., the ratio of the contact area between the matrix and the nanoparticles to unit volume) is preferably 0.02 to 3 (1/nm), more preferably 0.06 to 1.8 (1/nm), and furthermore preferably 0.1 to 1.8 (1/nm).

The thermal conductivity of the nanocomposite thermoelectric conversion material according to the invention varies depending on the combination of the matrix of the thermoelectric conversion material and the nanoparticles of the dispersed material. In the n-type thermoelectric conversion material whose composition is $CO_{1-X}Ni_XSb_Y$ (0.03<X<0.09, 2.7<Y<3.4 in the chemical formula), the thermal conductivity is lower than 1 W/m/K, and more specifically equal to or lower than 0.8 W/m/K at least in a temperature range of 50 to 400° C., and the nondimensional performance index ZT is 0.4 or higher (50° C.) to 1.2 or higher (400° C.) at least in the temperature range of 50 to 400° C.

A thermoelectric conversion element according to the invention is produced using the nanocomposite thermoelectric conversion material according to the invention, by assembling the n-type nanocomposite thermoelectric conversion material, the p-type nanocomposite thermoelectric conversion material, an electrode, and an insulating substrate, according to a known method.

In the specification, the embodiment has been specifically described based on the combinations of the specific thermoelectric conversion materials and the specific dispersed materials. However, the invention is not limited to the combinations of the specific thermoelectric conversion materials and the specific dispersed materials described in the embodiment. It is possible to employ the combination of the matrix of any thermoelectric conversion material and the nanoparticles of any dispersed material, as long as the produced nanocomposite thermoelectric conversion material has the features in the invention.

EXAMPLES

Hereinafter, examples of the invention will be described. In the examples described below, the produced nanocomposite thermoelectric conversion material was evaluated according to a method described below.

1. Production of Transmission Electron Microscope (TEM) Specimen

Pieces, each of which has the size of 1 to 2 mm×1 to 2 mm, were cut out from a sintered body with the size of a diameter 10 mm×1 to 2 mm, using Isomet. Then, each piece was subjected to mechanical polishing until the thickness of the piece became equal to or smaller than 100 μm. Thus, specimens were produced. Then, each specimen was adhered to a Cu mesh for TEM using an adhesive agent (called Araldite), and drying was performed. Then, a portion of the specimen was subjected to mechanical polishing until the thickness of the portion became equal to or smaller than 20 μm, using a dimple grinder (manufactured by GATAN, Inc.). Then, the thinned portion of the specimen was further thinned until the thickness of the thinned portion of the specimen became 10 to 100 nm, using an Ar ion milling system (manufactured by GATAN, Inc).

2. TEM Observation

TEM observation was performed on the thinned portion whose thickness was made equal to or smaller than 100 nm in the specimen production process. The TEM observation was performed under the following condition. The model of a device used for the observation was Tecnai G2 S-Twin TEM (manufactured by FEI company). Accelerating voltage was 300 kV.

3. Analysis of Interface Roughness

The high-resolution TEM images of the specimens were taken, and were directly observed. Image analysis was performed by performing a fast Fourier transformation (FFT) and an inverse fast Fourier transformation (IFFT) on the taken high-resolution images, thereby taking out only lattice information. Thus, the average value of the interface roughness was determined.

4. Measurement of the Thermal Conductivity

The thermal conductivity was measured by a thermal conductivity evaluation method (steady method), and a flash method (an unsteady method) (using a thermal conductivity measurement device (manufactured by NETZSCH) that measures the thermal conductivity using the flash method).

5. Output Factor

The Seebeck coefficient and the specific resistance were measured using ZEM manufactured by ULVAC-RIKO, Inc. The Seebeck coefficient was determined based on ΔV/ΔT using a three-point fitting. The specific resistance was measured by a four-terminal method.

6. Measurement of the Interface Density

The diameters of approximately 500 to 700 particles were measured by TEM. Then, the interface density was calculated based on the averaged diameter of the particles.

First and Second Comparative Examples

Figure 36:
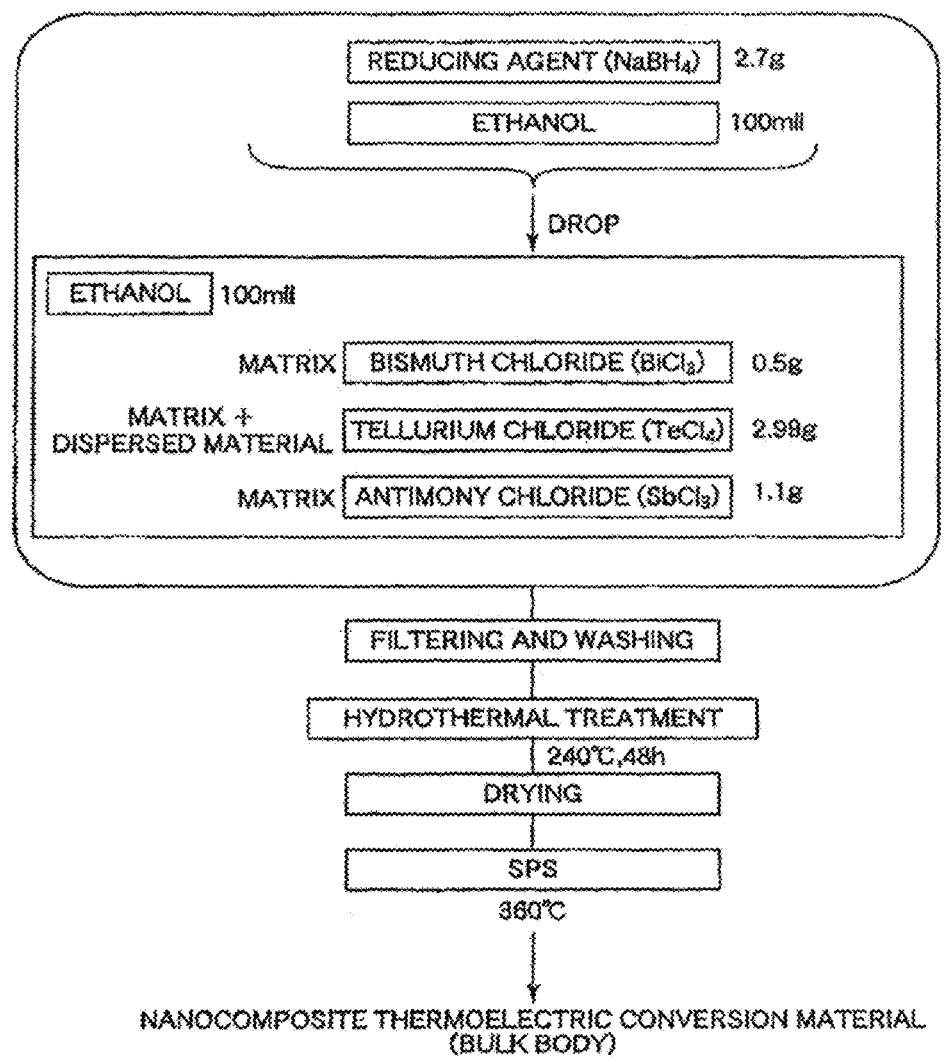
FIG. 36 shows a flowchart of the example of a fourth production method according to the invention.

In each of the first and second comparative examples, the nanocomposite thermoelectric conversion material was produced according to the production process shown by the flowchart in FIG. 36. Propylene glycol monomethyl ether (PGM) slurry containing $SiO_2$ particles (average diameter: 5 nm) was used. In the first comparative example, the reducing agent was dropped at the dropping rate of 10 ml/minute, and a nanocomposite thermoelectric conversion material 'A' was produced. In the second comparative example, the reducing agent was dropped at the dropping rate of 600 ml/minute, and a nanocomposite thermoelectric conversion material 'B' was produced. The density of the $SiO_2$ interface in the produced nanocomposite thermoelectric conversion materials A and B was 0.09 to 0.17 (1/nm). FIGS. 17-22 show the result of evaluation on characteristics of the nanocomposite thermoelectric conversion materials A and B.

First and Second Examples of the Present Invention

In each of the first and second examples, the nanoparticles were synthesized in two steps, according to the production process shown in the flowchart in FIG. 25. The amounts of ingredients will be described in an order in which the ingredients are arranged from an upper position to a lower position in FIG. 25. In the first step, the amount of the reducing agent ($NaBH_4$) was 0.4 g, the amount of ethanol was 50 ml, the amount of ethanol was 50 ml, the amount of cobalt chloride hexahydrate ($CoCl_2.6H_2O$) was 0.895 g, the amount of nickel chloride hexahydrate ($NiCl_2.6H_2O$) was 0.057 g, and the amount of water slurry containing $SiO_2$ particles (the average diameter of the particles: 5 nm, $SiO_2$:10 mass %, $SiO_2$ particles are dispersed at pH2) was 2.4 g. In the second step, the amount of the reducing agent ($NaBH_4$) was 1.8 g, the amount of ethanol was 100 ml, the amount of ethanol was 100 ml, and the amount of antimony chloride ($SbCl_3$) was 2.738 g. In addition, all the amount of the composite particles produced in the first step was used in the second step. In the first example, the reducing agent was dropped at the dropping rate of 10 ml/minute, and a nanocomposite thermoelectric conversion material 'C' was produced. In the second example, the reducing agent was dropped at the dropping rate of 600 ml/minute, and a nanocomposite thermoelectric conversion material 'D' was produced. The ethanol slurry containing the nanoparticles produced in the second step was filtered and washed using the mixed solvent produced by mixing 500 ml of water with 300 ml of ethanol. Then, filtering and washing were further performed using 300 ml of ethanol. After the second step was completed, processes were performed in succession without performing washing.

After the first step and the second step were completed, the composite nanoparticles were placed in a hermetically-sealed autoclave, device, and an alloy was produced by hydrothermally-treating the composite nanoparticles at 240° C. for 48 hours. Then, drying was performed in a nitrogen gas flow atmosphere, and the produced powder was collected. As a result, approximately 2.0 g of powder was collected. Spark plasma sintering (SPS) was performed on the produced powder at 400 to 500° C. Thus, the bulk body of the nanocomposite thermoelectric conversion material was produced. The average diameter of the $SiO_2$ particles in the produced bulk body was 10 to 20 nm, and the interface density in the bulk body was 0.11 to 0.15 (1/nm). FIGS. 17-22 show the result of evaluation on the thermoelectric conversion characteristics of the produced nanocomposite thermoelectric conversion materials (C and D), together with the result of evaluation on the characteristics of the nanocomposite thermoelectric conversion materials in the first and second comparative examples.

Third Comparative Example

A third comparative example is the same as the first example, except that the reducing agent ($NaBH_4$) was not dropped in the first step. When $NaBH_4$ was dropped into the solvent containing water in the second step, the solvent was made cloudy, antimony oxychloride was produced, and the desired thermoelectric conversion material was not produced.

Fourth to Sixth Comparative Examples

Figure 29:
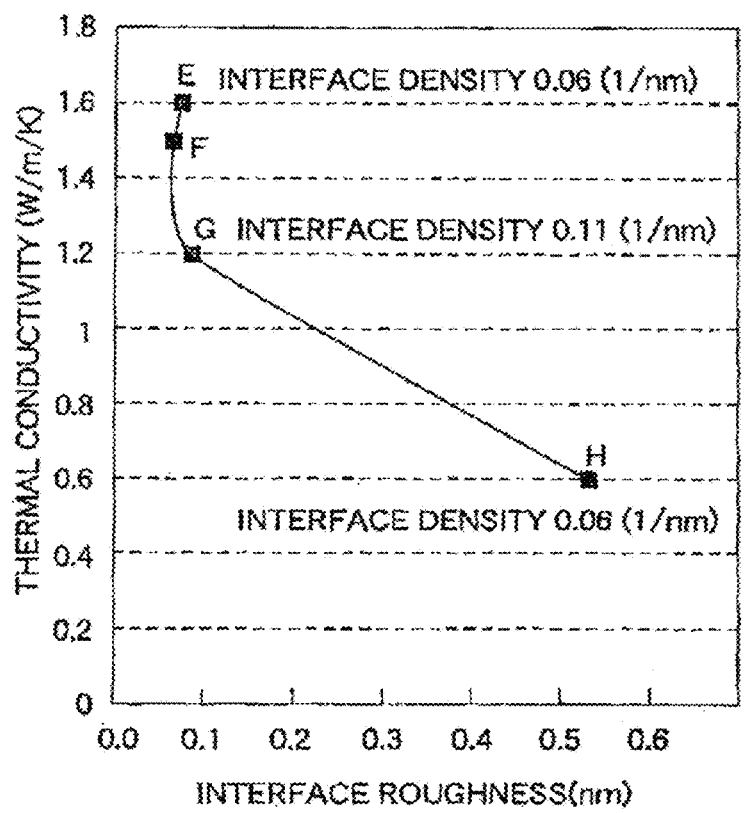
FIG. 29 is a graph showing the result of evaluation, on the thermal conductivities of the nanocomposite thermoelectric conversion materials produced in a third example and fourth to sixth comparative examples.

In each of the fourth to sixth comparative examples, the nanocomposite thermoelectric conversion material was produced according to the production process shown by the flowchart in FIG. 27. Propylene glycol monomethyl ether (PGM) slurry containing $SiO_2$ particles (average diameter: 5 nm), whose surfaces were not modified, was used, instead of PGM slurry containing $SiO_2$ particles whose surfaces are modified. In the fourth comparative example, the reducing agent was dropped at the dropping rate of 10 ml/minute, and a nanocomposite thermoelectric conversion material 'E' was produced. In the fifth comparative example, the reducing agent was dropped at the dropping rate of 10 ml/minute, and a nanocomposite thermoelectric conversion material 'F' was produced. In the sixth comparative example, the reducing agent was dropped at the dropping rate of 100 ml/minute, and a nanocomposite thermoelectric conversion material 'G' was produced. The density of the $SiO_2$ interface in the produced nanocomposite thermoelectric conversion materials E and F was 0.06 (l/nm). The density of the $SiO_2$ interface in the produced nanocomposite thermoelectric conversion material G was 0.11 (l/nm). FIG. 29 shows the result of evaluation on the thermoelectric conversion characteristics of the produced nanocomposite thermoelectric conversion materials E to G.

Third Example of the Present Invention

In a third example, a nanocomposite thermoelectric conversion material 'H' was produced according to the production process shown by the flowchart in FIG. 27. Propylene glycol monomethyl ether (PGM) slurry containing $SiO_2$ particles (average diameter: 5 mm), whose surfaces were modified by a silane coupling agent, was used. The silane coupling agent was γ-aminopropyltrimethoxysilane, and the ratio of the silane coupling agent to $SiO_2$ was 1 mass %. The reducing agent was dropped at the dropping rate of 600 ml/minute. The interface density in the produced nanocomposite thermoelectric conversion material H was 0.06 (l/nm). FIG. 29 shows the thermal conductivity of the nanocomposite thermoelectric conversion material H produced in the third example, together with the thermal conductivities in the fourth to sixth comparative examples. FIG. 30 shows the TEM image of the nanocomposite thermoelectric conversion material H produced in the third example.

As shown in FIG. 29, in the nanocomposite thermoelectric conversion material produced using the dispersed material whose surface was modified by organic molecules according to the second production method, the interface roughness is particularly large, and the thermal conductivity is small.

Fourth Example of the Present Invention

Figure 34:
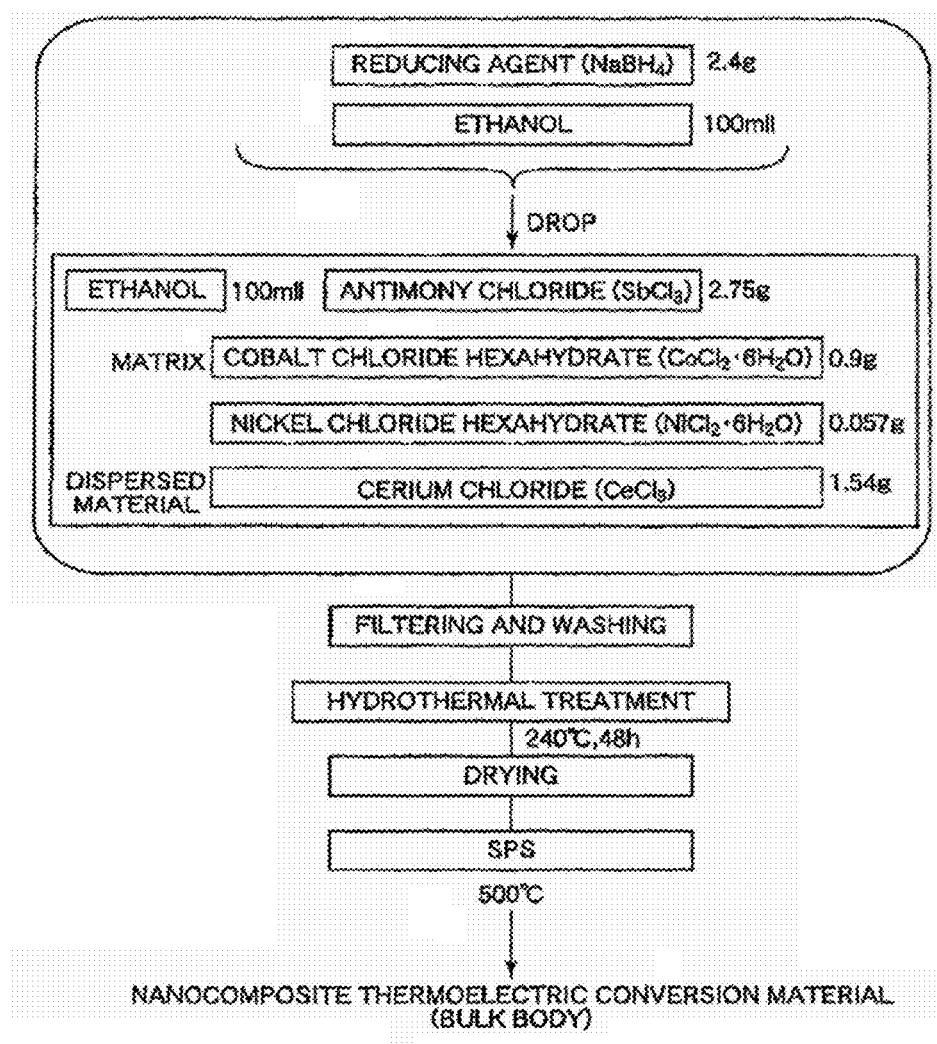
FIG. 34 shows a flowchart of the example of the third production method according to the invention.

The nanocomposite thermoelectric conversion material was produced using the third production method according to the invention. In the nanocomposite thermoelectric conversion material, $CeO_2$ nanoparticles, which were particles of the dispersed material, were dispersed in the matrix $(Co,Ni)Sb_3$ of the thermoelectric conversion material. FIG. 34 shows a flowchart of the production process in the fourth example.

Preparation of the Source Material Solution

The source material solution was prepared by dissolving the following source materials in 100 ml of ethanol. The source material of the matrix included 2.75 g of antimony chloride $(SbCl_3)$, 0.9 g of cobalt chloride hexahydrate $(CoCl_2.6H_2O)$, and 0.057 g of nickel chloride hexahydrate $(NiCl_2.6H_2O)$. The source material of the dispersed material was 1.54 g of cerium chloride $(CeCl_3)$.

Reduction

The solution, which was produced by dissolving 2.4 g of $NaBH_4$ that was the reducing agent into 100 ml of ethanol, was dropped into the above-described source material solution.

Filtering and Washing

The ethanol slurry containing the nanoparticles precipitated by reduction was filtered and washed using the solution produced by mixing 500 ml of water with 300 ml of ethanol. Filtering and washing were further performed using 300 ml of ethanol.

Heat Treatment

Then, the composite nanoparticles were placed in the hermetically-sealed autoclave device, and the matrix made of the alloy was produced by performing hydrothermal treatment at 240° C. for 48 hours.

Drying

Then, drying was performed in the $N_2$ gas flow atmosphere, and produced powder was collected. At this time, approximately 2.0 g of powder was collected.

Sintering

Spark plasma sintering (SPS) was performed on the collected powder at 500° C., and the nanocomposite thermoelectric conversion material was produced. In the nanocomposite thermoelectric conversion material, 30 volume % of $CeO_2$ particles, which were particles of the dispersed material, were dispersed in the matrix made of the thermoelectric conversion material $(Co,Ni)Sb_3$.

Observation of Constituent Phases

Figure 35A:
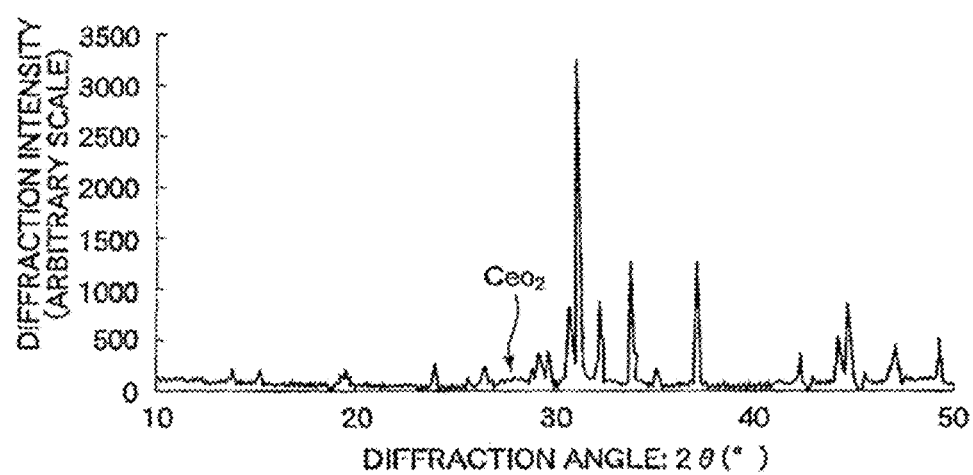
FIG. 35A is an XRD chart of the nanocomposite thermoelectric conversion material produced in the example of the third production method according to the invention.
Figure 35B:
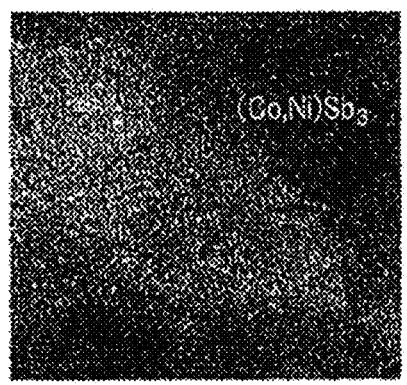
FIG. 35B is a TEM image of the nanocomposite thermoelectric conversion material produced in the example of the third production method according to the invention.

The produced powder was analyzed and observed by XRD analysis and TEM observation. FIG. 35A shows an XRD chart, and FIG. 35B shows a TEM image. As shown in the XRD chart, diffraction peaks of $(Co,Ni)Sb_3$ (all the peaks that are not marked) and a diffraction peak of $CeO_2$ were clearly observed. Thus, it was confirmed that the nanocomposite thermoelectric conversion material included both of the phase of $(Co,Ni)Sb_3$ and the phase of $CeO_2$. Also, it was confirmed that the interface roughness was 1.0±0.21 nm in the TEM image. Performance Table 1 shows structural features, that is, the average diameter of the particles, the interface density, and the interface roughness. Table 1 also shows measured values that are performance values, that is, the Seebeck coefficient, the specific resistance, the thermal conductivity, and the nondimensional performance index ZT at 400° C. Further, for the purpose of comparison, Table 1 shows values that are considered to be best values of a thermoelectric conversion material $(Co,Ni)Sb_3$ with a single phase, in which there is no dispersed material in a conventional example. The values were obtained from the publication "Effect of NiSb on the thermoelectric properties of skutterudite $CoSb_3$", Journal of Applied Physics, volume 93, Issue 5, pp. 2758-2764 (2003) (hereafter publication *1). It is evident from Table 1 that the thermal conductivity of the nanocomposite thermoelectric conversion material according to the invention is 0.7 W/m/ K, which is one-fifth of the thermal conductivity of the thermoelectric conversion material in the conventional example. Also, it is evident from Table 1 that the nondimensional performance index ZT of the nanocomposite thermoelectric conversion material according to the invention is 1.24, which is approximately 2.5 times as large as the nondimensional performance index ZT of the thermoelectric conversion material in the conventional example. As such, the nondimensional performance index ZT of the nanocomposite thermoelectric conversion material according to the invention is significantly improved.

TABLE 1

| | Structural Features | | | Performance Values (400° C.) | | | |
| --- | --- | --- | --- | --- | --- | --- | --- |
| | Ave | | | | | | |
| Source Materials | Particle Diameter (nm) | Interface density (1/nm) | Interface roughness (nm) | Seebeck coefficient (µV/K) | Specific resistance (µΩm) | Thermal conductivity (W/m/K) | ZT |
| (Co, Ni)Sb$_3$/30 vol % CeO$_2$ | 31 | 0.06 | 1.0 ± 0.21 | 203 | 32 | 0.7 | 1.24 |
| Conventional Example (*1) | — | — | — | 200 | 15 | 3.5 | 0.5 |

The production of the conventional example is described in the publication *1. In particular, an ingot was produced by sealing source materials (Co, Ni, Sb) in quartz, and heat-treating the source materials. Then, the ingot was crushed to produce powder. A bulk body was produced by performing sintering on the powder at 500 to 600° C. using a hot press.

Fifth Example of the Present Invention

In a fifth example, the nanocomposite thermoelectric conversion material was produced using the fourth production method according to the invention. In the nanocomposite thermoelectric conversion material, Te nanoparticles, which were particles of the dispersed material, were dispersed in the matrix (Bi,Sb)$_2$Te$_3$ of the thermoelectric conversion material. FIG. 36 shows a flowchart of the production process in the fifth example.

Preparation of the Source Material Solution

The source material solution was prepared by dissolving the following source materials in 100 ml of ethanol. The source materials of the matrix included 0.5 g of bismuth chloride (BiCl$_3$) and 1.1 g of antimony chloride (SbCl$_3$). The source material of the matrix, which was also used as the source material of the dispersed material particles, was 2.99 g of tellurium chloride (TeCl$_4$). The amount of tellurium chloride (TeCl$_4$) was excessive with respect to a target composition ratio.

Reduction

The solution, which was produced by dissolving 2.7 g of NaBH$_4$ that was the reducing agent into 100 ml of ethanol, was dropped into the above-described source material solution. The ethanol slurry containing the nanoparticles precipitated by reduction was filtered and washed using the solvent produced by mixing 500 ml of water with 300 ml of ethanol. Then, filtering and washing were further performed using 300 ml of ethanol.

Heat Treatment

Then, the composite nanoparticles were placed in the hermetically-sealed autoclave device, and the matrix made of the alloy was produced by performing hydrothermal treatment at 240° C. for 48 hours. Then, drying was performed in the N$_2$ gas flow atmosphere, and the produced powder was collected. At this time, approximately 2.0 g of powder was collected.

Sintering

Spark plasma sintering (SPS) was performed on the collected powder at 360° C. Thus, the nanocomposite thermoelectric conversion material was produced. In the nanocomposite thermoelectric conversion material, 30 volume % of Te particles, which were particles of the dispersed material, were dispersed in the matrix made of the thermoelectric conversion material (Bi,Sb)$_2$Te$_3$.

By decreasing the amount of Te used when the source material solution was prepared, the nanocomposite thermoelectric conversion material, in which the final volume percentage of the dispersed material was 10 volume %, was also produced.

Observation of Constituent Phases

Figure 37A:
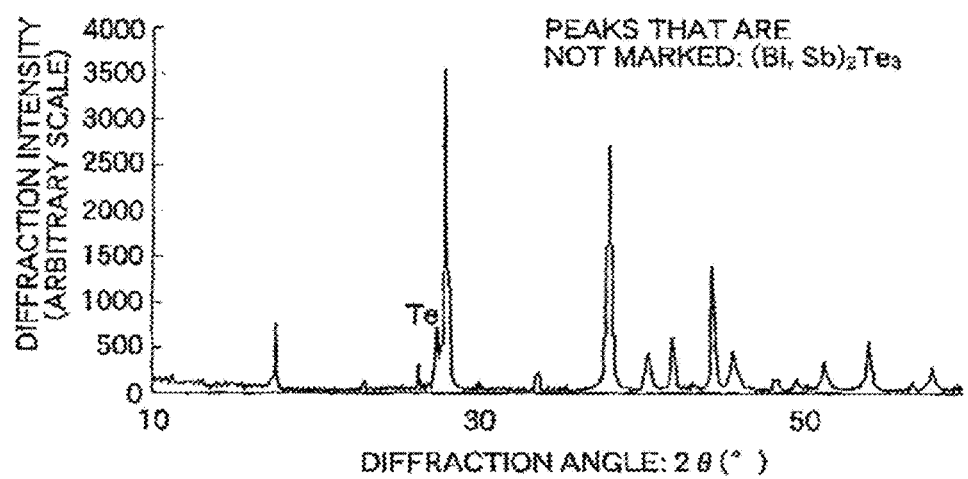
FIG. 37A is an XRD chart of the nanocomposite thermoelectric conversion material produced in the example of the fourth production method according to the invention.
Figure 37B:
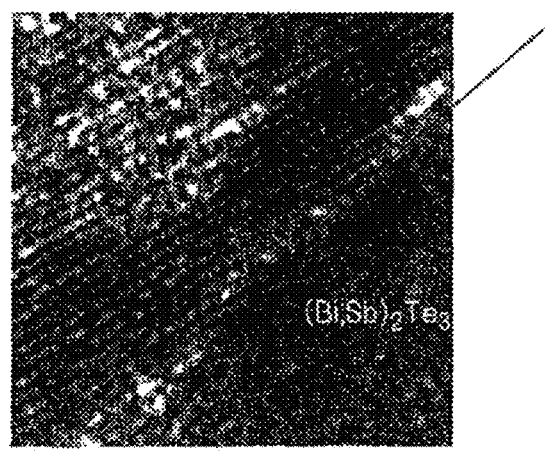
FIG. 37B is a TEM image of the nanocomposite thermoelectric conversion material produced in the example of the fourth production method according to the invention.

The produced powder was analyzed and observed by XRD analysis and TEM observation. FIG. 37A shows an XRD chart, and FIG. 37B shows a TEM image. As shown in the XRD chart, diffraction peaks of (Bi,Sb)$_2$Te$_3$ (all the peaks that are not marked) and a diffraction peak of Te were clearly observed. Thus, it was confirmed that the nanocomposite thermoelectric conversion material included both of the phase of (Bi,Sb)$_2$Te$_3$ and the phase of Te. Also, it was confirmed that the interface roughness was 1.5±0.22 nm in the TEM image.

Performance

Table 2 shows structural features, that is, the average diameter of the particles, the interface density, and the interface roughness. Table 2 also shows measured values that are performance values, that is, the Seebeck coefficient, the specific resistance, the thermal conductivity, and the nondimensional performance index ZT at room temperature. Further, for the purpose of comparison, Table 2 shows values for a conventional example that are considered to be best values of a thermoelectric conversion material (Bi, Sb)$_2$Te$_3$ with a single phase, in which there is no dispersed material. The conventional example values are described in the reference "CRC Handbook of Thermoelectrics" (hereafter reference *2). It is evident from Table 2 that the thermal conductivity of the nanocomposite thermoelectric conversion material according to the invention is approximately two-fifths (10 volume % of Te) to approximately one-fourth (30 volume % of Te) of the thermal conductivity of the thermoelectric conversion material in the conventional example. Also, it is evident from Table 2 that the nondimensional performance index ZT of the nanocomposite thermoelectric conversion material according to the invention is increased by approximately 10% (10 volume % of Te) to approximately 40% (30 volume % of Te), as compared to the nondimensional performance index ZT of the thermoelectric conversion material in the conventional example, and thus, the nondimensional performance index ZT of the nanocomposite thermoelectric conversion material according to the invention is significantly improved.

TABLE 2

| | Structural Features | | | Performance Values (room temperature) | | | |
|---|---|---|---|---|---|---|---|
| | Ave | | | | | | |
| Source Materials | Particle Diameter (nm) | Interface density (1/nm) | Interface roughness (nm) | Seebeck coefficient (μV/K) | Specific resistance (μΩm) | Thermal conductivity (W/m/K) | ZT |
| (Bi, Sb)$_2$ Te$_3$/30 vol % Te | 32 | 0.06 | 1.5 ± 0.22 | 203 | 24 | 0.45 | 1.15 |
| (Bi, Sb)$_2$ Te$_3$/10 vol % Te | 52 | 0.01 | — | 205 | 20 | 0.7 | 0.9 |
| Conventional Example (*2) | — | — | — | 205 | 8.9 | 1.75 | 0.81 |

In reference *2, a so-called "Traveling Heater Method" was employed to produce the conventional example. In the method, a source material ingot is placed in an ampule (quartz). While the ampule passes through a heater (580° C.), the source material is melted. After the ampule is taken out from the heater, the source material is cooled and solidified. At this time, a single crystal of the source material is produced.

Figure 38:
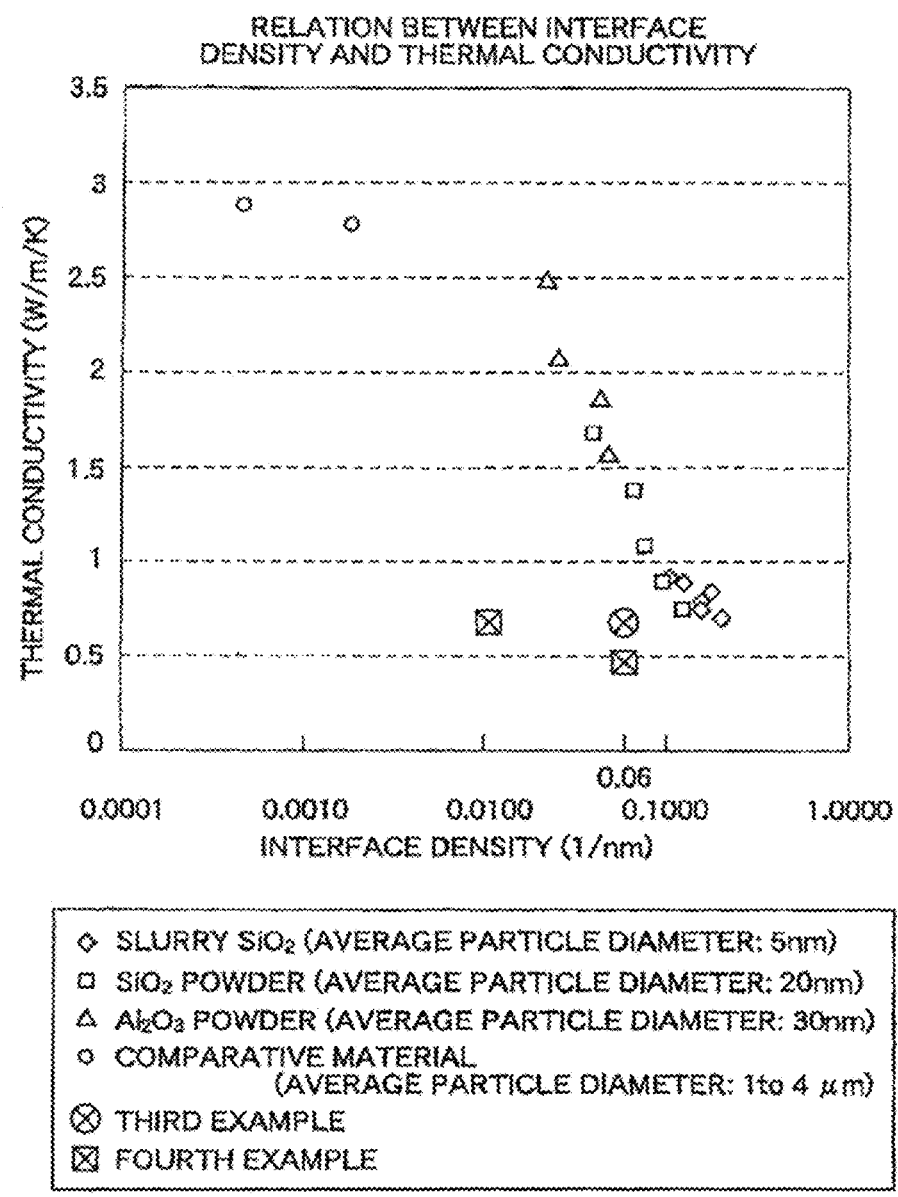
FIG. 38 is a graph in which the thermal conductivity of each of the nanocomposite thermoelectric conversion materials produced in the examples of the third and fourth production methods according to the invention and in conventional examples is plotted with respect to an interface density.

In FIG. 38, the thermal conductivity of each of the thermoelectric conversion materials in the third and fourth examples and conventional thermoelectric conversion materials is plotted with respect to the interface density. When the thermal conductivities at the same interface density are compared with each other, it is evident that that the thermal conductivities of the nanocomposite thermoelectric conversion materials in the third and fourth examples are decreased to a large extent as compared to the conventional thermoelectric conversion materials.

The conventional materials and the comparative material shown in FIG. 38 will be described in detail. The conventional material indicated by a rhombus mark in FIG. 38 was produced using 3.35 g of slurry SiO$_2$ (the average diameter of the particles: 5 nm). Propylene glycol monomethyl ether (PGM) slurry containing SiO$_2$ that was the dispersed material was dispersed in ethanol slurry in which salts of Co, Ni, and Sb were dissolved, as in the fourth example. The composite particles of CoNiSbSiO$_2$ were produced by reducing the salts using the reducing agent that was the same as the reducing agent used in the fourth example. Then, a bulk body was produced by performing hydrothermal treatment and sintering. The PGM slurry was produced by dispersing 3.35 g (10 weight %) of SiO$_2$ (the diameter of the particles: 5 nm) in propylene glycol monomethyl ether (PGM) solvent. The other conventional materials and the comparative material shown in FIG. 38 were also produced according to a method similar to the above-described method, except that dispersed materials, such as SiO$_2$ powder and Al$_2$O$_3$ powder, were used in the following manner.

The conventional material indicated by a square mark in FIG. 38 was produced using 0.335 g of SiO$_2$ powder (the average diameter of the particles: 20 nm).

The conventional material indicated by a triangle mark in FIG. 38 was produced using 0.384 g of Al$_2$O$_3$ powder (the average diameter of the particles: 30 nm).

The comparative material indicated by a circle mark in FIG. 38 was produced using 0.335 g of SiO$_2$ particles (the average diameter of the particles: 1 to 4 μm).

Figure 39:
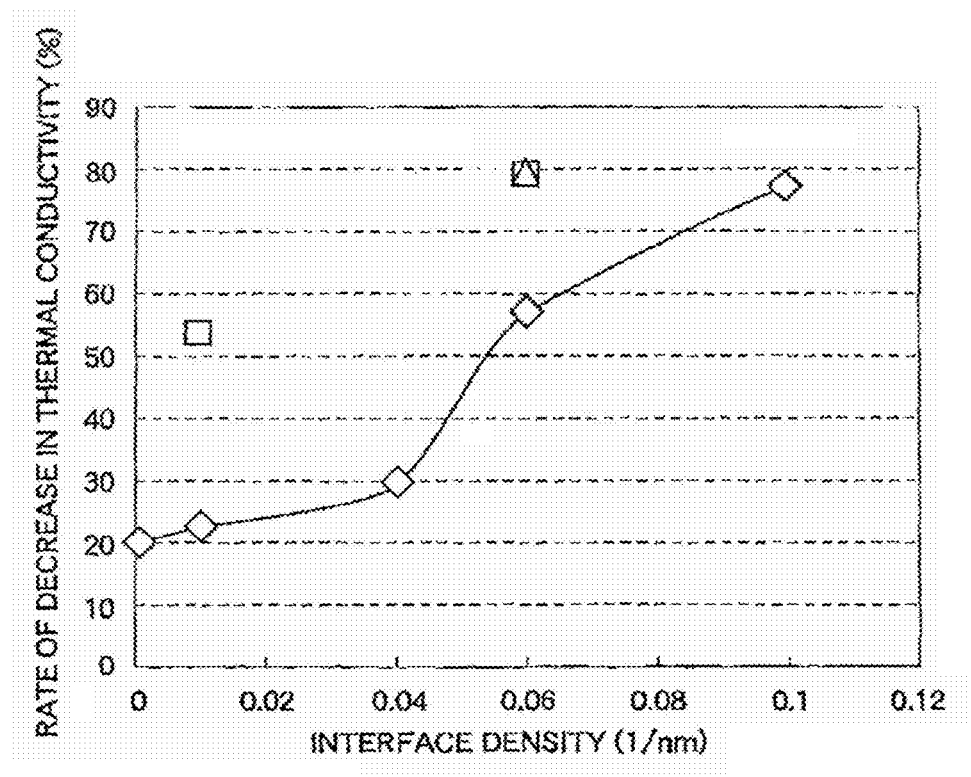
FIG. 39 is a graph in which a rate of decrease in the thermal conductivity of each of the nanocomposite thermoelectric conversion materials produced in the examples of the third and fourth production methods according to the invention and in a comparative example with respect to the thermal conductivity in a conventional example is plotted with respect to the interface density.

FIG. 39 shows the rate of decrease in the thermal conductivity of each of the comparative examples #4 (indicated by a rhombus mark), the third example (indicated by a triangle mark), and the fourth example (indicated by a square mark), with respect to the thermal conductivity of the conventional example #3. It is evident from FIG. 39 that the thermal conductivity is decreased to a large extent by making the interface roughness large according to the invention. The conventional example #3 is the same as the conventional example described in Table 1. The comparative example #4 is the same as the comparative material in FIG. 38.

It is appreciated that the selection of materials, material compositions and surface roughness were determined using the process disclosed herein. As such, an inventive process for manufacturing a nanocomposite thermoelectric material and the material itself are provided.

The invention is not restricted to the illustrative examples described above. The examples are not intended as limitations on the scope of the invention. Methods, apparatus, compositions and the like described herein are exemplary and not intended as limitations on the scope of the invention. Changes therein and other uses will occur to those skilled in the art. The scope of the invention is defined by the scope of the claims.

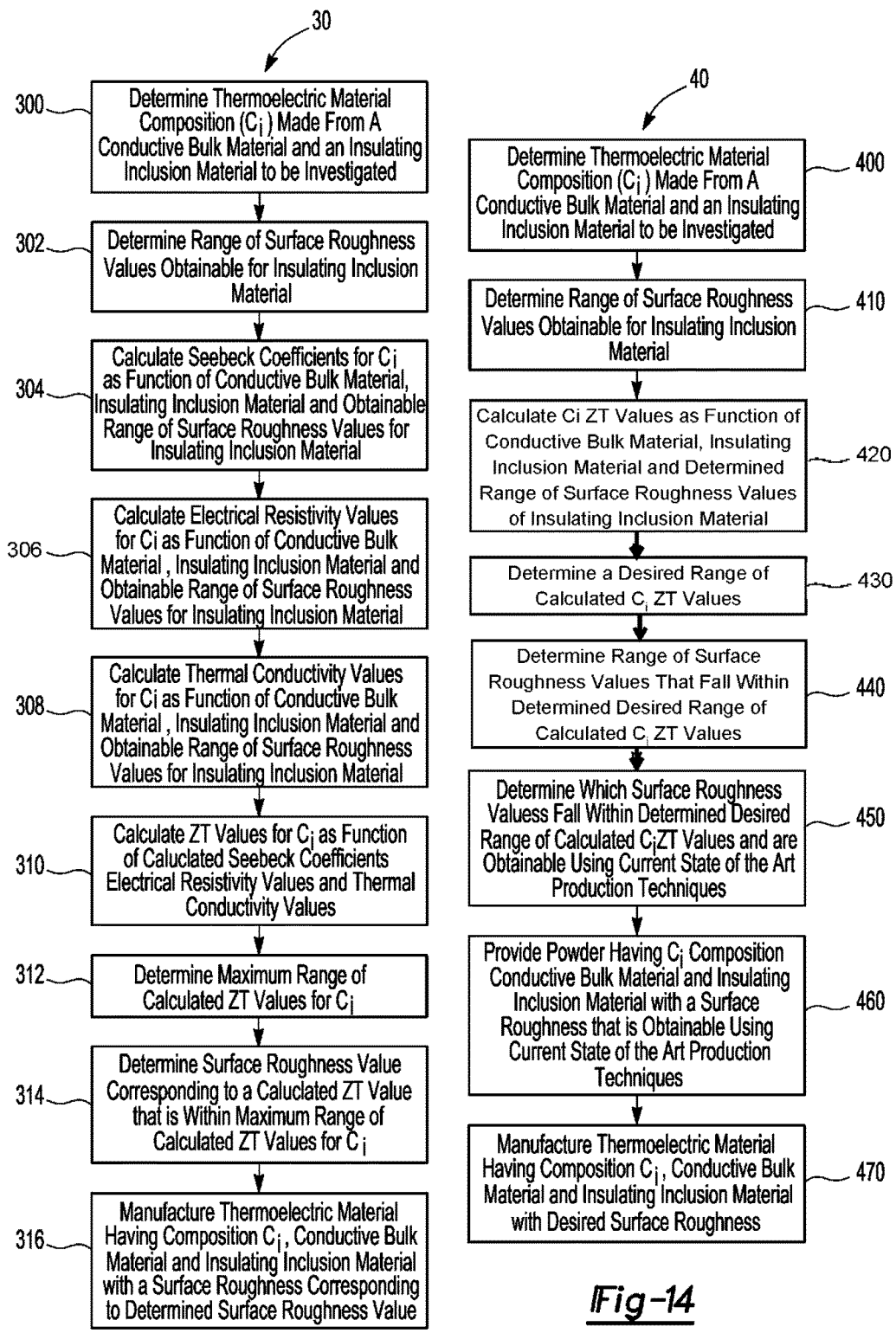

We claim:

1. A nanocomposite thermoelectric material comprising:
a conductive matrix phase;
an insulating nanoparticle phase;
said conductive matrix phase and said insulating nanoparticle phase having an interface therebetween, said interface having an interface roughness between 0.1-0.6 nm.

2. The nanocomposite thermoelectric material of claim 1, further comprising said interface having an interface density between 0.05-0.2 nm$^{-1}$.

3. The nanocomposite thermoelectric material of claim 2, wherein said interface roughness is between 0.1-0.3 nm.

4. The nanocomposite thermoelectric material of claim 3, wherein said insulating nanoparticle phase has an average surface roughness correlation length between 0.1-1.0 nm.

5. The nanocomposite thermoelectric material of claim 4, wherein said conductive matrix phase is selected from the group consisting of a Bi-chalcogenide, Mg$_2$X where X =Si, Ge or Sn, PbTe, Bi$_2$Te$_3$, (Bi,Sb)$_2$Te$_3$, Bi$_2$Se$_3$, and (Co,Ni)Sb3.

6. The nanocomposite thermoelectric material of claim 5, wherein said insulating nanoparticle phase is an oxide.

7. The nanocomposite thermoelectric material of claim 6, wherein said oxide is selected from the group consisting of ZrO$_2$, Yb$_2$O$_3$ and CeO$_2$.

8. A nanocomposite thermoelectric material comprising:
a conductive matrix phase;
an insulating nanoparticle phase;

said conductive matrix phase and said insulating nanoparticle phase having an interface therebetween, said interface having an interface density within a range of 0.05-0.2 nm$^{-1}$ and an interface roughness between 0.1-0.6 nm.

9. The nanocomposite thermoelectric material of claim 8, wherein said interface roughness is between 0.1-0.3 nm.

10. The nanocomposite thermoelectric material of claim 9, wherein said conductive matrix phase is selected from the group consisting of a Bi-chalcogenide, $Mg_2X$ where X=Si, Ge, Sn, PbTe, $Bi_2Te_3$, $(Bi,Sb)_2Te_3$, $Bi_2Se_3$, and (Co,Ni)Sb3.

11. The nanocomposite thermoelectric material of claim 10, wherein said insulating nanoparticle phase is an oxide.

12. The nanocomposite thermoelectric material of claim 11, wherein said oxide is selected from the group consisting of $ZrO_2$, $Yb_2O_3$ and $CeO_2$.

* * * * *

UNITED STATES PATENT AND TRADEMARK OFFICE
CERTIFICATE OF CORRECTION

PATENT NO. : 9,755,128 B2
APPLICATION NO. : 14/317375
DATED : September 5, 2017
INVENTOR(S) : Debasish Banerjee et al.

It is certified that error appears in the above-identified patent and that said Letters Patent is hereby corrected as shown below:

Please replace FIGS. 13 and 14 with FIGS. 13 and 14 as shown on the attached page.

Signed and Sealed this
Twenty-fourth Day of July, 2018

Andrei Iancu
*Director of the United States Patent and Trademark Office*